United States Patent
Kuma et al.

(10) Patent No.: US 9,812,661 B2
(45) Date of Patent: Nov. 7, 2017

(54) ORGANIC ELECTROLUMINESCENT DEVICE

(71) Applicant: Idemitsu Kosan Co., Ltd., Chiyoda-ku (JP)

(72) Inventors: Hitoshi Kuma, Sodegaura (JP);
Yuichiro Kawamura, Sodegaura (JP);
Yukitoshi Jinde, Sodegaura (JP);
Toshinari Ogiwara, Sodegaura (JP);
Chishio Hosokawa, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 775 days.

(21) Appl. No.: 13/909,138

(22) Filed: Jun. 4, 2013

(65) Prior Publication Data
US 2013/0270539 A1 Oct. 17, 2013

Related U.S. Application Data

(63) Continuation of application No. 12/788,788, filed on May 27, 2010, now Pat. No. 8,476,823, which is a (Continued)

(30) Foreign Application Priority Data

May 22, 2009 (JP) .................... 2009-124759

(51) Int. Cl.
*H01L 51/54* (2006.01)
*C09K 11/06* (2006.01)
(Continued)

(52) U.S. Cl.
CPC .......... *H01L 51/5028* (2013.01); *B82Y 10/00* (2013.01); *C09B 1/00* (2013.01); (Continued)

(58) Field of Classification Search
CPC .......... B82Y 10/00; C09B 1/00; C09B 57/00; C09B 57/001; C09K 11/06; (Continued)

(56) References Cited

U.S. PATENT DOCUMENTS

| | | |
|---|---|---|
| 6,010,796 A | 1/2000 | Kijima |
| 6,097,147 A | 8/2000 | Baldo et al. |

(Continued)

FOREIGN PATENT DOCUMENTS

| | | |
|---|---|---|
| JP | 10-79297 | 3/1998 |
| JP | 2001-357972 A | 12/2001 |

(Continued)

OTHER PUBLICATIONS

D. Y. Kondakov, "Characterization of Triplet—Triplet Annihilation in Organic Light-Emitting Diodes Based on Anthracene Derivatives", Journal of Applied Physics 102, 2007, pp. 114504-1-114504-5.

(Continued)

*Primary Examiner* — Andrew K Bohaty
(74) *Attorney, Agent, or Firm* — Oblon, McClelland, Maier & Neustadt, L.L.P.

(57) ABSTRACT

An organic electroluminescence device including at least an anode, an emitting layer, an electron-transporting region and a cathode in sequential order, wherein the emitting layer contains a host and a dopant which gives fluorescent emission of which the main peak wavelength is 550 nm or less; the affinity Ad of the dopant is equal to or larger than the affinity Ah of the host; the triplet energy $E^T_d$ of the dopant is larger than the triplet energy $E^T_h$ of the host; and a blocking layer is provided within the electron-transporting region such that it is adjacent to the emitting layer, and the triplet energy $E^T_b$ of the blocking layer is larger than $E^T_h$.

23 Claims, 11 Drawing Sheets

Related U.S. Application Data continuation-in-part of application No. 12/477,599, filed on Jun. 3, 2009, now abandoned.

(51) Int. Cl.

| | |
|---|---|
| *H01L 51/50* | (2006.01) |
| *B82Y 10/00* | (2011.01) |
| *C09B 57/00* | (2006.01) |
| *C09B 1/00* | (2006.01) |
| *H01L 51/00* | (2006.01) |

(52) U.S. Cl.
CPC .......... *C09B 57/00* (2013.01); *C09B 57/001* (2013.01); *H01L 51/5016* (2013.01); *H01L 51/5096* (2013.01); *H01L 51/0048* (2013.01); *H01L 51/0059* (2013.01); *H01L 51/0072* (2013.01); *H01L 51/0073* (2013.01); *H01L 51/5036* (2013.01)

(58) Field of Classification Search
CPC .......... C09K 2211/00; C09K 2211/10; C09K 2211/1003; C09K 2211/1007; C09K 2211/1011; C09K 2211/1018; C09K 2211/1022; C09K 2211/188; H01L 51/0032; H01L 51/0048; H01L 51/005; H01L 51/0051; H01L 51/0052; H01L 51/0054; H01L 51/0055; H01L 51/0056; H01L 51/0059; H01L 51/006; H01L 51/0062; H01L 51/0072; H01L 51/0073; H01L 51/0071; H01L 51/50; H01L 51/5012; H01L 51/5016; H01L 51/5028; H01L 51/5036; H01L 51/5048; H01L 51/5072; H01L 51/5096
USPC ....... 428/690, 691, 917, 411.4, 336; 427/58, 427/66; 313/500–512; 257/40, 88–104, 257/E51.001–E51.052; 252/301.16–301.35

See application file for complete search history.

(56) References Cited

U.S. PATENT DOCUMENTS

| | | | |
|---|---|---|---|
| 7,018,723 B2 | 3/2006 | Thompson et al. | |
| 7,358,661 B2 | 4/2008 | Kuma | |
| 2002/0055015 A1 | 5/2002 | Sato et al. | |
| 2003/0201415 A1* | 10/2003 | Hoag | C09K 11/06 251/40 |
| 2004/0150327 A1 | 8/2004 | Kawai et al. | |
| 2006/0017050 A1 | 1/2006 | Hasegawa et al. | |
| 2006/0145604 A1* | 7/2006 | Liao | H01L 51/5052 313/506 |
| 2006/0232194 A1 | 10/2006 | Tung et al. | |
| 2006/0286408 A1* | 12/2006 | Suzuki | C07D 471/04 428/690 |
| 2007/0057630 A1* | 3/2007 | Nishita | H01L 51/5016 313/504 |
| 2007/0087222 A1 | 4/2007 | Kim et al. | |
| 2007/0243411 A1 | 10/2007 | Takashima et al. | |
| 2007/0273270 A1* | 11/2007 | Jinde | H01L 51/0054 313/504 |
| 2008/0193796 A1 | 8/2008 | Arakane et al. | |
| 2008/0286610 A1 | 11/2008 | Deaton et al. | |
| 2009/0009067 A1 | 1/2009 | Nishimura et al. | |
| 2009/0108735 A1* | 4/2009 | Begley | C07C 13/62 313/504 |
| 2010/0295445 A1* | 11/2010 | Kuma | H01L 51/006 313/504 |
| 2012/0126208 A1 | 5/2012 | Kawamura et al. | |
| 2012/0153268 A1 | 6/2012 | Kawamura et al. | |

FOREIGN PATENT DOCUMENTS

| | | |
|---|---|---|
| JP | 2002-100478 | 4/2002 |
| JP | 2002-525808 | 8/2002 |
| JP | 2003-338377 | 11/2003 |
| JP | 2004-214180 | 7/2004 |
| JP | 2005-353288 A | 12/2005 |
| JP | 2007-59903 A | 3/2007 |
| JP | 2007-180277 A | 7/2007 |
| JP | 2008-506798 A | 3/2008 |
| KR | 10-2007-0091280 A | 9/2007 |
| WO | WO 00/16593 | 3/2000 |
| WO | WO 2007/100010 A1 | 9/2007 |
| WO | WO 2008/062773 A1 | 5/2008 |
| WO | WO 2008/145239 A2 | 12/2008 |

OTHER PUBLICATIONS

Masakazu Funahashi, et al., "47.3: Highly Efficient Fluorescent Deep Blue Dopant for " Super Top Emission" Device", Society for Information Display, 2008 International Symposium, Digest of Technical Papers, vol. XXXIX, Book II, pp. 709-711.

Office Action as received in the Korean Patent Application No. 519980963384 dated Feb. 27, 2013.

Supplementary European Search Report dated Apr. 2, 2013 as received in the corresponding European Patent Application No. 10777586.8-1555 / 2434558 PCT/JP2010003431.

International Search Report and Written Opinion dated Aug. 31, 2010 in corresponding International Application No. PCT/JP2010/003431 filed May 21, 2010 (with Translation of Categories).

Shizuo Tokito, "Improvement of Emission Efficiency in Organic Light-Emitting Devices", The Chemical Times, 2010, No. 2(216), pp. 2-8.

Chimed Ganzorig et al., "Evidence for Enhanced Electrofluorescence Emission through Triplet-Triplet Annihilation in Organic Electroluminescent Devices", (The 49$^{th}$ Spring Meeting, 2002; The Japan Society of Applied Physics and Related Societies, No. 3, Mar. 2002, 28a-YE-4, p. 1314.

Chimed Ganzorig et al., "A Possible Mechanism for Enhanced Electrofluorescence Emission through Triplet-Triplet Annihilation in Organic Electroluminescent Devices", Applied Physics Letters, Oct. 21, 2002, vol. 81, No. 17, pp. 3137-3139.

D. Y. Kondakov et al., Triplet Annihilation Exceeding Spin Statistical Limit in Highly Efficient Fluorescent Organic Light-Emitting Diodes, Journal of Applied Physics, Dec. 15, 2009, vol. 106, No. 12, pp. 124510-1-124510-7.

Bernhard Nickel et al., "Delayed Fluorescence from the Lowest $^1B^+_{3u}$ State of Anthracene* and $^3$Xanthone*", Chemical Physics, vol. 66 (3), 1982, pp. 365-376.

"Photoelectron Spectrophotometer in Air", Surface Analyzer, Model AC-3, Jun. 11, 2012, pp. 1-6, XP055029420, Retrieved from the Internet: URL:http://www.rkiinstruments.com/pdf/AC3.pdf.

U.S. Appl. No. 13/297,861, filed Nov. 16, 2011, Kawamura, et al.

Office Action dated Oct. 25, 2013, in Korean Patent Application No. 10-2011-7027664.

Combined Chinese Office Action and Search Report dated Dec. 18, 2013, in Chinese Patent Application No. 201080021834.0 with English translation and English translation of category of cited documents.

\* cited by examiner

ORGANIC ELECTROLUMINESCENT DEVICE

This application is a continuation of U.S. application Ser. No. 12/788,788 filed May 27, 2010, now U.S. Pat. No. 8,476,823, which is a continuation-in-part of Ser. No. 12/477,599 filed Jun. 3, 2009, now abandoned, which are incorporated herein by reference and claims the benefit of JP 2009-124759 filed May 22, 2009.

TECHNICAL FIELD

The invention relates to an organic electroluminescence (EL) device, particularly, to a highly efficient organic EL device.

BACKGROUND ART

An organic EL device can be classified into two types, i.e. a fluorescent EL device and a phosphorescent EL device according to its emission principle. When a voltage is applied to an organic EL device, holes are injected from an anode, and electrons are injected from a cathode, and holes and electrons recombine in an emitting layer to form excitons. According to the electron spin statistics theory, singlet excitons and triplet excitons are formed at an amount ratio of 25%:75%. In a fluorescent EL device which uses emission caused by singlet excitons, the limited value of the internal quantum efficiency is believed to be 25%. Technology for prolonging the lifetime of a fluorescent EL device utilizing a fluorescent material has been recently improved. This technology is being applied to a full-color display of portable phones, TVs, or the like. However, a fluorescent EL device is required to be improved in efficiency.

In association with the technology of improving the efficiency of a fluorescent EL device, several technologies are disclosed in which emission is obtained from triplet excitons, which have heretofore been not utilized effectively. For example, in Non-Patent Document 1, a non-doped device in which an anthracene-based compound is used as a host material is analyzed. A mechanism is found that singlet excitons are formed by collision and fusion of two triplet excitons, whereby fluorescent emission is increased. However, Non-Patent Document 1 discloses only that fluorescent emission is increased by collision and fusion of triplet excitons in a non-doped device in which only a host material is used. In this technology, an increase in efficiency by triplet excitons is as low as 3 to 6%.

Non-Patent Document 2 reports that a blue fluorescent device exhibits an internal quantum efficiency of 28.5%, which exceeds 25%, which is the conventional theoretical limit value. However, no technical means for attaining an efficiency exceeding 25% is disclosed. In respect of putting a full-color organic EL TV into practical use, a further increase in efficiency has been required.

In Patent Document 1, another example is disclosed in which triplet excitons are used in a fluorescent device. In normal organic molecules, the lowest excited triplet state (T1) is lower than the lowest excited singlet state (S1). However, in some organic molecules, the triplet excited state (T2), is higher than S1. In such a case, it is believed that due to the occurrence of transition from T2 to S1, emission from the singlet excited state can be obtained. However, actually, the external quantum efficiency is about 6% (the internal quantum efficiency is 24% when the outcoupling efficiency is taken as 25%), which does not exceed the value of 25% which has conventionally been believed to be the limit value. The mechanism disclosed in this document is that emission is obtained due to the intersystem crossing from the triplet excited state to the singlet excited state in a single molecule. Generation of singlet excitons by collision of two triplet excitons as disclosed in Non-Patent Document 1 is not occurred in this mechanism.

Patent Documents 2 and 3 each disclose a technology in which a phenanthroline derivative such as BCP (bathocuproin) and BPhen is used in a hole-blocking layer in a fluorescent device to increase the density of holes at the interface between a hole-blocking layer and an emitting layer, enabling recombination to occur efficiently. However, a phenanthroline derivative such as BCP (bathocuproin) and BPhen is vulnerable to holes and poor in resistance to oxidation, and the performance thereof is insufficient in respect of prolonging the lifetime of a device.

In Patent Documents 4 and 5, a fluorescent device is disclosed in which an aromatic compound such as an anthracene derivative is used as a material for an electron-transporting layer which is in contact with an emitting layer. However, this is a device which is designed based on the mechanism that generated singlet excitons emit fluorescence within a short period of time. Therefore, no consideration is made on the relationship with the triplet energy of an electron-transporting layer which is normally designed in a phosphorescent device. Actually, since the triplet energy of an electron-transporting layer is smaller than the triplet energy of an emitting layer, triplet excitons generated in an emitting layer are diffused to an electron-transporting layer, and then, thermally deactivated. Therefore, it is difficult to exceed the theoretical limit value of 25% of the conventional fluorescent device. Furthermore, since the affinity of an electron-transporting layer is too large, electrons are not injected satisfactorily to an emitting layer of which the affinity is small, and hence, improvement in efficiency cannot necessarily be attained. In addition, Patent Document No. 6 discloses a device in which a blue-emitting fluoranthene-based dopant which has a long life and a high efficiency. This device is not necessarily highly efficient.

On the other hand, a phosphorescent device directly utilizes emission from triplet excitons. Since the singlet exciton energy is converted to triplet excitons by the spin conversion within an emitting molecule, it is expected that an internal quantum efficiency of nearly 100% can be attained, in principle. For the above-mentioned reason, since a phosphorescent device using an Ir complex was reported by Forrest et al. in 2000, a phosphorescent device has attracted attention as a technology of improving efficiency of an organic EL device. Although a red phosphorescent device has reached the level of practical use, green and blue phosphorescent devices have a lifetime shorter than that of a fluorescent device. In particular, as for a blue phosphorescent device, there still remains a problem that not only lifetime is short but also color purity or luminous efficiency is insufficient. For these reasons, phosphorescent devices have not yet been put into practical use.

RELATED DOCUMENTS

Patent Documents

Patent Document 1: JP-A-2004-214180
Patent Document 2: JP-A-H10-79297
Patent Document 3: JP-A-2002-100478
Patent Document 4: JP-A-2003-338377
Patent Document 5: WO2008/062773
Patent Document 6: WO2007/100010

Patent Document 7: JP-T-2002-525808
Patent Document 8: U.S. Pat. No. 7,018,723

Non-Patent Documents

Non-Patent Document 1: Journal of Applied Physics, 102, 114504 (2007)
Non-Patent Document 2: SID 2008 DIGEST, 709 (2008)

SUMMARY OF THE INVENTION

The inventors noticed a phenomenon stated in Non-Patent Document 1, i.e. a phenomenon in which singlet excitons are generated by collision and fusion of two triplet excitons (hereinafter referred to as Triplet-Triplet Fusion=TTF phenomenon), and made studies in an attempt to improve efficiency of a fluorescent device by allowing the TTF phenomenon to occur efficiently. Specifically, the inventors made studies on various combinations of a host material (hereinafter often referred to simply as a "host") and a fluorescent dopant material (hereinafter often referred to simply as a "dopant"). As a result of the studies, the inventors have found that when the triplet energy of a host and that of a dopant satisfies a specific relationship, and a material having large triplet energy is used in a layer which is adjacent to the interface on the cathode side of an emitting layer (referred to as a "blocking layer" in the invention), triplet excitons are confined within the emitting layer to allow the TTF phenomenon to occur efficiently, whereby improvement in efficiency and lifetime of a fluorescent device can be realized.

It is known that, in a phosphorescent device, a high efficiency can be attained by using a material having large triplet energy in a layer which is adjacent to the interface on the cathode side of an emitting layer in order to prevent diffusion of triplet excitons from the emitting layer, of which the exciton lifetime is longer than that of singlet excitons. JP-T-2002-525808 discloses a technology in which a blocking layer formed of BCP (bathocuproin), which is a phenanthroline derivative, is provided in such a manner that it is adjacent to an emitting layer, whereby holes or excitons are confined to achieve a high efficiency. U.S. Pat. No. 7,018,723 discloses use of a specific aromatic ring compound in a hole-blocking layer in an attempt to improve efficiency and prolonging lifetime. However, in these documents, for a phosphorescent device, the above-mentioned TTF phenomenon is called TTA (Triplet-Triplet Annihilation: triplet pair annihilation). That is, the TTF phenomenon is known as a phenomenon which deteriorates emission from triplet excitons which is the characteristics of phosphorescence. In a phosphorescent device, efficient confinement of triplet excitons within an emitting layer does not necessarily result in improvement in efficiency.

The invention provides the following organic EL device.
1. An organic electroluminescence device comprising at least an anode, an emitting layer, an electron-transporting region and a cathode in sequential order, wherein
the emitting layer contains a host and a dopant which gives fluorescent emission of which the main peak wavelength is 550 nm or less;
the affinity Ad of the dopant is equal to or larger than the affinity Ah of the host;
the triplet energy $E^T_d$ of the dopant is larger than the triplet energy $E^T_h$ of the host; and
a blocking layer is provided within the electron-transporting region such that it is adjacent to the emitting layer, and the triplet energy $E^T_b$ of the blocking layer is larger than $E^T_h$.

2. The organic electroluminescence device according to 1, wherein the dopant is a compound selected from fluoranthene derivatives and boron complexes.
3. The organic electroluminescence device according to 1 or 2 further comprising a hole-transporting region between the anode and the emitting layer, wherein a hole-transporting layer is provided within the hole-transporting region such that it is adjacent to the emitting layer, and the triplet energy $E^T_{ho}$ of the hole-transporting layer is larger than $E^T_h$.
4. The organic electroluminescence device according to any one of 1 to 3, wherein the blocking layer comprises an aromatic hydrocarbon compound.
5. The organic electroluminescence device according to 4, wherein the aromatic hydrocarbon compound is a polycyclic aromatic compound.
6. The organic electroluminescence device according to any one of 1 to 5, wherein the electron mobility of a material constituting the blocking layer is $10^{-6}$ cm$^2$/Vs or more in an electric field intensity of 0.04 to 0.5 MV/cm.
7. The organic electroluminescence device according to any one of 1 to 6, wherein the electron-transporting region is a multilayer stack of the blocking layer and an electron-injecting layer, and the electron mobility of a material constituting the electron-injecting layer is $10^{-6}$ cm$^2$/Vs or more in an electric field intensity of 0.04 to 0.5 MV/cm.
8. The organic electroluminescence device according to any one of 1 to 6, wherein the electron-transporting region is a multilayer stack of the blocking layer and an electron-injecting layer, and the affinity Ab of the blocking layer and the affinity Ae of the electron-injecting layer satisfy the relationship shown by Ae-Ab<0.2 eV.
9. The organic electroluminescence device according to any one of 1 to 6, wherein the electron-transporting region is a single blocking layer.
10. The organic electroluminescence device according to any one of 1 to 6, wherein the electron-transporting region is a single blocking layer which is doped with a donor.
11. The organic electroluminescence device according to any one of 1 to 10, wherein the host is a compound the part other than a ring structure of which has no double bond.
12. The organic electroluminescence device according to any one of 1 to 11, wherein the dopant is a compound the part other than a ring structure of which has no double bond.
13. An organic electroluminescence device comprising an anode, an emitting layer, an electron-transporting region and a cathode in sequential order, wherein
the emitting layer contains a host and a fluorescent dopant;
the affinity Ad of the dopant is equal to or larger than the affinity Ah of the host;
the triplet energy $E^T_d$ of the dopant is larger than the triplet energy $E^T_h$ of the host;
a blocking layer is provided within the electron-transporting region such that it is adjacent to the emitting layer, and the triplet energy $E^T_b$ of a material constituting the blocking layer is larger than $E^T_h$; and
at an applied voltage which makes current efficiency (unit: cd/A) maximum, a luminous intensity derived from singlet excitons generated by collision of triplet excitons generated in the emitting layer is 30% or more of the total luminous intensity.
14. The organic electroluminescence device according to any one of 1 to 13, which comprises at least two emitting layers between the anode and the cathode and an intermediate layer between two emitting layers.
15. The organic electroluminescence device according to any one of 1 to 13, which comprises a plurality of emitting layers between the anode and the cathode and a carrier-blocking layer between a first emitting layer and a second emitting layer.

The invention can realize a highly efficient device which can, by efficiently inducing the TTF phenomenon within an emitting layer, exhibit an internal quantum efficiency which largely exceeds 25%, which is believed to be the limit value of conventional fluorescent devices.

BEST MODE FOR CARRYING OUT THE INVENTION

First Embodiment

The invention utilizes the TTF phenomenon. First, an explanation is made of the TTF phenomenon.

Holes and electrons injected from an anode and a cathode are recombined with in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of a conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with each other with an increase in the density thereof, whereby a reaction shown by the following formula occurs. In the formula, $^1A$ represents the ground state and $^1A^*$ represents the lowest excited singlet excitons.

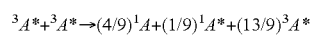

That is, $5^3A^* \to 4^1A + ^1A^*$, and it is expected that, among 75% of triplet excitons initially generated, one fifth thereof, that is, 20%, is changed to singlet excitons. Therefore, the amount of singlet excitons which contribute to emission is 40%, which is a value obtained by adding 15% ((75%×(1/5)=15%) to 25%, which is the amount ratio of initially generated singlet excitons. At this time, the ratio of luminous intensity derived from TTF (TTF ratio) relative to the total luminous intensity is 15/40, that is, 37.5%. Assuming that singlet excitons are generated by collision of 75% of initially-generated triplet excitons (that is, one siglet exciton is generated from two triplet excitons), a significantly high internal quantum efficiency of 62.5% is obtained which is a value obtained by adding 37.5% ((75%×(1/2)=37.5%) to 25%, which is the amount ratio of initially generated singlet excitons. At this time, the TTF ratio is 60% (37.5/62.5).

Figure 1:
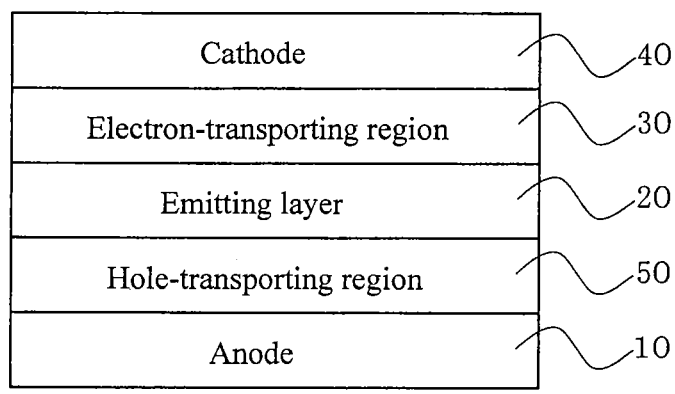
FIG. 1 is a view showing one example of an organic EL device according to a first embodiment.
Figure 2A:
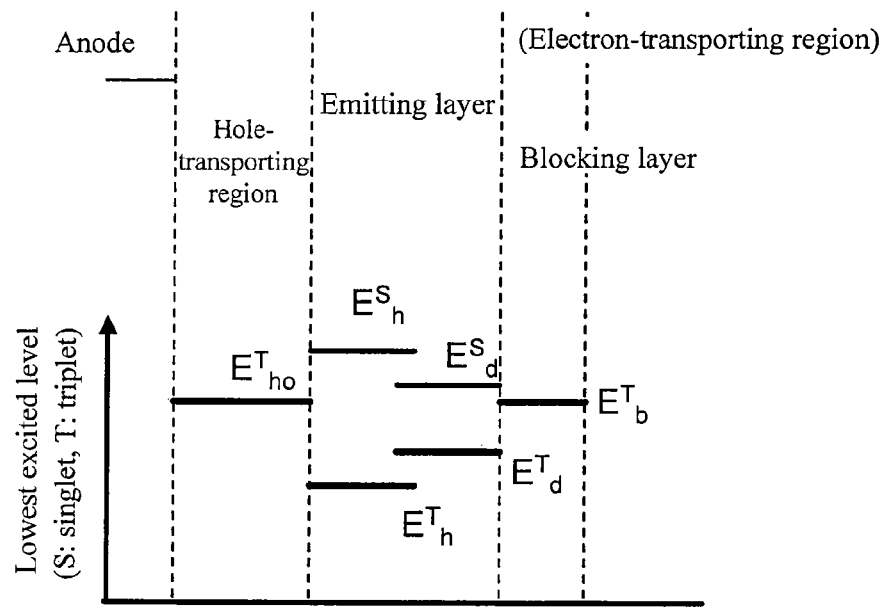
FIG. 2A is a view showing the energy gap relationship between layers of the invention.

FIG. 1 is a schematic view of an organic EL device showing one example of the first embodiment of the invention. FIG. 2A diagrammatically shows the lowest excited singlet energy level and the lowest excited triplet energy level. In the invention, the triplet energy is referred to as a difference between energy in the lowest triplet exited state and energy in the ground state. The singlet energy (often referred to as an energy gap) is referred to as a difference between energy in the lowest singlet excited state and energy in the ground state. In the organic EL device shown in FIG. 1, a hole-transporting region 50, an emitting layer 20, an electron-transporting region 30 and a cathode 40 are stacked in sequential order from an anode 10. It is preferred that a hole-transporting region 50 be provided between an anode 10 and an emitting layer 20. The simple term "blocking layer" in the invention means a layer having a triplet energy blocking function different from the function of a hole-blocking layer or a carrier-blocking layer.

Figure 2B:
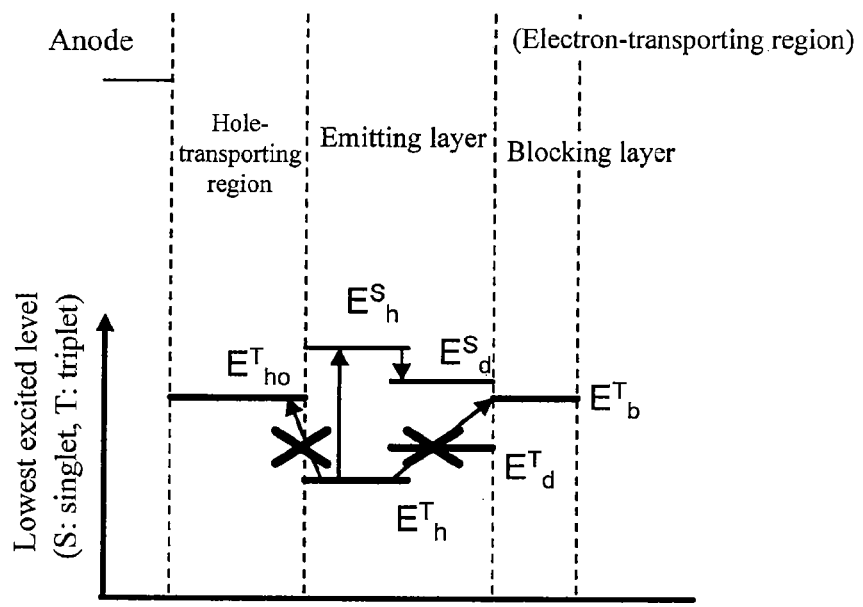
FIG. 2B is a view showing an action based on the energy gap relationship between layers of the invention.

The emitting layer is formed of a host and a dopant which gives fluorescent emission of which the main peak wavelength is 550 nm or less (hereinafter often referred to as a fluorescent dopant having a main peak wavelength of 550 nm or less). (The main peak wavelength in the invention means the peak wavelength of the emission spectrum of which the emission intensity becomes maximum in an emission spectrum measured in a toluene solution with a concentration of $10^{-5}$ to $10^{-6}$ mol/l) The main peak wavelength of 550 nm almost corresponds to green emission. In this wavelength region, improvement in luminous efficiency of a fluorescent device utilizing a TTF phenomenon is expected. In a fluorescent emitting device giving a blue emission of 480 nm or less, a further improvement in luminous efficiency can be expected. For a red emission with a wavelength of 550 nm or higher, since a phosphorescent emitting device with a high internal quantum efficiency has already been on the practically-usable level, no improvement in luminous efficiency is desired for a fluorescent emitting device. In FIG. 2A, holes injected from an anode are then injected to an emitting layer through a hole-transporting region. Electrons injected from a cathode are then injected to an emitting layer through an electron-transporting region. Thereafter, holes and electrons are recombined in an emitting layer, whereby singlet excitons and triplet excitons are generated. There are two manners as for the occurrence of recombination. Specifically, recombination may occur either on host molecules or on dopant molecules. In this embodiment, as shown in FIG. 2A, if the triplet energy of a host and that of a dopant are taken as $E^T_h$ and $E^T_d$, respectively, the relationship $E^T_h < E^T_d$ is satisfied. When this relationship is satisfied, triplet excitons generated by recombination on a host do not transfer to a dopant which has higher triplet energy as shown in FIG. 2B. Triplet excitons generated by recombination on dopant molecules quickly energy-transfer to host molecules. That is, triplet excitons on a host do not transfer to a dopant and collide with each other efficiently on the host to generate singlet exitons by the TTF phenomenon. Further, since the singlet energy $E^s_d$ of a dopant is smaller than the singlet energy $E^s_h$ of a host, singlet excitons generated by the TTF phenomenon energy-transfer from a host to a dopant, thereby contributing fluorescent emission of a dopant. In dopants which are usually used in a fluorescent device, transition from the excited triplet state to the ground state should be inhibited. In such a transition, triplet excitons are not optically energy-deactivated, but are thermally energy-deactivated. By causing the triplet energy of a host and the triplet energy of a dopant to satisfy the above-mentioned relationship, singlet excitons are generated efficiently due to the collision of triplet excitons before they are thermally deactivated, whereby luminous efficiency is improved.

In the invention, the electron-transporting region has a blocking layer in an area adjacent to the emitting layer. As mentioned later, the blocking layer serves to prevent diffusion of triplet excitons generated in the emitting layer to the electron-transporting region, allow triplet excitons to be confined within the emitting layer to increase the density of triplet excitons therein, causing the TTF phenomenon to occur efficiently. In order to suppress triplet excitons from being diffused, it is preferred that the triplet energy of the blocking layer $E^T_b$ be larger than $E^T_h$. It is further preferred that $E^T_b$ be larger than $E^T_d$. Since the blocking layer prevents triplet excitons from being diffused to the electron-transporting region, in the emitting layer, triplet excitons of a host become singlet excitons efficiently, and the singlet excitons transfer to a dopant, and are optically energy-deactivated.

As for materials for forming the blocking layer, aromatic hydrocarbon ring compounds are preferably selected. More preferably, polycyclic aromatic compounds are selected. Due to the resistance to holes of these materials, the blocking layer is hard to be degraded, whereby the lifetime of a device is prolonged.

In the electron-transporting region, preferably, an electron-injection layer, which facilitates the injection of electrons from a cathode, is provided between the blocking layer and the cathode. Examples include a multilayer stack of a normal electron-transporting material, and an alkaline metal compound, an alkaline metal or an alkaline metal complex, and a layer obtained by adding to the material constituting the blocking layer a donor represented by an alkaline metal compound, an alkaline metal or an alkaline metal complex.

Figure 3A:
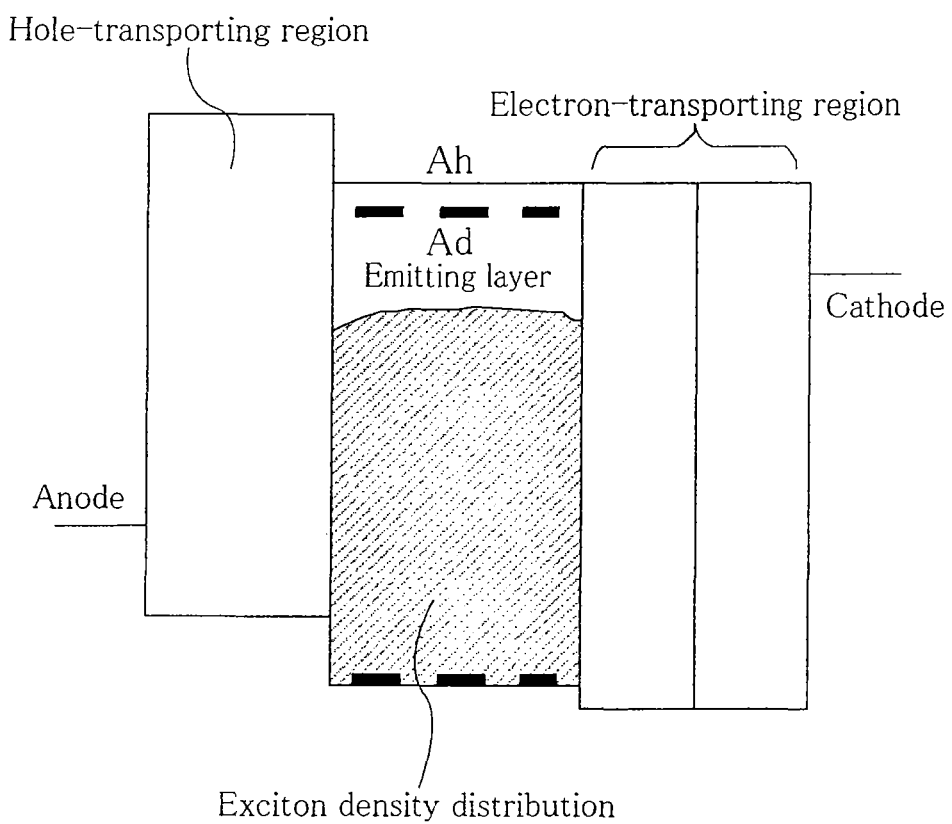
FIG. 3A is an energy band diagram showing a state in which the affinity of a dopant (Ad) is larger than the affinity of a host (Ah), and the difference between Ad and Ah is smaller than 0.2 eV.

Then, conditions under which the TTF phenomenon is caused to occur effectively will be explained while noting the relationship between the affinity of a host and the affinity of a dopant. Hereinbelow, the affinity of a host and the affinity of a dopant are respectively referred to as Ah and Ad.
(1) Ah<Ad As explained hereinbelow, if a host and a dopant are combined such that the relationship Ah<Ad is satisfied, the advantageous effects of the blocking layer provided within the electron-transporting region are exhibited significantly, whereby improvement in efficiency due to the TTF phenomenon can be attained. An explanation is made on two different cases (1-1) and (1-2) given below. Generally, an organic material has a broadening of a LUMO level in a range which is larger by about 0.2 eV than the affinity level measured.
(1-1) When Difference Between Ad and Ah is Smaller than 0.2 eV FIG. 3A is an energy band diagram showing this case. The dot line shown in the emitting layer indicates the energy level of a dopant. As shown in FIG. 3A, if the difference between Ad and Ah is smaller than 0.2 eV, the LUMO level of a dopant is included in the range of the broadening of LUMO level of a host. Therefore, electrons carried within the emitting layer are hardly trapped by a dopant. That is, this dopant hardly exhibits electron-trapping properties. In addition, the dopant of the invention is a dopant which has a wide gap which gives fluorescent emission of which the main peak wavelength is 550 nm or less. Therefore, if the relationship Ah<Ad is satisfied, since the difference between Ad and Ah is about 0.2 eV, the difference between the ionization potential of a host and the ionization potential of a dopant is decreased. As a result, a dopant does not tend to show significant hole-trapping properties.

That is, the dopant of this case does not exhibit significant trapping properties for both electrons and holes. In this case, as the slant-line portion of the emitting layer in FIG. 3A, electron-hole recombination occurs mainly on a host molecule in a broad range of the emitting layer, and 25% of singlet excitons and 75% of triplet excitons are formed mainly on a host molecule. The energy of singlet excitons which are generated on a host transfers to a dopant by the Forster energy transfer, and contributes to fluorescence emission of dopant molecules. The transfer direction of the energy of triplet excitons depends on the triplet energy relationship of a host and a dopant. If the relationship satisfies $E^T_h > E^T_d$, triplet excitons generated in a host transfer to a dopant which exists in the vicinity by the Dexter energy transfer. In a fluorescent device, the concentration of a dopant in the emitting layer is normally as low as several to 20 wt %. Therefore, triplet excitons which have transferred to the dopant collide with each other less frequently, resulting in a less possibility of occurrence of the TTF phenomenon. On the other hand, if the relationship $E^T_h < E^T_d$ is satisfied as the invention, since triplet excitons exist on host molecules, frequency of collision increases, and as a result, the TTF phenomenon easily occurs efficiently.

Figure 3B:
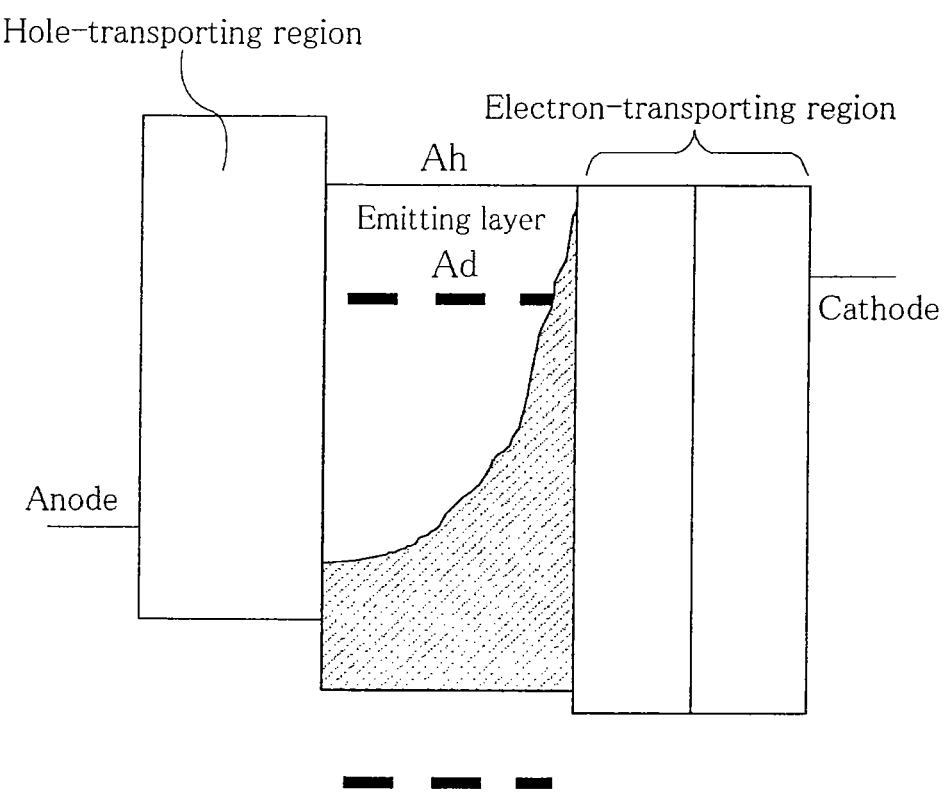
FIG. 3B is an energy band diagram showing a state in which Ad is larger than Ah, and the difference between Ad and Ah is larger than 0.2 eV.

In the invention, a blocking layer is provided adjacent to the emitting layer. Since the triplet energy $E^T_b$ of the blocking layer is larger than the triplet energy $E^T_h$ of the host, diffusion of triplet excitons to the electron-transporting region can be effectively prevented, whereby the TTF phenomenon can be induced efficiently within the emitting layer.
(1-2) When Difference Between Ad and Ah is Larger than 0.2 eV The energy band in this state is shown in FIG. 3B.
The difference in affinity between a dopant and a host is increased, and the LUMO level of a dopant exists at a position further higher than the LUMO level range of a host. Therefore, a dopant tends to exhibit significant electron-trapping properties. Electrons trapped by a dopant recombine after holes move from a host to a dopant. That is, unlike the condition shown in FIG. 3A, electron-hole pairs recombine not only on host molecules but also on dopant molecules. As a result, triplet excitons are generated not only on host molecules but also directly on dopant molecules. Under such circumstances, if the relationship $E^T_h < E^T_d$ is satisfied as the invention, triplet excitons which are generated directly on a dopant are gathered on a host by the Dexter energy transfer. As a result, the TTF phenomenon occurs efficiently.

If the affinities satisfy the above-mentioned relationship, the possibility of trapping of electrons by a dopant is increased in the vicinity of the interface of the emitting layer and the blocking layer. As a result, recombination occurs frequently in the vicinity of an interface between the emitting layer and the blocking layer. In this case, the efficiency of confining triplet excitons by the blocking layer is increased as compared with the case mentioned in (1-1), resulting in an increase in density of triplet excitons at the interface between the emitting layer and the blocking layer.

A host and a dopant satisfying the above-mentioned relationship of Ah<Ad can be selected from the following compounds (see Japanese Patent Application No. 2008-212102 or the like). As the host, anthracene derivatives and polycyclic aromatic skeleton-containing compounds can be given, with anthracene derivatives being preferable. As the dopant, fluoranthene derivatives, pyrene derivatives, arylacetylene derivatives, fluoren derivatives, boron complexes, perylene derivatives, oxadiazole derivatives and anthracene derivatives can be given. Fluoranthene derivatives, pyrene derivatives and boron complexes are preferable, with fluoranthene derivatives and boron complex compounds being more preferable. As for the combination of a host and a dopant, it is preferred that the host be an anthracene derivative and the dopant be a fluoranthene derivative or a boron complex.

Specific examples of the fluoranthene derivatives are given below.

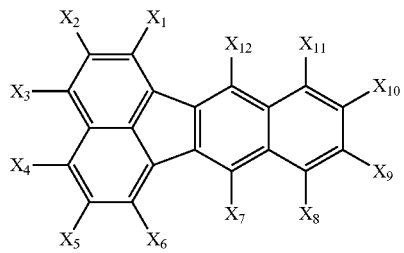

wherein $X_1$ to $X_{12}$ are hydrogen or a substituent. Preferably, it is a compound in which $X_1$ to $X_2$, $X_4$ to $X_6$ and $X_8$ to $X_{11}$ are a hydrogen atom and $X_3$, $X_7$ and $X_{12}$ are a substituted or unsubstituted aryl group having 5 to 50 atoms that form a ring (hereinafter referred to as ring atoms). More preferably, it is a compound in which $X_1$ to $X_2$, $X_4$ to $X_6$ and $X_8$ to $X_{11}$ are a hydrogen atom, $X_7$ and $X_{12}$ are a substituted or unsubstituted aryl group having 5 to 50 ring atoms, $X_3$ is —$Ar_1$—$Ar_2$ ($Ar_1$ is a substituted or unsubstituted arylene group having 5 to 50 ring atoms, and $Ar_2$ is a substituted or unsubstituted aryl group having 5 to 50 ring atoms). Further preferably, it is a compound in which $X_1$ to $X_2$, $X_4$ to $X_6$ and $X_8$ to $X_{11}$ are a hydrogen atom, $X_7$ and $X_{12}$ are a substituted or unsubstituted aryl group having 5 to 50 ring atoms and $X_3$ is —$Ar_1$—$Ar_2$—$Ar_3$ (wherein $Ar_1$ and $Ar_3$ are independently a substituted or unsubstituted arylene group having 5 to 50 ring atoms and $Ar_2$ is a substituted or unsubstituted aryl group having 5 to 50 ring atoms).

Specific examples of the boron complex compounds are given below.

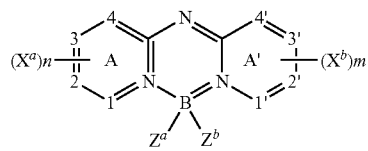

wherein A and A' are an independent azine ring system corresponding to a six-membered aromatic ring system containing at least one nitrogen; $X^a$ and $X^b$ are independently a substituent and respectively bonds to the ring A or the ring A' to form a condensed ring for the ring A or the ring A'; the condensed ring contains an aryl or heteroaryl substituent; m and n are independently 0 to 4; $Z^a$ and $Z^b$ are independently a halide; and 1, 2, 3, 4, 1', 2', 3' and 4' are independently a carbon atom or a nitrogen atom.

Desirably, the azine ring is a quinolynyl or isoquinolynyl ring in which each of 1, 2, 3, 4, 1', 2', 3' and 4' is a carbon atom, m and n are 2 or more and $X^a$ and $X^b$ are a substituent having 2 or more carbon atoms which combine with each other to form an aromatic ring. It is preferred that $Z^a$ and $Z^b$ be a fluorine atom.

The anthracene derivatives are preferably a compound represented by the following formula (10).

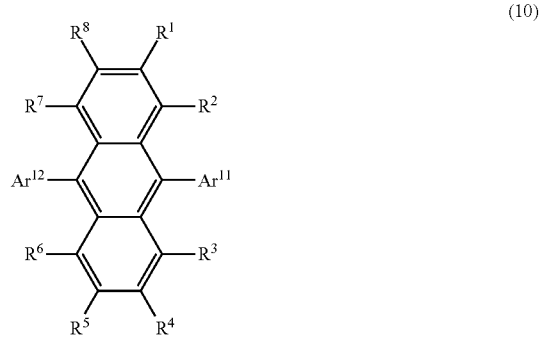

In the formula (10), $Ar^{11}$ and $Ar^{12}$ are independently a substituted or unsubstituted aryl group having 6 to 50 carbon atoms that form a ring (hereinafter referred to as ring carbon atoms) or a substituted or unsubstituted hetrocyclic group having 5 to 50 ring atoms, and $R^1$ to $R^8$ are independently a group selected from a hydrogen atom, a substituted or unsubstituted aryl group having 6 to 50 ring carbon atoms, a substituted or unsubstituted hetrocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group and a hydroxyl group.

The anthracene derivative used in the invention preferably is any of the following anthracene derivatives (A), (B) and (C), which is selected depending on the constitution or desired properties of an organic EL device.

Anthracene Derivative (A)

In this anthracene derivative, $Ar^{11}$ and $Ar^{12}$ in the formula (10) are independently a substituted or unsubstituted condensed aryl group having 10 to 50 ring carbon atoms. This anthracene derivative can be classified into the case that $Ar^{11}$ and $Ar^{12}$ are the same substituted or unsubstituted condensed aryl group and the case that $Ar^{11}$ and $Ar^{12}$ are different substituted or unsubstituted condensed aryl groups.

Specifically, the anthracene derivatives represented by the formulas (2-1) to (2-3) and the anthracene derivatives of the formula (10) where $Ar^{11}$ and $Ar^{12}$ are different substituted or unsubstituted condensed aryl groups can be given.

In the anthracene derivative represented by the following formula (2-1), $Ar^{11}$ and $Ar^{12}$ are a substituted or unsubstituted 9-phenanthrenyl group.

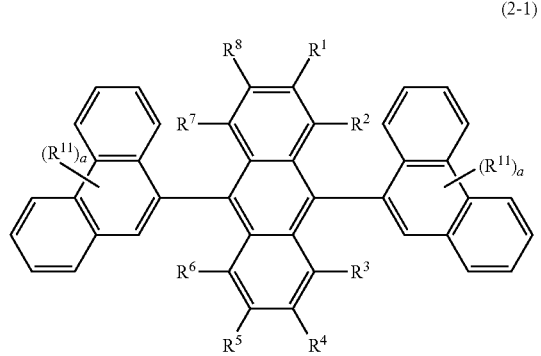

(2-1)

In the formula (2-1), $R^1$ to $R^8$ are the same as those described above, $R^{11}$ is a group selected from a hydrogen atom, a substituted or unsubstituted aryl group having 6 to 50 ring carbon atoms, a substituted or unsubstituted hetrocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group and a hydroxyl group, and a is an integer of 0 to 9. When a is two or more, $R^{11}$s may be the same or different, provided that the two substituted or unsubstituted phenanthrenyl groups are the same.

In the anthracene derivative represented by the following formula (2-2), $Ar^{11}$ and $Ar^{12}$ in the formula (10) are a substituted or unsubstituted 2-naphthyl group.

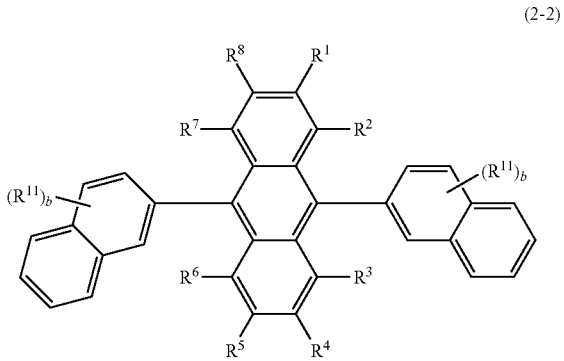

(2-2)

In the formula (2-2), $R^1$ to $R^8$ and $R^{11}$ are the same as those described above, and b is an integer of 1 to 7. When b is two or more, $R^{11}$s may be the same or different, provided that the two substituted or unsubstituted 2-naphthyl groups are the same.

In the anthracene derivative represented by the following formula (2-3), $Ar^{11}$ and $Ar^{12}$ in the formula (10) are a substituted or unsubstituted 1-naphthyl group.

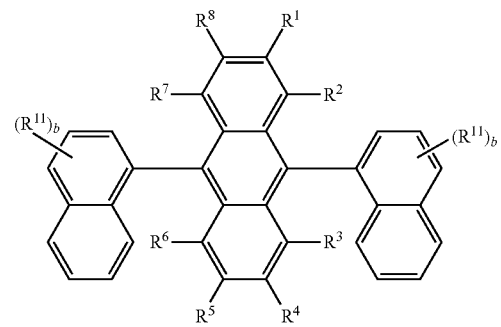

(2-3)

In the formula (2-3), $R^1$ to $R^8$, $R^{11}$ and b are the same as those described above. When b is two or more, $R^{11}$s may be the same or different, provided that the two substituted or unsubstituted 1-naphthyl groups are the same.

In the anthracene derivative of the formula (10) where $Ar^{11}$ and $Ar^{12}$ are different substituted or unsubstituted condensed aryl groups, it is preferred that $Ar^{11}$ and $Ar^{12}$ be any of a substituted or unsubstituted 9-phenanthrenyl group, a substituted or unsubstituted 1-naphthyl group and a substituted or unsubstituted 2-naphthyl group.

Specifically, derivatives where $Ar^{11}$ is a 1-naphthyl group and $Ar^{12}$ is a 2-naphthyl group, $Ar^{11}$ is a 1-naphthyl group and $Ar^{12}$ is a 9-phenanthrenyl group, and $Ar^{11}$ is a 2-naphthyl group and $Ar^{12}$ is a 9-phenanthrenyl group can be given.

Anthracene Derivative (B)

In this anthracene derivative, one of $Ar^{11}$ and $Ar^{12}$ in the formula (10) is a substituted or unsubstituted phenyl group, the other is a substituted or unsubstituted condensed aryl group having 10 to 50 ring carbon atoms. The anthracene derivatives represented by the following formulas (2-4) and (2-5) can be given as specific examples thereof.

In the anthracene derivative represented by the following formula (2-4), $Ar^{11}$ in the formula (10) is a substituted or unsubstituted 1-naphthyl group and $Ar^{12}$ in the formula (10) is a substituted or unsubstituted phenyl group.

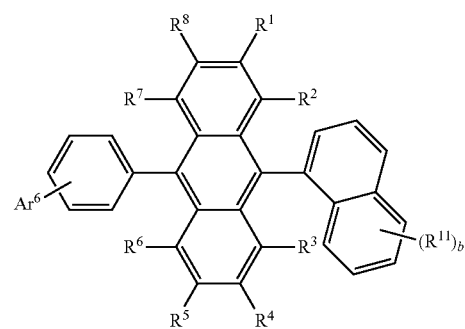

(2-4)

In the formula (2-4), $R^1$ to $R^8$, $R^{11}$ and b are the same as those described above, $Ar^6$ is a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 ring carbon atoms, a substituted or unsubstituted aralkyl group having 7 to 50 carbon atoms, a substituted or unsubstituted heterocyclic group having 5 to 50 ring atoms, a 9,9-dimethylflorene-1-yl group, a 9,9-dimethylflorene-2-yl group, a 9,9-dimethylflorene-3-yl group, a 9,9-dimethylflorene-4-yl group, dibenzofuran-1-yl group, a dibenzofuran-2-yl group, a dibenzofuran-3-yl group, or a dibenzofuran-4-yl group. $Ar^6$ may form a ring such as a substituted or unsubstituted fluorenyl group and a substituted or unsubstituted dibenzofuranyl group with the benzene ring bonded thereto. When b is 2 or more, $R^{11}$s may be the same or different.

In the anthracene derivative represented by the following formula (2-5), $Ar^{11}$ in the formula (10) is a substituted or unsubstituted 2-naphthyl group and $Ar^{12}$ in the formula (10) is a substituted or unsubstituted phenyl group.

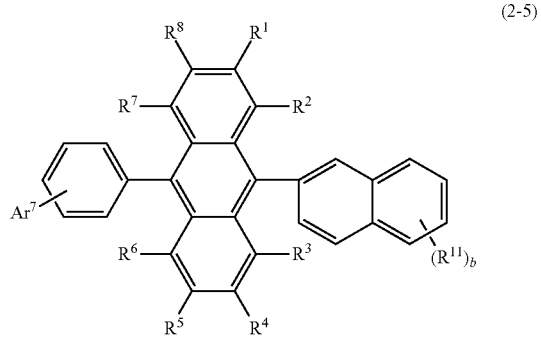

(2-5)

In the formula (2-5), $R^1$ to $R^8$, $R^{11}$ and b are the same as those described above, and $Ar^7$ is a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted aralkyl group having 7 to 50 carbon atoms, a dibenzofuran-1-yl group, a dibenzofuran-2-yl group, a dibenzofuran-3-yl group, or a dibenzofuran-4-yl group. $Ar^7$ may form a ring such as a substituted or unsubstituted fluorenyl group and a substituted or unsubstituted dibenzofuranyl group with the benzene ring bonded thereto. When b is 2 or more, $R^{11}$s may be the same or different.

Anthracene Derivative (C)

This anthracene derivative is shown by the following formula (2-6). Specifically, the derivative represented by any of the following formulas (2-6-1), (2-6-2) and (2-6-3) is preferable.

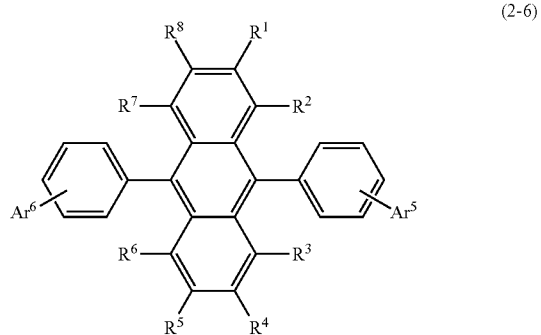

(2-6)

In the formula (2-6), $R^1$ to $R^8$ and $Ar^6$ are the same as those described above, $Ar^5$ is a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 ring carbon atoms, a substituted or unsubstituted aralkyl group having 7 to 50 carbon atoms, or a substituted or unsubstituted heterocyclic group having 5 to 50 ring atoms, and $Ar^5$ and $Ar^6$ are independently selected.

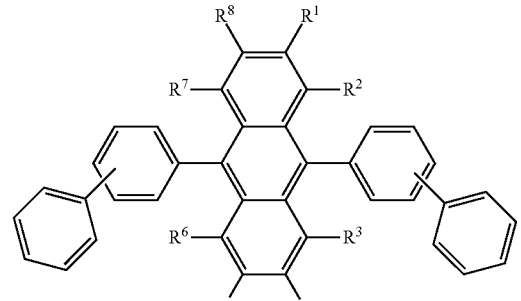

(2-6-1)

In the formula (2-6-1), $R^1$ to $R^8$ are the same as those described above.

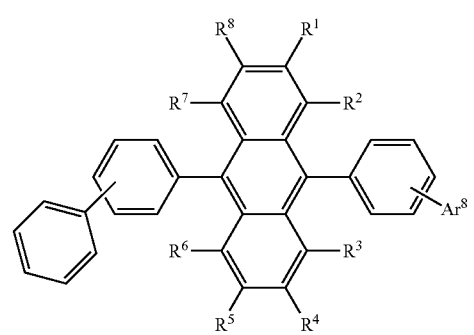

(2-6-2)

In the formula (2-6-2), $R^1$ to $R^8$ are the same as those described above and $Ar^8$ is a substituted or unsubstituted condensed aryl group having 10 to 20 ring carbon atoms.

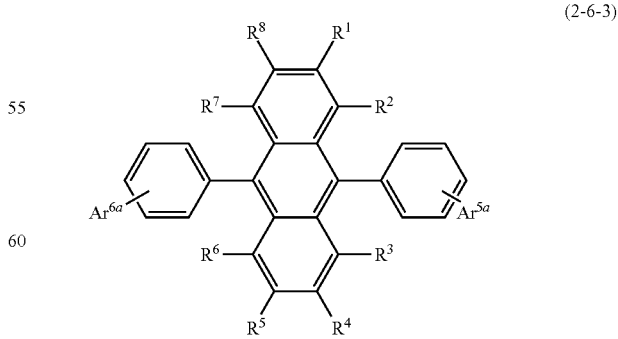

(2-6-3)

In the formula (2-6-3), $R^1$ to $R^8$ are the same as the formula (10).

$Ar^{5a}$ and $Ar^{6a}$ are independently a substituted or unsubstituted condensed aryl group having 10 to 20 ring carbon atoms.

Examples of the substituted or unsubstituted aryl group having 6 to 50 ring carbon atoms of $R^1$ to $R^8$, $R^{11}$, $Ar^5$ to $Ar^7$, $Ar^{11}$ and $Ar^{12}$ include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 6-chrysenyl, 1-benzo[c]phenanthryl, 2-benzo[c]phenanthryl, 3-benzo[c]phenanthryl, 4-benzo[c]phenanthryl, 5-benzo[c]phenanthryl, 6-benzo[c]phenanthryl, 1-benzo[g]chrysenyl, 2-benzo[g]chrysenyl, 3-benzo[g]chrysenyl, 4-benzo[g]chrysenyl, 5-benzo[g]chrysenyl, 6-benzo[g]chrysenyl, 7-benzo[g]chrysenyl, 8-benzo[g]chrysenyl, 9-benzo[g]chrysenyl, 10-benzo[g]chrysenyl, 11-benzo[g]chrysenyl, 12-benzo[g]chrysenyl, 13-benzo[g]chrysenyl, 14-benzo[g]chrysenyl, 1-triphenyl, 2-triphenyl, 2-fluorenyl, 9,9-dimethylfluorene-2-yl, benzofluorenyl, dibenzofluorenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl and 4"-t-butyl-p-terphenyl-4-yl. Preferable examples include an unsubstituted phenyl group, a substituted phenyl group, a substituted or unsubstituted alyl group having 10 to 14 ring carbon atoms (for example, 1-naphthyl, 2-naphthyl or 9-phenanthryl), a substituted or unsubstituted fluorenyl group (2-fluorenyl) and a substituted or unsubstituted pyrenyl group (1-pyrenyl, 2-pyrenyl and 4-pyrenyl).

Examples of the substituted or unsubstituted condensed alyl group having 10 to 20 ring carbon atoms of $Ar^{5a}$, $Ar^{6a}$ and $Ar^8$ include 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl and 2-fluorenyl. In particular, preferable examples include 1-naphthyl, 2-naphthyl, 9-phenanthryl and fluorenyl (2-fluorenyl).

Examples of the substituted or unsubstituted heterocyclic group having 5 to 50 ring atoms of $R^1$ to $R^8$, $R^{11}$, $Ar^5$ to $Ar^7$, $Ar^{11}$ and $Ar^{12}$ include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenantridinyl, 2-phenantridinyl, 3-phenantridinyl, 4-phenantridinyl, 6-phenantridinyl, 7-phenantridinyl, 8-phenantridinyl, 9-phenantridinyl, 10-phenantridinyl, 1-acridinyl, 2-acridinyl, 3-acridinyl, 4-acridinyl, 9-acridinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-3-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-3-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, and 4-t-butyl-3-indolyl. Preferable examples include 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-carbazolyl, 2-carbazolyl, 3-carbazolyl, 4-carbazolyl and 9-carbazolyl.

Examples of the substituted or unsubstituted alkyl group having 1 to 50 carbon atoms of $R^1$ to $R^8$, $R^{11}$, and $Ar^5$ to $Ar^7$ include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, and 1,2,3-trinitropropyl. Preferable examples include methyl, ethyl, propyl, isopropyl, n-butyl, s-butyl, isobutyl and t-butyl.

Examples of the substituted or unsubstituted cycloalkyl group having 3 to 50 carbon atoms of $R^1$ to $R^8$, $R^{11}$ and $Ar^5$ to $Ar^7$ include cyclopropyl, cyclobutyl, cyclopentyl, cyclohexyl, 4-methylcyclohexyl, 1-adamantyl, 2-adamantyl, 1-norbornyl, and 2-norbornyl. Preferable examples include cyclopentyl and cyclohexyl.

The substituted or unsubstituted alkoxy group having 1 to 50 carbon atoms of $R^1$ to $R^8$ and $R^{11}$ is a group represented by —OZ, and Z is selected from the aforementioned substituted or unsubstituted alkyl groups having 1 to 50 carbon atoms of $R^1$ to $R^8$.

Examples of the substituted or unsubstituted aralkyl group having 7 to 50 carbon atoms, the aryl part of which has 6 to 49 carbon atoms and the alkyl part of which has 1 to 44 carbon atoms, of $R^1$ to $R^8$, $R^{11}$ and $Ar^5$ to $Ar^7$ include benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl.

The substituted or unsubstituted aryloxy group and arylthio group having 6 to 50 ring carbon atoms of $R^1$ to $R^8$ and $R^{11}$ are represented by —OY and —SY, respectively, and Y is selected from the aforementioned substituted or unsubstituted aryl group having 6 to 50 ring carbon atoms of $R^1$ to $R^8$.

The substituted or unsubstituted alkoxycarbonyl group having 2 to 50 ring carbon atoms, the alkyl part of which has 1 to 49 carbon atoms, of $R^1$ to $R^8$ and $R^{11}$ are represented by —COOZ, and Z is selected from the aforementioned substituted or unsubstituted alkyl group having 1 to 50 carbon atoms of $R^1$ to $R^8$.

Examples of the substituted silyl group of $R^1$ to $R^8$ and $R^{11}$ include trimethylsilyl, triethylsilyl, t-butyldimethylsilyl, vinyldimethylsilyl, propyldimethylsilyl, and triphenylsilyl.

Examples of the halogen atom of $R^1$ to $R^8$ and $R^{11}$ include fluorine, chlorine, bromine and iodine.

(2) When a Dopant Satisfying Ah<Ad and a Dopant Satisfying Ah>Ad Coexist

Figure 3C:
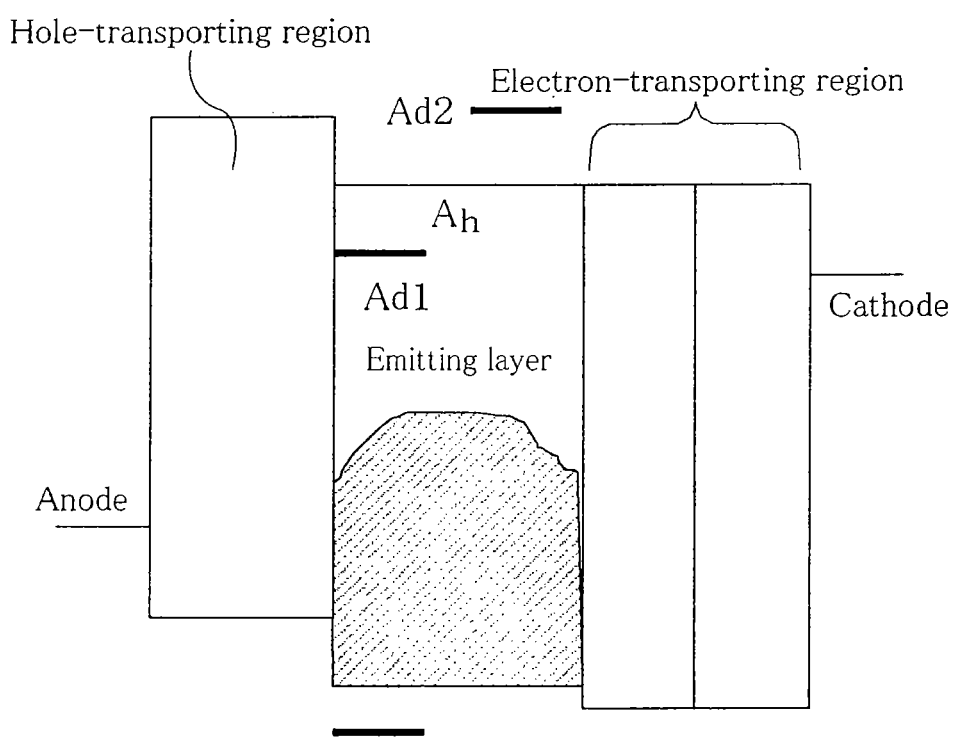
FIG. 3C is an energy band diagram showing a state in which a dopant satisfying Ah<Ad and a dopant satisfying Ah>Ad coexist.

FIG. 3C shows a state in which the emitting layer contains both of a dopant satisfying Ah<Ad and a dopant satisfying Ah>Ad. In this case, both electrons and holes are trapped properly, whereby recombination occurs in the entire region of the emitting layer. Recombination occurs frequently on the cathode side. By providing a blocking layer which has large triplet energy, the TTF phenomenon occurs efficiently.

The blocking layer serves to prevent triplet excitons generated in the emitting layer from being diffused to the electron-transporting region, as well as to effectively inject electrons to the emitting layer. If the electron-injection performance to the emitting layer is degraded, the electron-hole recombination in the emitting layer occurs less frequently, resulting in a reduced density of triplet excitons. If the density of triplet excitons is reduced, frequency of collision of triplet excitons is reduced, and as a result, the TTF phenomenon does not occur efficiently. In respect of efficient electron injection to the emitting layer, the following two structures can be considered as the structure of the electron-transporting region including the blocking layer.
(1) The electron-transporting region is formed of a multilayer stack structure of two or more different materials, and an electron-injecting layer for efficiently receiving electrons from the cathode is provided between the blocking layer and the cathode. Specific examples of a material for the electron-injecting layer include a nitrogen-containing heterocyclic derivative.

In this case, it is preferred that the affinity of the electron-injecting layer Ae-the affinity of the blocking layer Ab is smaller than 0.2 eV. If this relationship is not satisfied, injection of electrons from the electron-injecting layer to the blocking layer is suppressed, causing electrons to accumulate in the electron-transporting region, resulting in an increased voltage. In addition, accumulated electrons collide with triplet excitons, causing energy quenching.

It is preferred that the material for the blocking layer have an electron mobility of $10^{-6}$ cm$^2$/Vs or more in an electric field intensity of 0.04 to 0.5 MV/cm.

Furthermore, it is preferred that the electron-injecting layer have an electron mobility of $10^{-6}$ cm$^2$/Vs or more in an electric field intensity of 0.04 to 0.5 MV/cm. This is to promote the electron injection to an emitting layer, increase the density of excitons therein and cause the TTF phenomenon to occur efficiently.

(2) The electron-transporting region is formed of a single blocking layer. In this case, in order to facilitate the receipt of electrons from the cathode, a donor represented by an alkaline metal is doped in the vicinity of the interface of the cathode. As the donor, at least one selected from the group consisting of a donor metal, a donor metal compound and a donor metal complex can be used.

The donor metal is referred to as a metal having a work function of 3.8 eV or less. Preferred examples thereof include an alkali metal, an alkaline earth metal and a rare earth metal. More preferably, the donor metal is Cs, Li, Na, Sr, K, Mg, Ca, Ba, Yb, Eu and Ce.

The donor metal compound means a compound which contains the above-mentioned donor metal. Preferably, the donor metal compound is a compound containing an alkali metal, an alkaline earth metal or a rare earth metal. More preferably, the donor metal compound is a halide, an oxide, a carbonate or a borate of these metals. For example, the donor metal compound is a compound shown by $MO_x$ (wherein M is a donor metal, and x is 0.5 to 1.5), $MF_x$ (x is 1 to 3), or $M(CO_3)_x$ (wherein x is 0.5 to 1.5).

The donor metal complex is a complex of the above-mentioned donor metal. Preferably, the donor metal complex is an organic metal complex of an alkali metal, an alkaline earth metal or a rare earth metal. Preferably, the donor metal complex is an organic metal complex shown by the following formula (I):

$$M(\text{—}Q)_n \qquad (I)$$

wherein M is a donor metal, Q is a ligand, preferably a carboxylic acid derivative, a diketone derivative or a quinoline derivative, and n is an integer of 1 to 4.

Specific examples of the donor metal complex include a tungsten paddlewheel as stated in JP-A-2005-72012. In addition, a phthalocyanine compound in which the central metal is an alkali metal or an alkaline earth metal, which is stated in JP-A-H11-345687, can be used as the donor metal complex, for example.

The above-mentioned donor may be used either singly or in combination of two or more.

In the invention, the density of excitons is large in the interface between the emitting layer and the blocking layer. In this case, the probability is high that holes which do not contribute to recombination in the emitting layer are injected to the inside of the blocking layer. Therefore, as the material used in the blocking layer, a material improved in resistance to oxidation is preferable.

As specific examples of the material improved in resistance to oxidation, aromatic hydrocarbon compounds, particularly, at least one compound selected from polycyclic aromatic compounds shown by the following formulas (A), (B) and (C) which are disclosed in Japanese Patent Application No. 2009-090379 are preferable.

  (A)

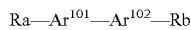  (B)

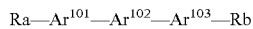  (C)

wherein $Ar^{101}$, $Ar^{102}$, $Ar^{103}$, Ra and Rb are independently a substituted or unsubstituted benzene ring, or a polycyclic aromatic skeleton part selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring, a substituted or unsubstituted fluorine ring and a substituted or unsubstituted picene ring; provided that the substituents of Ra and Rb are not an aryl group and that $Ar^1$, $Ar^2$, $Ar^3$, Ra and Rb are not a substituted or unsubstituted benzene ring at the same time.

In the above polycyclic aromatic compound, it is preferred that one or both of the Ra and Rb be a group selected from a substituted or unsubstituted phenanthrene ring, a substituted or unsubstituted benzo[c]phenanthrene ring and a substituted or unsubstituted fluoranthene ring.

The polycyclic aromatic skeleton part of the above-mentioned polycyclic aromatic compound may have a substituent.

Examples of the substituent of the polycyclic aromatic skeleton part include a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, and a substituted or unsubstituted alkoxycarbonyl group or a carboxyl group. Preferred examples of the aromatic hydrocarbon group include naphthalene, phenanthrene, fluorene, chrysene, fluoranthene and triphenylene.

If the polycyclic aromatic skeleton part has a plurality of substituent, these substituents may form a ring.

It is preferred that the polycyclic aromatic skeleton part be any one selected from the group consisting of compounds shown by the following formulas (1) to (4):

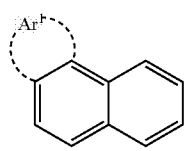  (1)

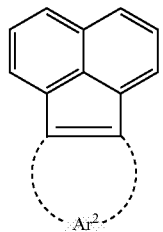  (2)

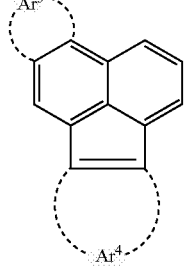  (3)

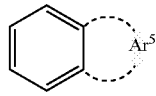  (4)

In formulas (1) to (4), $Ar^1$ to $Ar^5$ are a substituted or unsubstituted condensed ring structure having 4 to 16 ring carbon atoms.

As the compound shown by formula (1), a simple substance or a derivative or the like of a substituted or unsubstituted phenanthrene, chrysene can be given, for example.

As the compound shown by formula (2), a simple substance or a derivative or the like of a substituted or unsubstituted acenaphthylene, acenaphthene or fluoranthene can be given, for example.

As the compound shown by formula (3), a simple substance or a derivative or the like of a substituted or unsubstituted benzofluoranthene can be given, for example.

As the compound shown by formula (4), a simple substance or a derivative or the like of a substituted or unsubstituted naphthalene can be given.

As the naphthalene derivative, one shown by the following formula (4A) can be given, for example.

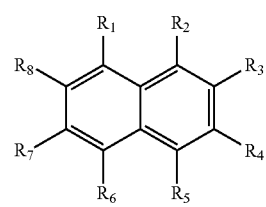  (4A)

In formula (4A), $R_1$ to $R_8$ are independently a hydrogen atom, a substituent selected from a substituted or unsubstituted aryl group having 5 to 30 ring carbon atoms, a branched or linear alkyl group having 1 to 30 carbon atoms and a substituted or unsubstituted cycloalkyl group having 3 to 20 carbon atoms, or a substituent formed of a combination thereof.

As the phenanthrene derivative, one shown by the following formula (5A) can be given.

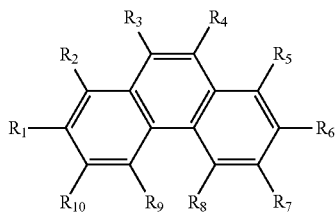
(5A)

In formula (5A), $R_1$ to $R_{10}$ are independently a hydrogen atom, a substituent selected from a substituted or unsubstituted aryl group having 5 to 30 ring carbon atoms, a branched or linear alkyl group having 1 to 30 carbon atoms and a substituted or unsubstituted cycloalkyl group having 3 to 20 carbon atoms, or a substituent formed of a combination thereof.

As the chrysene derivative, one shown by the following formula (6A) can be given, for example.

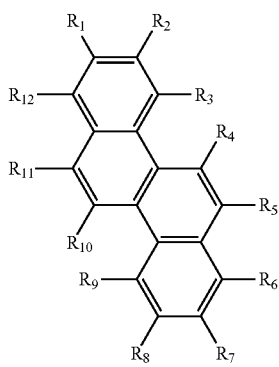
(6A)

In formula (6A), $R_1$ to $R_{12}$ are independently a hydrogen atom, a substituent selected from a substituted or unsubstituted aryl group having 5 to 30 ring carbon atoms, a branched or linear alkyl group having 1 to 30 carbon atoms and a substituted or unsubstituted cycloalkyl group having 3 to 20 carbon atoms, or a substituent formed of a combination thereof.

It is preferred that the above-mentioned polycyclic aromatic skeleton part be benzo[c]phenanthrene or the derivative thereof. As the benzo[c]phenanthrene derivative, one shown by the following formula (7A) can be given, for example.

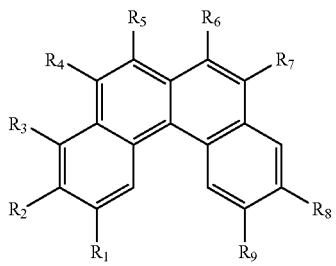
(7A)

In formula (7A), $R_1$ to $R_9$ are independently a hydrogen atom, a substituent selected from a substituted or unsubstituted aryl group having 5 to 30 ring carbon atoms, a branched or linear alkyl group having 1 to 30 carbon atoms and a substituted or unsubstituted cycloalkyl group having 3 to 20 carbon atoms, or a substituent formed of a combination thereof.

It is preferred that the above-mentioned polycyclic aromatic skeleton part be benzo[c]chrysene or the derivative thereof. As the benzo[c]chrysene derivative, one shown by the following formula (8A) can be given, for example.

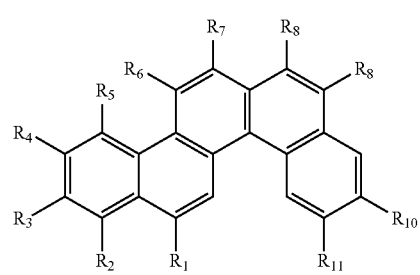
(8A)

In formula (8A), $R_1$ to $R_{11}$ are independently a hydrogen atom, a substituent selected from a substituted or unsubstituted aryl group having 5 to 30 ring carbon atoms, a branched or linear alkyl group having 1 to 30 carbon atoms and a substituted or unsubstituted cycloalkyl group having 3 to 20 carbon atoms, or a substituent formed of a combination thereof.

It is preferred that the above-mentioned polycyclic aromatic skeleton part be dibenzo[c,g]phenanthrene shown by the following formula (9) or the derivative thereof.

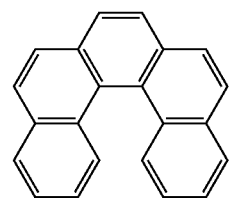
(9)

It is preferred that the above-mentioned polycyclic aromatic skeleton part be fluoranthene or the derivative thereof. As the fluoranthene derivative, one shown by the following formula (10A) can be given, for example.

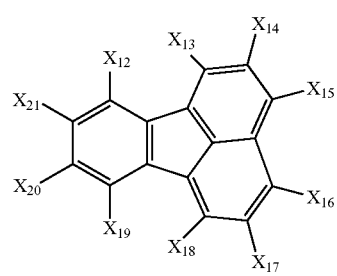
(10A)

In formula (10A), $X_{12}$ to $X_{21}$ are a hydrogen atom, a halogen atom, a linear, branched or cyclic alkyl group, a linear, branched or cyclic alkoxy group, a substituted or unsubstituted aryl group or a substituted or unsubstituted heteroaryl group.

Furthermore, it is preferred that the above-mentioned polycyclic aromatic skeleton part be triphenylene or the derivative thereof. As the triphenylene derivative, one shown by the following formula (11A) can be given, for example.

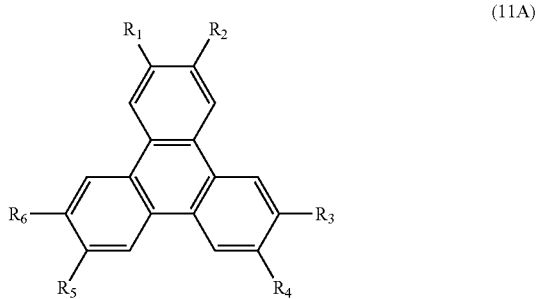

(11A)

In formula (11A), $R_1$ to $R_6$ are independently a hydrogen atom, a substituent selected from a substituted or unsubstituted aryl group having 5 to 30 ring carbon atoms, a branched or linear alkyl group having 1 to 30 carbon atoms and a substituted or unsubstituted cycloalkyl group having 3 to 20 carbon atoms, or a substituent formed of a combination thereof.

The above-mentioned polycyclic aromatic compound may be one shown the following formula (12).

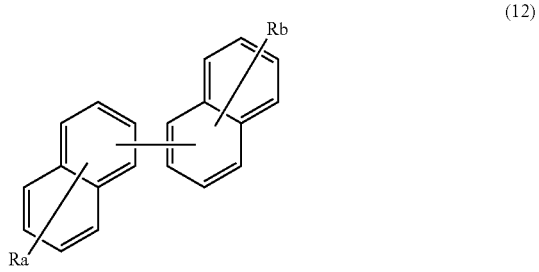

(12)

In the formula (12), Ra and Rb are the same as those in the above formulas (A) to (C). When Ra, Rb or the naphthalene ring has one or a plurality of substituent, the substituent may be an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom. The substituent of the naphthalene ring other than Ra and Rb may be an aryl group having 6 to 22 carbon atoms.

In the formula (12), it is preferred that Ra and Rb be a group selected from a fluorene ring, a phenanthrene ring, a triphenylene ring, a benzophenanthrene ring, a dibenzophenanthrene ring, a benzotriphenylene ring, a fluoranthene ring, a benzochrysene ring, a benzo[b]fluoranthene ring and a picene ring.

As for the material for the blocking layer, a material which exhibits a reversible oxidation process in a cyclic voltammetry measurement is desirable.

It is preferred that the material for the blocking layer have an electron mobility of $10^{-6}$ cm$^2$/Vs or more in an electric field intensity of 0.04 to 0.5 MV/cm. As the method for measuring the electron mobility of an organic material, several methods including the Time of Flight method are known. In the invention, however, the electron mobility is determined by the impedance spectroscopy.

An explanation is made on the measurement of the mobility by the impedance spectroscopy. A blocking layer material with a thickness of preferably about 100 nm to 200 nm is held between the anode and the cathode. While applying a bias DC voltage, a small alternate voltage of 100 mV or less is applied, and the value of an alternate current (the absolute value and the phase) which flows at this time is measured. This measurement is performed while changing the frequency of the alternate voltage, and complex impedance (Z) is calculated from a current value and a voltage value. Dependency of the imaginary part (1 mM) of the modulus M=i$\omega$Z (i: imaginary unit $\omega$: angular frequency) on the frequency is obtained. The inverse of a frequency at which the 1 mM becomes the maximum is defined as the response time of electrons carried in the blocking layer. The electron mobility is calculated according to the following formula:

Electron mobility=(film thickness of the material for forming the blocking layer)$^2$/(response time·voltage)

Specific examples of a material of which the electron mobility is $10^{-6}$ cm$^2$/Vs or more in an electric field intensity of 0.04 to 0.5 MV/cm include a material having a fluoranthene derivative in the skeleton part of a polycyclic aromatic compound.

The emitting layer may contain two or more fluorescent dopants of which the main peak wavelength is 550 nm or less. When the emitting layer contains two or more fluorescent dopants, the affinity Ad of at least one dopant is equal to or larger than the affinity Ah of the host, and the triplet energy $E^T_d$ of this dopant is larger than the triplet energy $E^T_h$ of the host. For example, the affinity Ad of at least another dopant may be smaller than the affinity Ah of the host. Containing such two kinds of dopants means containing both of a dopant satisfying Ah<Ad and a dopant satisfying Ah>Ad as mentioned above. Efficiency can be significantly improved by providing a blocking layer having large triplet energy.

As the dopant having the affinity Ad which is smaller than the affinity Ah of the host, aminoanthracene derivatives, aminochrysene derivatives, aminopyrene derivatives or the like can be exemplified.

In addition to the above-mentioned hosts, dibenzofuran compounds disclosed in WO05/113531 and JP2005-314239, fluorene compounds disclosed in WO02/14244, and benzanthracene compounds disclosed in WO08/145,239 can be used.

In addition to the above-mentioned dopants, pyrene compounds disclosed in JP2004-204238, WO05/108348, WO04/83162, WO09/84512, KR10-2008-79956, KR10-2007-115588 and KR10-2010-24894, chrysene compounds disclosed in WO04/44088, and anthracene compounds disclosed in WO07/21117 can be used.

Preferably, the host and the dopant are a compound which is formed by bonding of ring structures or single atoms (including bonding of a ring structure and a single atom) and the bonding is a single bond. A compound which has a double bond in the part other than the ring structure thereof is not preferable. The reason therefor is that the triplet energies generated on the host and the dopant are used for the structural change of the double bond, without being used for a TTF phenomenon.

<Measurement of TFT Ratio>

When the triplet energies of the host, the dopant and the material for the blocking layer satisfy the specified relationship, the ratio of the luminous intensity derived from TTF can be 30% or more of the total emission. As a result, a high efficiency which cannot be realized by conventional fluorescent devices can be attained.

The ratio of luminous intensity derived from TTF can be measured by the transient EL method. The transient EL method is a technique for measuring an attenuating behavior (transient properties) of EL emission after removal of a DC voltage applied to a device. EL luminous intensity is classified into luminous components from singlet excitons which are generated by the first recombination and luminous components from singlet excitons generated through the TTF phenomenon. The lifetime of a singlet exciton is very short, i.e. on the nanosecond order. Therefore, singlet excitons decay quickly after removal of a DC voltage.

On the other hand, the TTF phenomenon is emission from singlet excitons which are generated by triplet excitons having a relatively long lifetime. Therefore, this emission decays slowly. As apparent from the above, since emission from singlet excitons and emission from triplet excitons differ largely in respect of time, the luminous intensity derived from TTF can be obtained. Specifically, the luminous intensity can be determined by the following method.

Figure 4:
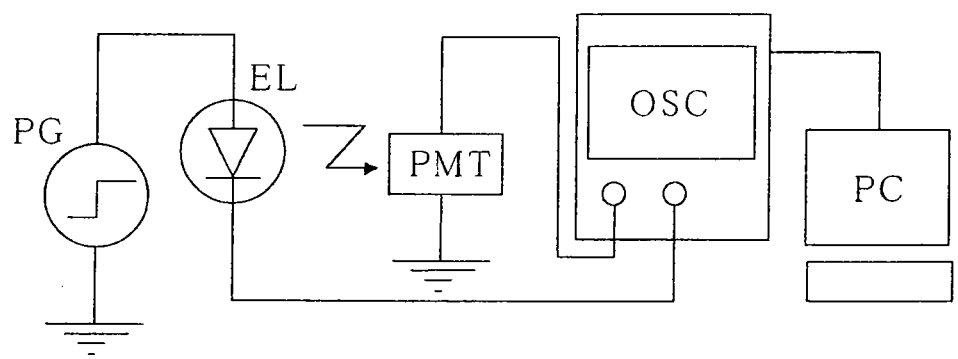
FIG. 4 is a view showing the method for measuring a transient EL waveform.

The transient EL waveform is measured as mentioned below (see FIG. 4). A pulse voltage waveform output from a voltage pulse generator (PG) is applied to an EL device. The voltage waveform of an applied voltage is captured by an oscilloscope (OSC). When a pulse voltage is applied to an EL device, the EL device gives pulse emission. This emission is captured by an oscilloscope (OSC) through a photomultiplier tube (PMT). The voltage waveform and the pulse emission are synchronized and the resultant is captured by a personal computer (PC).

Further, the ratio of the luminous intensity derived from TTF is determined as follows by the analysis of a transient EL waveform.

By solving the rate equation of the decay behavior of triplet excitons, the decay behavior of the luminous intensity based on the TTF phenomenon is modelized. The time decay of the density of triplet excitons $n_T$ within the emitting layer can be expressed by the following rate equation by using the decay rate a due to the life of triplet excitons and the decay rate y due to the collision of triplet excitons:

$$\frac{dn_T}{dt} = -\alpha \cdot n_T - \gamma \cdot n_T^2$$

By approximately solving this differential equation, the following formula can be obtained. Here, $I_{TTF}$ is a luminous intensity derived from TTF and A is a constant. If the transient EL emission is based on TTF, the inverse of the square root of the intensity is expressed as an approximately straight line. The measured transient EL waveform data is fit to the following approximation equation, thereby to obtain constant A. A luminous intensity $1/A^2$ when t=0 at which a DC voltage is removed is defined as a luminous intensity ratio derived from TTF.

$$\frac{1}{\sqrt{I_{TTF}}} \propto A + \gamma \cdot t$$

Figure 5:
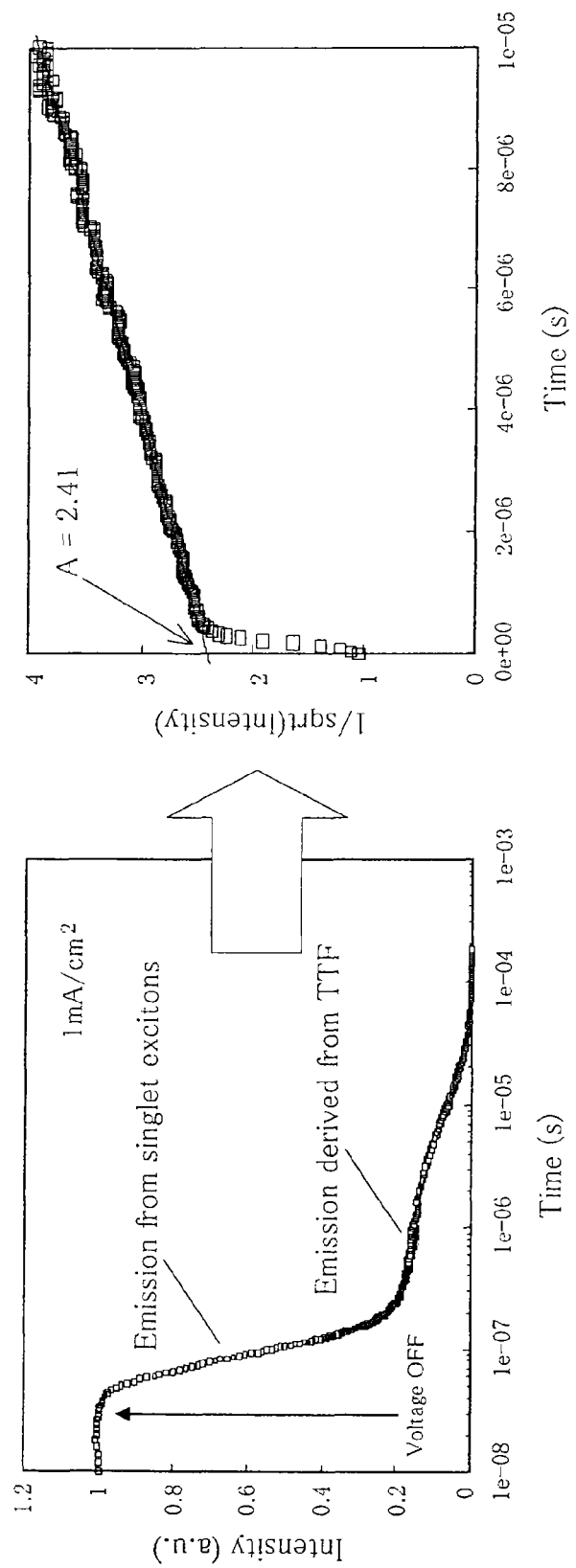
FIG. 5 is a view showing the method for measuring a luminous intensity ratio derived from TTF.

The left graph in FIG. 5 is a measurement example in which a predetermined DC voltage was applied to an EL device and then removed, which shows changes with time in the luminous intensity of the EL device. In the left graph in FIG. 5, a DC voltage was removed after the lapse of about $3 \times 10^{-8}$ second. In the graph, the luminance when removing a voltage is shown as 1. After the rapid decay until about $2 \times 10^{-7}$ second, mild decay components appear. The right graph in FIG. 5 is obtained by setting the time of the removal of a voltage to zero and plotting the inverse of the root square of a luminous intensity until $10^{-5}$ second after the removal of a voltage. It is apparent that the graph can be very approximate to a straight line. When the straight line portion is extended to the time origin, the value of an intersection A of the straight line portion and the ordinate axis is 2.41. A luminous intensity ratio derived from TTF obtained from this transient EL waveform is $1/2.41^2=0.17$. This means that the luminous intensity derived from TTF accounts for 17% of the total emission intensity.

Second Embodiment

The device of the invention may have a tandem device configuration in which at least two organic layer units including emitting layers are provided. An intermediate layer (intermediate conductive layer, charge generation layer or CGL) is provided between the two emitting layers. An electron-transporting region can be provided in each unit. At least one emitting layer is a fluorescent emitting layer and the unit including the emitting layer satisfies the above-mentioned requirements. Specific examples of stack order are given below. The following emitting layer may be a multilayer stack of emitting layers or one organic layer unit including a carrier blocking layer of a third embodiment described later.

Figure 6:
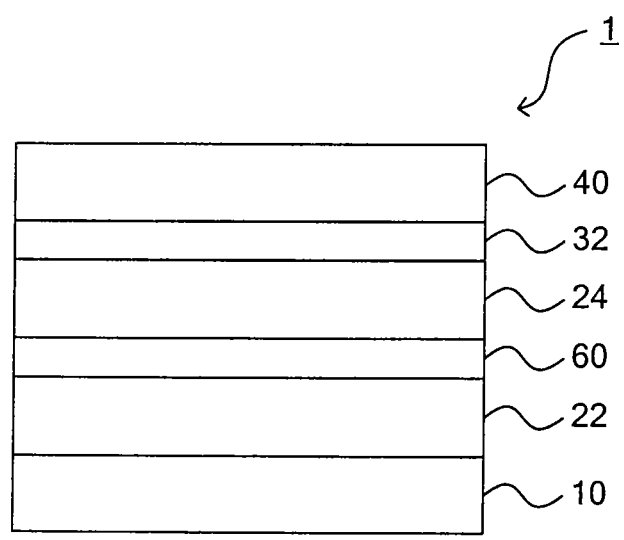
FIG. 6 is a view showing one example of an organic EL device according to a second embodiment.

Anode/fluorescent emitting layer/intermediate layer/fluorescent emitting layer/blocking layer/cathode Anode/fluorescent emitting layer/blocking layer/intermediate layer/fluorescent emitting layer/cathode Anode/fluorescent emitting layer/blocking layer/intermediate layer/fluorescent emitting layer/blocking layer/cathode Anode/phosphorescent emitting layer/intermediate layer/fluorescent emitting layer/blocking layer/cathode Anode/fluorescent emitting layer/blocking layer/intermediate layer/phosphorescent emitting layer/cathode FIG. 6 shows one example of an organic EL device according to this embodiment.

An organic EL device 1 includes with an anode 10, emitting layers 22 and 24 and a cathode 40 in sequential order. Between the emitting layers 22 and 24, an intermediate layer 60 is provided. A blocking layer 32 is adjacent to an emitting layer 24. The emitting layer 24 is a fluorescent emitting layer which satisfies the requirements of the invention. The other emitting layer may be either a fluorescent emitting layer or a phosphorescent emitting layer. A blocking layer may be provided next to the emitting layer 22 and the emitting layer 24 may be a fluorescent emitting layer which satisfies the requirements of the invention.

Between the emitting layers 22 and 24, an electron-transporting region and/or a hole-transporting region may be provided. Three or more emitting layers may be provided, and two or more intermediate layers may be provided. If three or more emitting layers are present, an intermediate layer may or may not be present between all of the emitting layers.

As the intermediate layer, a known material, for example, a material disclosed in U.S. Pat. No. 7,358,661, U.S. patent application Ser. No. 10/562,124 or the like can be used.

Third Embodiment

In this embodiment, an anode, a plurality of emitting layers, an electron-transporting region, and a cathode are provided in sequential order, and a carrier blocking layer is provided between two of the emitting layers. The emitting layer in contact with the carrier blocking layer is a fluorescent emitting layer satisfying the above-mentioned requirements.

As the preferred configuration of the organic EL device according to this embodiment, there can be given the configuration as disclosed in Japanese Patent No. 4134280, US2007/0273270A1 and WO2008/023623A1, and, specifically, the configuration in which an anode, a first emitting layer, a carrier blocking layer, a second emitting layer and a cathode are sequentially stacked, and an electron-transporting region having a blocking layer for preventing diffusion of triplet excitons is further provided between the second emitting layer and the cathode. Here, the carrier blocking layer means a layer to control the carrier injection to an emitting layer and the carrier balance between electrons and holes injected in the emitting layer by providing an energy barrier of a HOMO level or a LUMO level between adjacent emitting layers.

The specific examples of such configuration are given below.

Anode/first emitting layer/carrier blocking layer/second emitting layer/electron-transporting region/cathode Anode/first emitting layer/carrier blocking layer/second emitting layer/third emitting layer/electron-transporting region/cathode It is preferred that a hole-transporting region be provided between the anode and the first emitting layer, as in the case of other embodiments.

Figure 7:
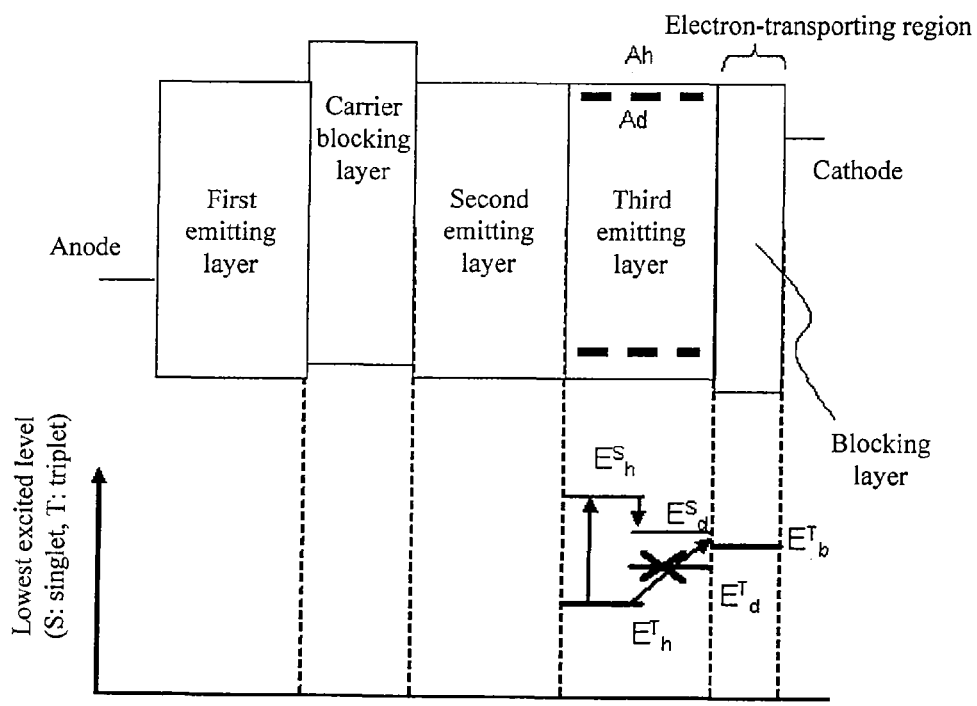
FIG. 7 is a view showing one example of an organic EL device according to a third embodiment.

FIG. 7 shows one example of the organic EL device according to this embodiment. The upper view in FIG. 7 shows the device configuration and HOMO and LUMO energy levels of each layer. The lower view shows the relationship between energy gaps of a third emitting layer and a blocking layer.

An organic EL device 2 is provided with an anode, a first emitting layer, a second emitting layer, a third emitting layer, an electron-transporting region and a cathode 4 in sequential order. Between the first emitting layer and the second emitting layer, a carrier blocking layer is provided. The electron-transporting region is formed of a blocking layer. The third emitting layer is a fluorescent emitting layer satisfying the relationship of the invention. The first emitting layer and the second emitting layer may be either a fluorescent emitting layer or a phosphorescent emitting layer.

The device of this embodiment is suitable as a white emitting device. The device can be a white emitting device by adjusting the emission color of the first emitting layer, the second emitting layer and the third emitting layer. Further, the device can be a white emitting device by arranging only the first emitting layer and the second emitting layer and adjusting the emission color of these two emitting layers. In this case, the second emitting layer is a fluorescent emitting layer satisfying the requirements of the invention.

In particular, it is possible to realize a white emitting device which exhibits a higher emission efficiency as compared with conventional white emitting devices, even though being entirely formed of fluorescent materials, by using a hole-transporting material as the host in the first emitting layer, by adding a fluorescent-emitting dopant of which the main peak wavelength is larger than 550 nm, by using an electron-transporting material as the host in the second emitting layer (and the third emitting layer), and by adding a fluorescent-emitting dopant of which the main peak wavelength is equal to or smaller than 550 nm.

Reference is made particularly to a hole-transporting layer which is adjacent to the emitting layer. In order to allow the TTF phenomenon of the invention to occur effectively, it is preferred that the triplet energy of the hole-transporting material be larger than the triplet energy of the host, when the triplet energy of the hole-transporting material and that of the host are compared.

Forth Embodiment

In this embodiment, a blue pixel, a green pixel and a red pixel are arranged in parallel on a substrate. Of these three color pixels, the blue pixel and/or the green pixel have the configuration of the first embodiment.

Figure 8:
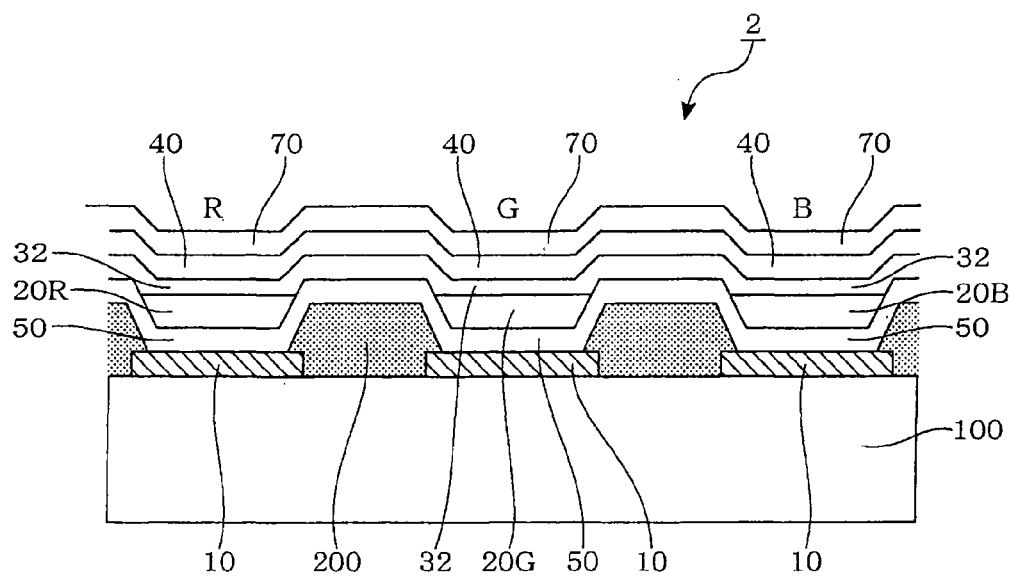
FIG. 8 is a view showing one example of an organic EL device according to a fourth embodiment.

FIG. 8 is a view showing one example of an organic EL device according to this embodiment. In a top-emission type organic EL device 3 shown in this figure, a blue pixel B, a green pixel G and a red pixel R are arranged in parallel on a common substrate 100.

The blue pixel B has an anode 10, a hole-transporting region 50, a blue-emitting layer 20B, an electron-transporting region formed of a blocking layer 32, a cathode 40 and a protective layer 70 sequentially on the substrate 100.

The green pixel G has the anode 10, the hole-transporting region 50, a green-emitting layer 20G, the electron-transporting region formed of the blocking layer 32, the cathode 40 and the protective layer 70 sequentially on the substrate 100.

The red pixel R has the anode 10, the hole-transporting region 50, a red-emitting layer 20R, the electron-transporting region formed of the blocking layer 32, the cathode 40 and the protective layer 70 sequentially on the substrate 100.

An insulating film 200 is formed between the anodes of adjacent pixels so as to keep the insulation between the pixels.

In the organic EL device 3, the blocking layer is provided as the common blocking layer for the blue pixel B, the red pixel R and the green pixel G.

The advantageous effects brought by the blocking layer are significant comparing to the luminous efficiency conventionally attained in a blue fluorescent device. In a green fluorescent device and a red fluorescent device, similar advantageous effects, i.e. effects of confining triplet energies in the emitting layer, can be attained, and improvement in luminous efficiency can also be expected.

On the other hand, in a phosphorescent emitting layer, it is possible to attain the advantageous effects of confining triplet energies in the emitting layer, and as a result, diffusion of triplet energies is prevented, thereby contributing to improvement in luminous efficiency of a phosphorescent dopant.

The hole-transporting region is formed of a hole-transporting layer, or a combination of a hole-transporting layer and a hole-injecting layer, or the like. A common hole-transporting region may be provided or different hole-transporting regions may be provided. Normally, the hole-transporting regions respectively have a configuration suited to the color of emitted light.

The configuration of the organic layer formed of an emitting layer 20B, an emitting layer 20G, an emitting layer 20R and the blocking layer is not limited to that shown in the figure, and it can be changed appropriately.

The host and dopant that can be used in the present invention are described above. In particular, each color emitting layer will be described hereinbelow.

A green color emitting layer is preferably formed of the following host materials and dopant materials. The host materials are preferably condensed aromatic ring derivatives. As the condensed aromatic ring derivatives, anthracene derivatives, pyrene derivatives or the like are more preferable in view of luminous efficiency or lifetime.

As the host materials, a hetero ring-containing compound can be given. Examples of the hetero ring-containing compound include carbazole derivatives, dibenzofuran derivatives, ladder type furan compounds and pyrimidine derivatives.

The dopant material is not limited so long as it functions as a dopant, but aromatic amine derivatives are preferable in view of luminous efficiency and the like. As the aromatic amine derivatives, condensed aromatic ring derivatives having an arylamino group that may be substituted are preferable. For example, pyrene, anthracene and chrysene having an arylamino group can be given.

Styrylamine compounds are also preferable as the dopant materials. As the styrylamine compounds, a styrylamine, styryldiamine, styryltriamine and styryltetraamine can be given. Here, the styrylamine means a substituted or unsubstituted arylamine which is substituted with at least one arylvinyl group. The arylvinyl group may be substituted with a substitutent such as aryl, silyl, alkyl, cycloalkyl or arylamino which may have a further substitutent.

Furthermore, as the dopant materials, a boron complex and fluoranthene compound are preferable, and metal complexes are also preferable. As the metal complexes, an iridium complex and platinum complex can be given.

A red color emitting layer is preferably formed of the following host materials and dopant materials. The host materials are preferably condensed aromatic ring derivatives. As the condensed aromatic ring derivatives, naphthacene derivatives, pentacene derivatives or the like are more preferably in view of luminous efficiency or lifetime.

As the host materials, condensed polycyclic aromatic compounds can be given. As the condensed polycyclic aromatic compounds, naphthalene compounds, phenanthrene compounds and fluoranthene compounds can be given.

As the dopant materials, aromatic amine derivatives are preferable. As the aromatic amine derivatives, condensed aromatic ring derivatives having an arylamino group that may be substituted are preferable. Such compounds include a periflanthene having an arylamino group.

Furthermore, as the dopant materials, metal complexes are preferable. As the metal complexes, an iridium complex or platinum complex can be given.

The device of the fourth embodiment is prepared by the following method, for example.

On a substrate, an APC (Ag—Pd—Cu) layer as a silver alloy layer (reflective layer) and a transparent conductive layer such as a zinc oxide (IZO) film and a tin oxide film are sequentially formed. Next, by a common lithographic technology, this conductive material layer is patterned by etching using a mask with a resist pattern, thereby forming an anode. Then, by the spin coating method, an insulating film formed of a photosensitive resin such as a polyimide is formed by coating on the anode. Thereafter, the resulting film is exposed, developed and cured to allow the anode to be exposed, whereby the anodes for the blue emitting region, the green emitting region and the red emitting region are patterned.

There are three types of electrodes, i.e. an electrode for the red pixel, an electrode for the green pixel and an electrode for a blue pixel. They respectively correspond to the blue emitting region, the green emitting region and the red emitting region, and respectively correspond to the anode. After conducting cleaning for 5 minutes in isopropyl alcohol, an UV ozone cleaning is conducted for 30 minutes. When the hole-injecting layer and the hole-transporting layer are formed thereafter, the hole-injecting layer is stacked over the entire surface of the substrate, and the hole-transporting layer is stacked thereon. Emitting layers are formed such that they are correspondingly arranged to the positions of the anode for the red pixel, the anode for the green pixel and the anode for the blue pixel. When vacuum vapor deposition is used, the blue emitting layer, the green emitting layer and the red emitting layer are finely patterned by using a shadow mask.

Then, the blocking layer is stacked over the entire surface. When an electron-injecting layer is subsequently formed, the electron-injecting layer is stacked over the entire surface. Thereafter, Mg and Ag are formed into a film by deposition, thereby forming a semi-transparent cathode formed of an Mg—Ag alloy.

As for the other members used in the invention, such as the substrate, the anode, the cathode, the hole-injecting layer and the hole-transporting layer, known members and materials stated in PCT/JP2009/053247, PCT/JP2008/073180, U.S. patent application Ser. No. 12/376,236, U.S. patent application Ser. No. 11/766,281, U.S. patent application Ser. No. 12/280,364 or the like can be appropriately selected and used.

It is preferred that the hole-transporting layer include an aromatic amine derivative represented by any of the following formulas (1) to (5).

(1)

(2)

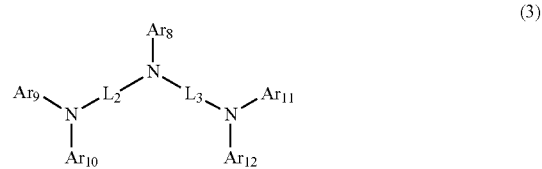

(3)

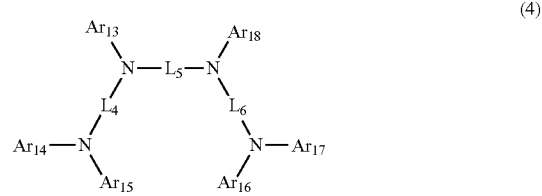

(4)

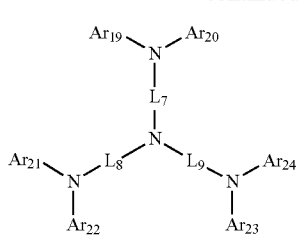

wherein Ar$^1$ to Ar$^{24}$ are independently a substituted or unsubstituted aryl group having 6 to 50 ring carbon atoms or a substituted or unsubstituted heteroaryl group having 5 to 50 ring atoms; and L$^1$ to L$^9$ are independently a substituted or unsubstituted arylene group having 6 to 50 ring carbon atoms or a substituted or unsubstituted heteroarylene group having 5 to 50 ring atoms.

Examples of a substituent which Ar$^1$ to Ar$^{24}$ and L$^1$ to L$^9$ may have include a linear or branched alkyl group having 1 to 15 carbon atoms, a cycloalkyl group having 3 to 15 ring carbon atoms, a trialkylsilyl group having a linear or branched alkyl group having 1 to 15 carbon atoms, a triarylsilyl group having an aryl group having 6 to 14 ring carbon atoms, an alkylarylsilyl group having a linear or branched alkyl group having 1 to 15 carbon atoms and an aryl group having 6 to 14 ring carbon atoms, an aryl group having 6 to 50 ring carbon atoms, a heteroaryl group having 5 to 50 ring atoms, a halogen atom, and a cyano group. Adjacent substituents may bond to each other to form a saturated or unsaturated divalent group forming a ring.

At least one of the aforementioned Ar$^1$ to Ar$^{24}$ is preferably a substituent represented by the following formula (6) or (7).

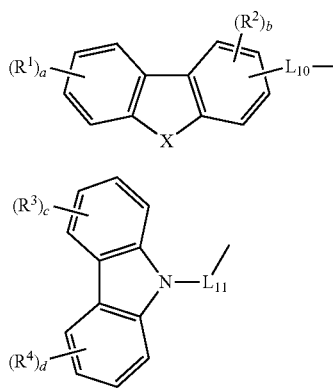

wherein x is an oxygen atom, sulfur atom or N—Ra wherein Ra is a linear or branched alkyl group having 1 to 15 carbon atoms, a cycloalkyl group having 3 to 15 ring carbon atoms, an aryl group having 6 to 50 ring carbon atoms or a heteroaryl group having 5 to 50 ring atoms;

L$^{10}$ is a single bond, a substituted or unsubstituted arylene group having 6 to 50 ring carbon atoms or a substituted or unsubstituted heteroarylene group having 5 to 50 ring atoms;

L$^{11}$ is a substituted or unsubstituted arylene group having 6 to 50 ring carbon atoms or a substituted or unsubstituted heteroarylene group having 5 to 50 ring atoms;

R$^1$ to R$^4$ are independently a linear or branched alkyl group having 1 to 15 carbon atoms, a cycloalkyl group having 3 to 15 ring carbon atoms, a trialkylsilyl group having a linear or branched alkyl group having 1 to 15 carbon atoms, a triarylsilyl group having an aryl group having 6 to 14 ring carbon atoms, an alkylarylsilyl group having a linear or branched alkyl group having 1 to 15 carbon atoms and an aryl group having 6 to 14 ring carbon atoms, an aryl group having 6 to 14 ring carbon atoms, a heteroaryl group having 5 to 50 ring atoms, a halogen atom, or a cyano group. Adjacent groups of R$^1$s to R$^4$s may bond to each other to form a ring;

a, c, and d are an integer of 0 to 4; and b is an integer of 0 to 3.

The compound represented by the formula (1) is preferably the compound represented by the following formula (8).

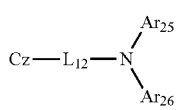

wherein Cz is a substituted or unsubstituted carbazolyl group;

L$_{12}$ is a substituted or unsubstituted arylene group having 6 to 50 ring carbon atoms or a substituted or unsubstituted heteroarylene group having 5 to 50 ring atoms; and Ar$_{25}$ and Ar$_{26}$ are independently a substituted or unsubstituted aryl group having 6 to 50 ring carbon atoms or a substituted or unsubstituted heteroaryl group having 5 to 50 ring atoms.

The compound represented by the formula (8) is preferably the compound represented by the following formula (9).

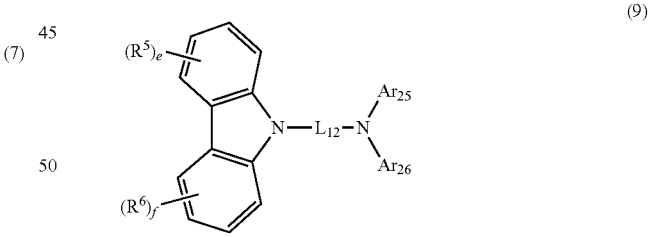

wherein R$^5$ and R$^6$ are independently a linear or branched alkyl group having 1 to 15 carbon atoms, a cycloalkyl group having 3 to 15 ring carbon atoms, a trialkylsilyl group having a linear or branched alkyl group having 1 to 15 carbon atoms, a triarylsilyl group having an aryl group having 6 to 14 ring carbon atoms, an alkylarylsilyl group having a linear or branched alkyl group having 1 to 15 carbon atoms or an aryl group having 6 to 14 ring carbon atoms, an aryl group having 6 to 14 ring carbon atoms, a heteroaryl group having 5 to 50 ring atoms, a halogen atom, or a cyano group; adjacent groups of R$^5$s and R$^6$s may bond to each other to form a ring;

e and f are an integer of 0 to 4; and $L_{12}$, $Ar_{25}$ and $Ar_{26}$ are the same as $L_{12}$, $Ar_{25}$ and $Ar_{26}$ in the formula (8).

The compound represented by the formula (9) is preferably the compound represented by the following formula (10).

(10)

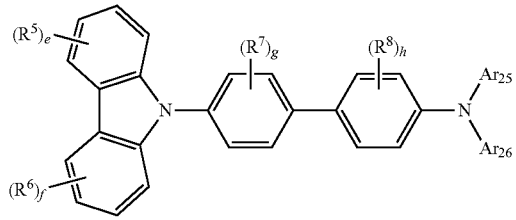

wherein $R^7$ and $R^8$ are independently a linear or branched alkyl group having 1 to 15 carbon atoms, a cycloalkyl group having 3 to 15 ring carbon atoms, a trialkylsilyl group having a linear or branched alkyl group having 1 to 15 carbon atoms, a triarylsilyl group having an aryl group having 6 to 14 ring carbon atoms, an alkylarylsilyl group having a linear or branched alkyl group having 1 to 15 carbon atoms and an aryl group having 6 to 14 ring carbon atoms, an aryl group having 6 to 14 ring carbon atoms, a heteroaryl group having 5 to 50 ring atoms, a halogen atom, or a cyano group; adjacent groups of $R^5$s and $R^6$s may bond to each other to form a ring;

g and h are an integer of 0 to 4; and $R^5$, $R^6$, e, f, $Ar_{25}$ and $Ar_{26}$ are the same as $R^5$, $R^6$, e, f, $Ar_{25}$ and $Ar_{26}$ in the formula (9).

EXAMPLES

Compounds Used

Materials used in Examples and Comparative Examples and the physical properties thereof are shown below.

[Hole-injecting materials]

HI1

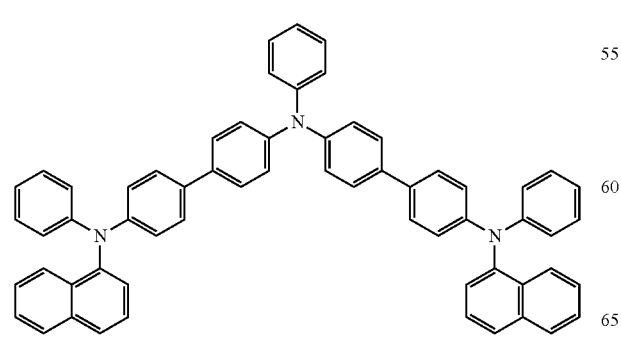

HI2

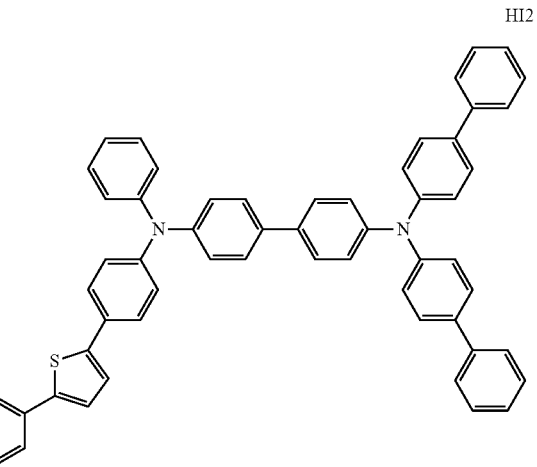

[Hole-transporting materials]

HT1

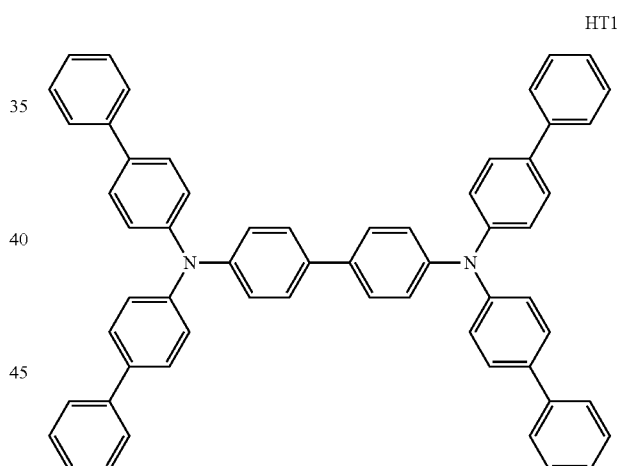

$E^T = 2.5$ eV

HT2

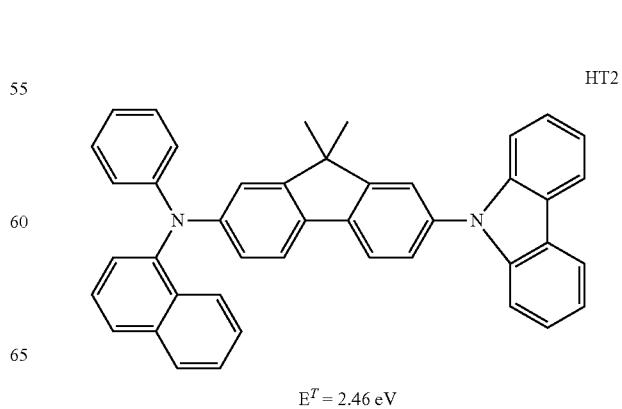

$E^T = 2.46$ eV

-continued
HT3
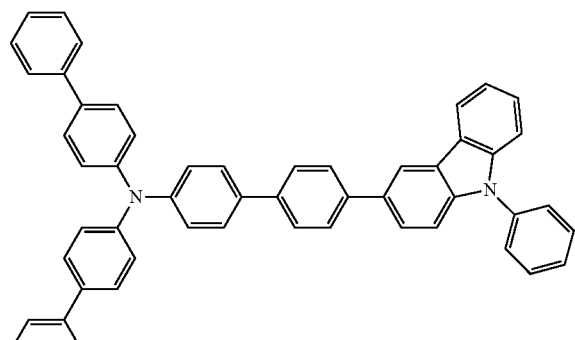
$E^T$ = 2.6 eV
HT4
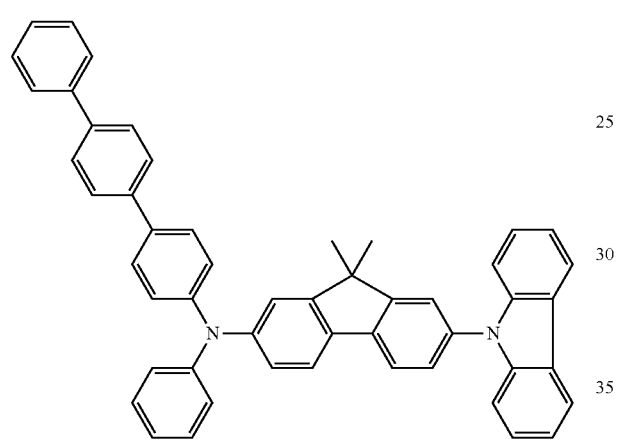
$E^T$ = 2.56 eV
HT5
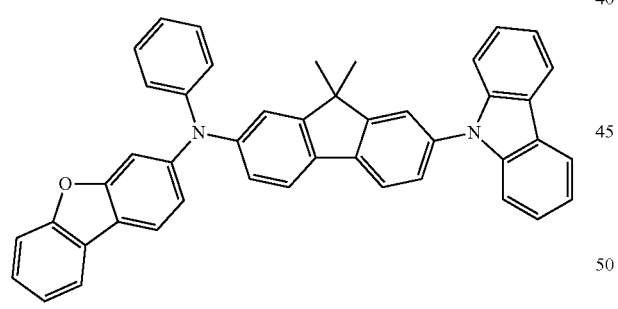
$E^T$ = 2.57 eV
HT6
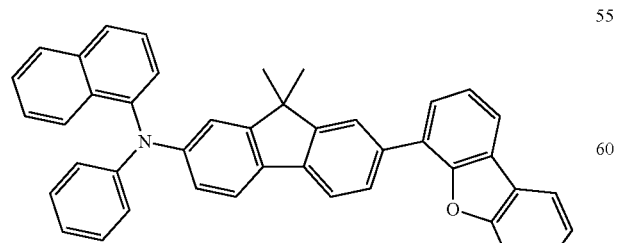
$E^T$ = 2.46 eV
HT7
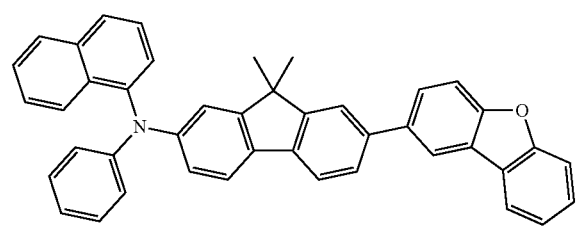
$E^T$ = 2.47 eV
HT8
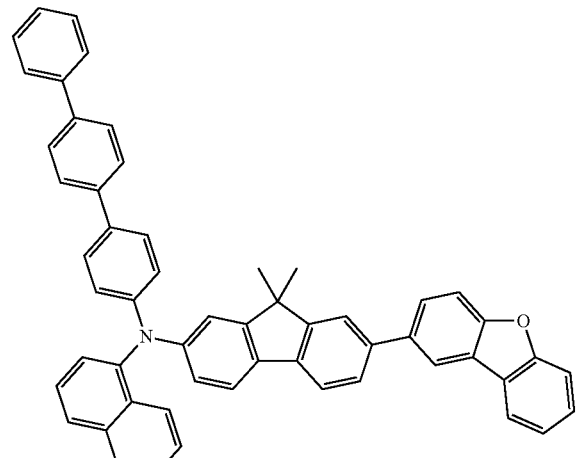
$E^T$ = 2.45 eV
HT9
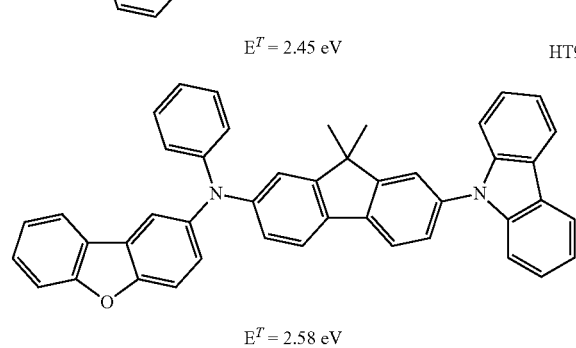
$E^T$ = 2.58 eV
HT10
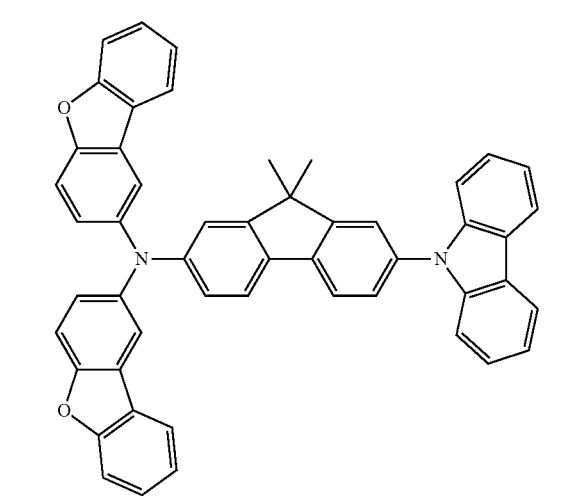
$E^T$ = 2.57 eV

[Host materials]
BH1
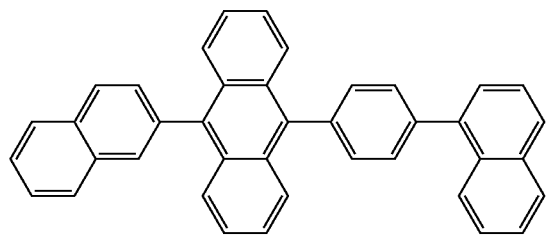
$E^T = 1.83$ eV
Affinity = 3 eV
BH2
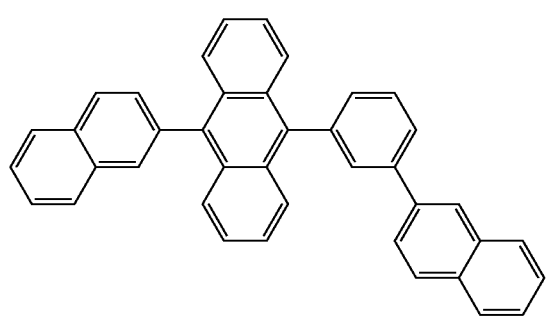
$E^T = 1.83$ eV
Affinity = 3 eV
BH3
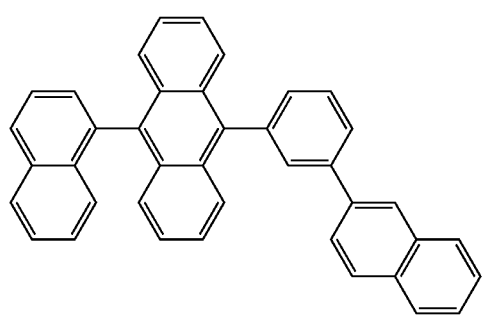
$E^T = 1.83$ eV
Affinity = 3 eV
[Dopant materials]
BD1
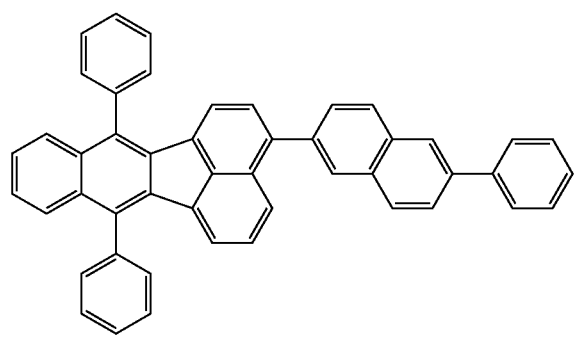
$E^T = 2.13$ eV
Affinity = 3.1 eV
Main peak wavelength 442 nm
BD2
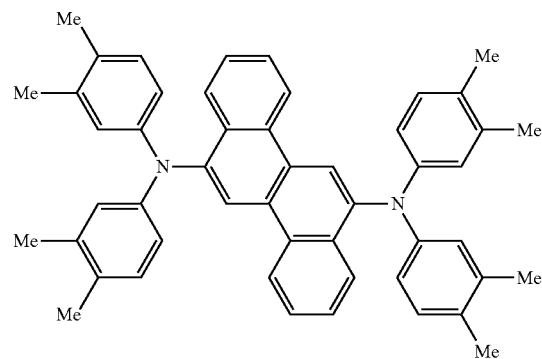
$E^T = 2.28$ eV
Affinity = 2.7 eV
Main peak wavelength 463 nm
BD3
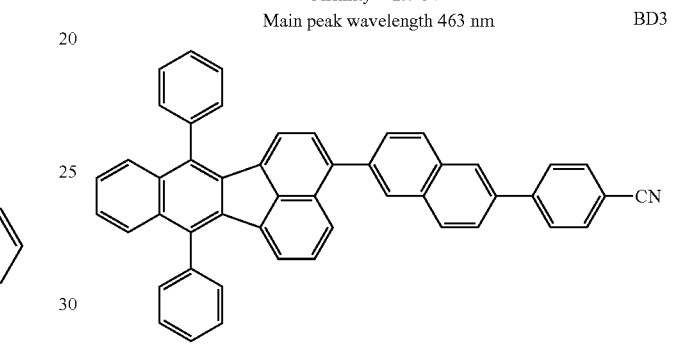
$E^T = 2.13$ eV
Affinity = 3.1 eV
Main peak wavelength 442 nm
BD4
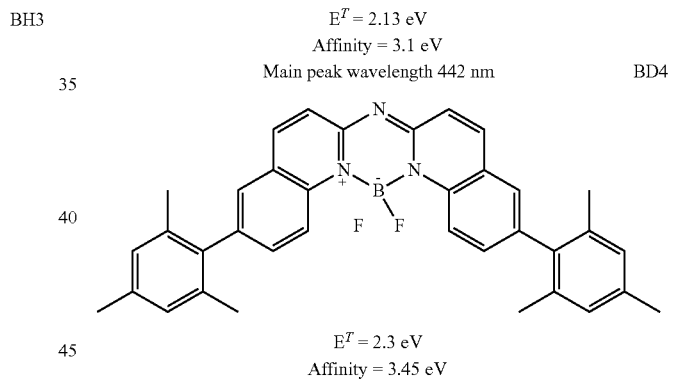
$E^T = 2.3$ eV
Affinity = 3.45 eV
Main peak wavelength 449 nm
[Blocking-layer materials]
TB1
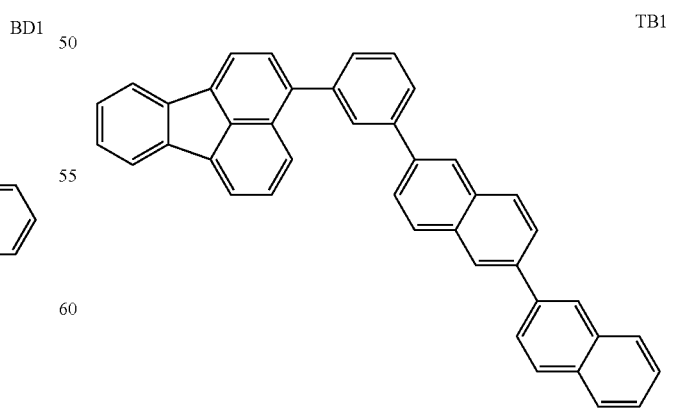
$E^T = 2.27$ eV
Affinity = 3 eV TB2
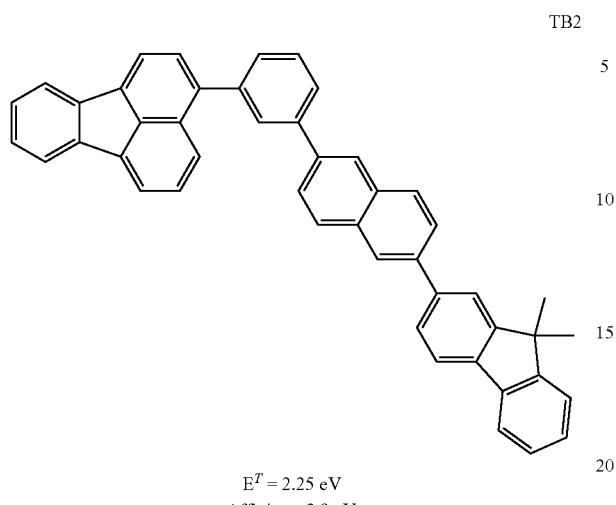
$E^T$ = 2.25 eV
Affinity = 2.9 eV
TB3
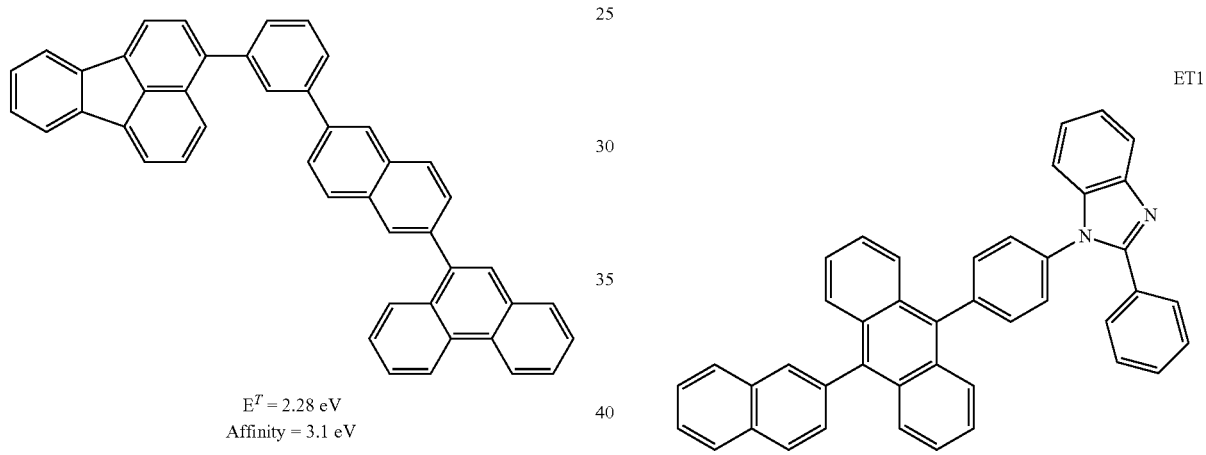
$E^T$ = 2.28 eV
Affinity = 3.1 eV
TB4
$E^T$ = 2.36 eV
Affinity = 2.9 eV
TB5
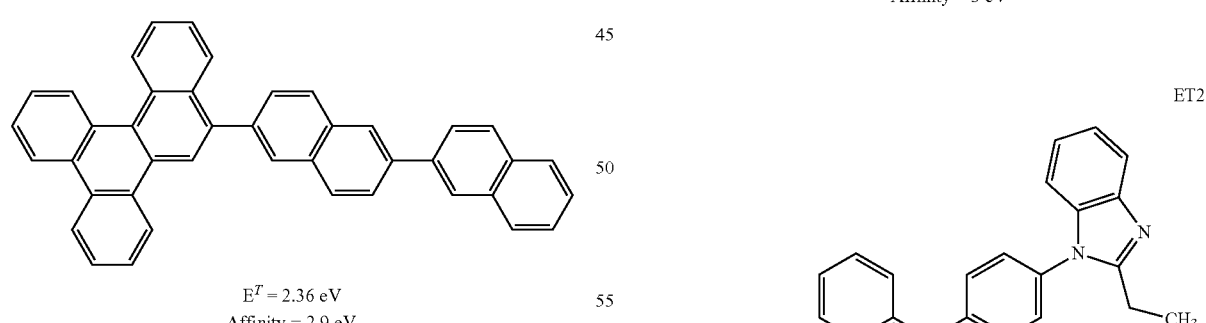
$E^T$ = 2.23 eV
Affinity = 3 eV
TB6
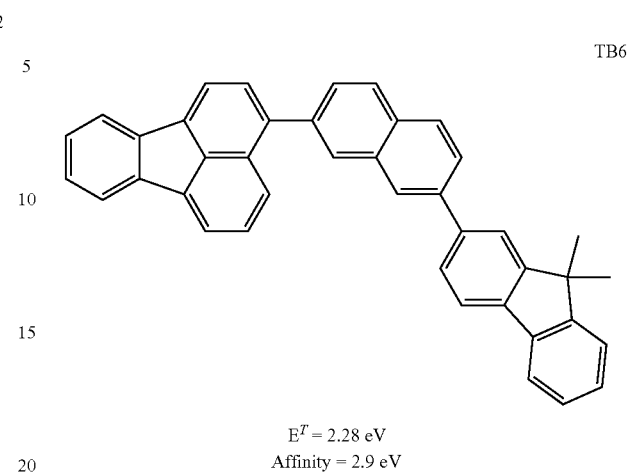
$E^T$ = 2.28 eV
Affinity = 2.9 eV
[Electron-transporting materials]
ET1
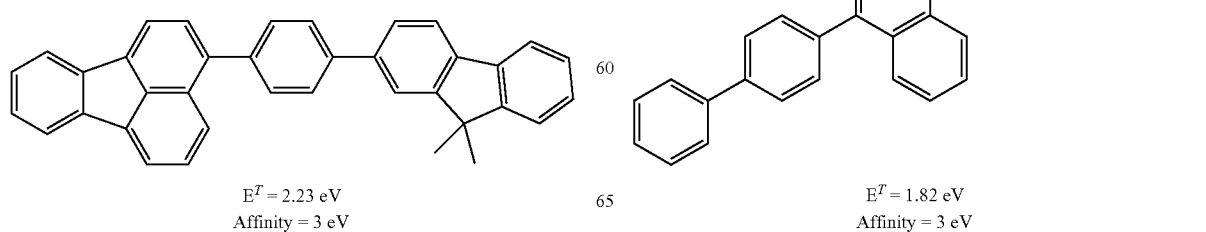
$E^T$ = 1.82 eV
Affinity = 3 eV
ET2
$E^T$ = 1.82 eV
Affinity = 3 eV -continued
ET3
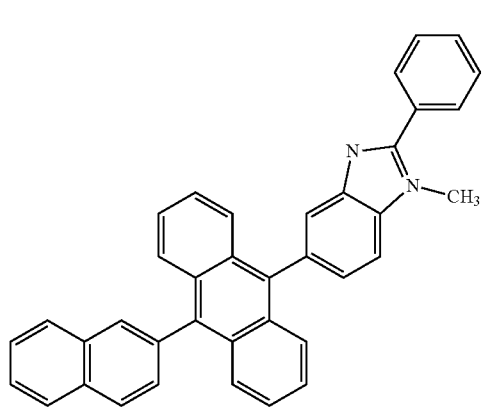
$E^T = 1.82$ eV
Affinity = 3 eV
ET4
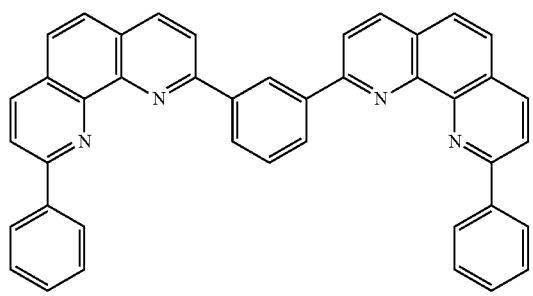
$E^T = 2.52$ eV
Affinity = 2.7 eV
[Materials for white color]
GD
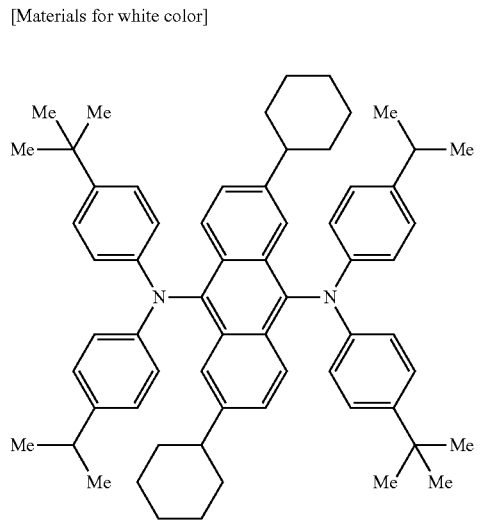
$E^T = 1.85$ eV
Affinity = 3.1 eV
Ionization potential = 5.6 eV
Main peak wavelength 518 nm
-continued
RH
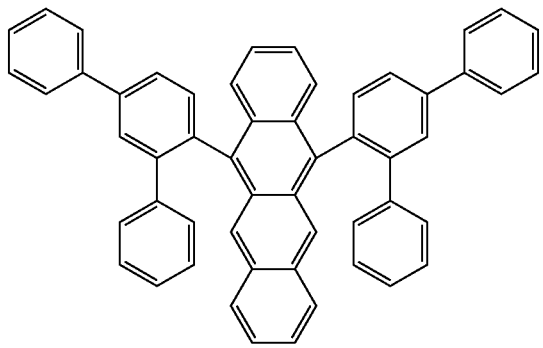
RD
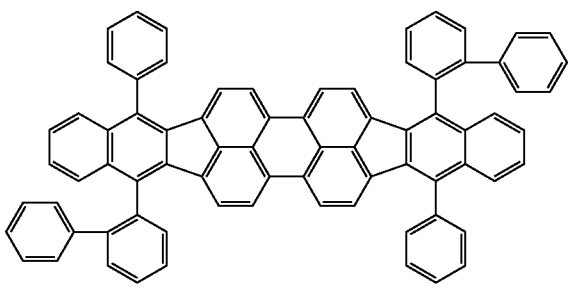
Main peak wavelength 601 nm
HAT
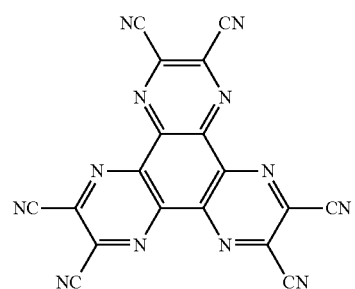
PGD
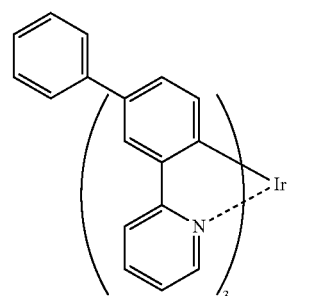
PRD
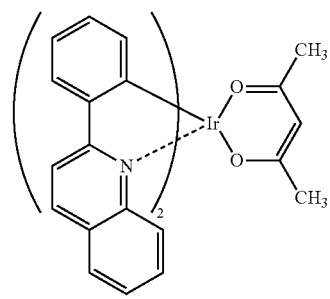

-continued

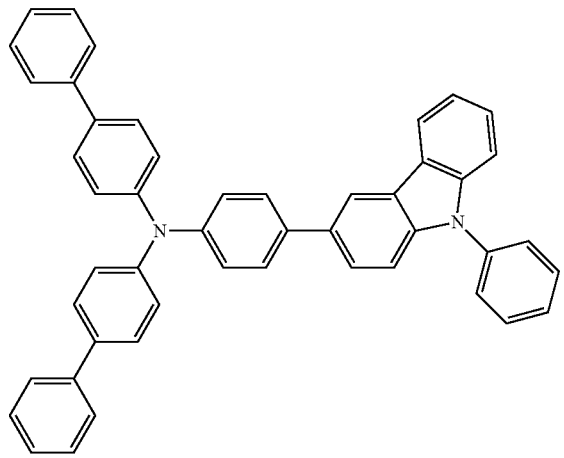

HT11

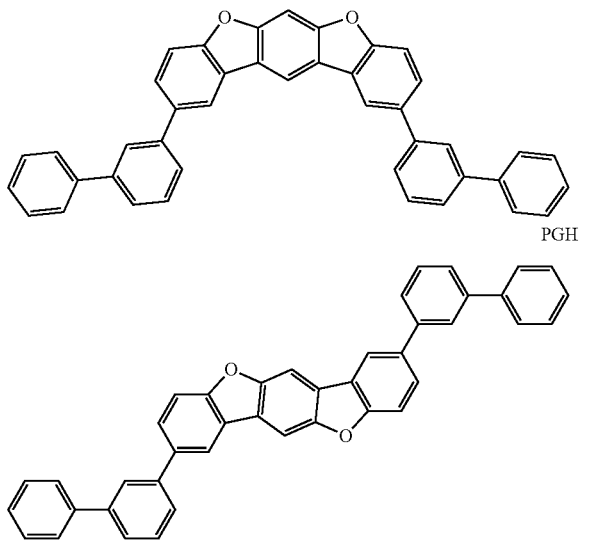

PBH

PGH

Measuring methods of the above physical properties are shown below.

(1) Triplet Energy ($E^T$)

A commercially available device "F-4500" (manufactured by Hitachi, Ltd.) was used for the measurement. The $E^T$ conversion expression is the following.

$$E^T(eV) = 1239.85/\lambda_{edge}$$

When the phosphorescence spectrum is expressed in coordinates of which the vertical axis indicates the phosphorescence intensity and of which the horizontal axis indicates the wavelength, and a tangent is drawn to the rise of the phosphorescence spectrum on the shorter wavelength side, "$\lambda_{edge}$" is the wavelength at the intersection of the tangent and the horizontal axis. The unit for "$\lambda_{edge}$" is nm.

(2) Ionization Potential

A photoelectron spectroscopy in air (AC-1, manufactured by Riken Keiki Co., Ltd.) was used for the measurement. Specifically, light was irradiated to a material and the amount of electrons generated by charge separation was measured.

(3) Affinity

An affinity was calculated from measured values of an ionization potential and an energy gap. The Energy gap was measured based on an absorption edge of an absorption spectrum in benzene. Specifically, an absorption spectrum was measured with a commercially available ultraviolet-visible spectrophotometer. The energy gap was calculated from the wavelength at which the spectrum began to raise.

(4) Electron Mobility

An electron mobility was evaluated using the impedance spectrometry. The following electron only devices were prepared, DC voltage on which AC voltage of 100 mV placed was applied thereon, and their complex modulus values were measured. When the frequency at which the imaginary part was maximum was set to $f_{max}(H_z)$, a response time T(sec.) was calculated based on the formula $T=1/2/\pi/f_{max}$. Using this value, the dependence property of electron mobility on electric field intensity was determined.

Al/TB1(95)/ET1(5)/LiF(1)/Al

Al/TB2(95)/ET1(5)/LiF(1)/Al

Al/ET1(100)/LiF(1)/Al

Al/Alq$_3$(100)/LiF(1)/Al

Here the figures in parentheses represent a thickness (unit: nm).

Figure 9:
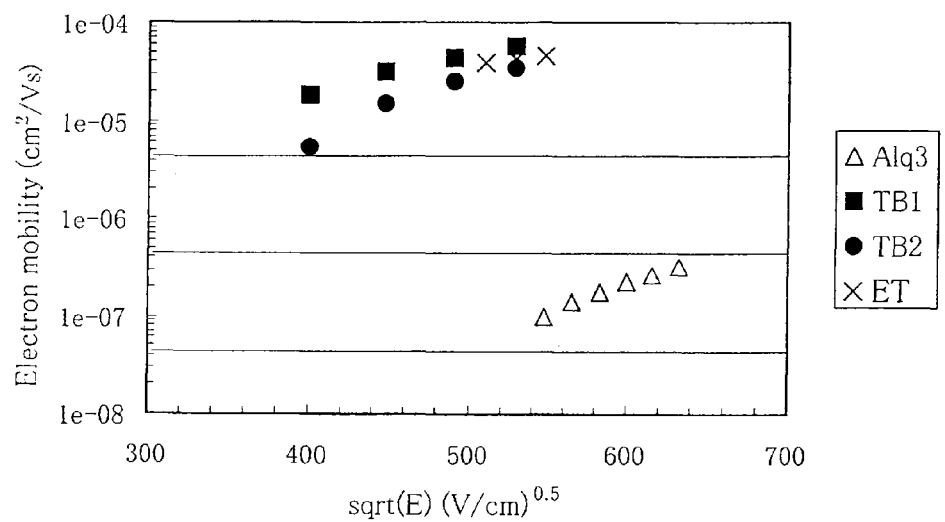
FIG. 9 is a view showing an electron mobility of each of TB1, TB2, ET and Alq$_3$ used in Examples.

As shown in FIG. 9, the electron mobilities of TB1 and TB2 used as a barrier layer at 500 (V/cm)$^{0.5}$, i.e., 0.25 MV/cm are $4 \times 10^{-5}$ cm$^2$/Vs and $3 \times 10^{-5}$ cm$^2$/Vs, respectively. The electron mobilities are more than $10^{-8}$ cm$^2$/Vs in a wide range of electric field intensity. FIG. 9 shows that these values are approximately the same as the electron mobility of material ET1 used as an electron injecting layer. The electron mobility of Alq$_3$ is $5 \times 10^{-8}$ cm$^2$/Vs at 0.25 MV/cm, and smaller than the hundredth part of TB1 or TB2.

(5) Method for Determining Internal Quantum Efficiency

Light emission distribution and light extraction efficiency in an emitting layer were determined in accordance with the method described in JP-A-2006-278035. An EL spectrum measured with a spectral radiance meter was divided by a determined light extraction efficiency to obtain an internal EL spectrum. The ratio of the internally-generated photon number and electron number calculated from the internal EL spectrum was taken as internal quantum efficiency.

Example 1

HI1, HT1, BH1:BD1(co-deposition), TB1 and ET1 were sequentially deposited on a substrate on which a 130 nm thick ITO film was formed to obtain a device with the following constitution. The figures in parentheses represent a thickness (unit: nm).

ITO(130)/HI1(50)/HT1(45)/BH1:BD1(25;5 wt %)/TB1(5)/ET1(20)/LiF(1)/Al(80)

Comparative Example 1

A device with the following constitution was obtained in the same manner as in Example 1, except that the thickness of emitting layer was 30 nm and TB1 was not used, thereby ET1 being adjacent to the emitting layer.

ITO(130)/HI1(50)/HT1(45)/BH1:BD1(30;5 wt %)/ET1(20)/LiF(1)/Al(80)

Comparative Example 2

A device with the following constitution was obtained in the same manner as in Example 1, except that BH1 was used instead of TB1.

ITO(130)/HI1(50)/HT1(45)/BH1:BD1(25;5 wt %)/BH1(5)/ET1(20)/LiF(1)/Al(80)

Example 2

A device with the following constitution was obtained in the same manner as in Example 1, except that the film thickness of BH1:BD1 was changed to 20 nm, and the film thickness of TB1 was changed to 10 nm.

ITO(130)/HI1(50)/HT1(45)/BH1:BD1(20;5 wt %)/TB1(10)/ET1(20)/LiF(1)/Al(80)

Example 3

A device with the following constitution was obtained in the same manner as in Example 1, except that HT2 was used instead of HT1.

ITO(130)/HI1(50)/HT2(45)/BH1:BD1(25;5 wt %)/TB1(5)/ET1(20)/LiF(1)/Al(80)

Example 4

A device with the following constitution was obtained in the same manner as in Example 1, except that TB2 was used instead of TB1.

ITO(130)/HI1(50)/HT1(45)/BH1:BD1(25;5 wt %)/TB2(5)/ET1(20)/LiF(1)/Al(80)

Evaluation Example 1

The devices obtained in Examples 1 to 4 and Comparative Examples 1 and 2 were evaluated as below. The results were shown in Table 1.
(1) Initial Performance (Voltage, Chromaticity, Current Efficiency, External Quantum Efficiency, and Main Peak Wavelength)
Values of voltage applied on the devices such that a current value was 1 mA/cm$^2$ were determined. EL spectra were measured with a spectral radiance meter (CS-1000, produced by KONICA MINOLTA). Chromaticity, current efficiency (cd/A), external quantum efficiency (%), and main peak wavelength (nm) were calculated from the spectral-radiance spectra obtained.
(2) Luminescence Ratio Derived from TTF
A pulse voltage waveform output from a pulse generator (8114A, manufactured by Agilent Technologies) which had a pulse width of 500 μs, a frequency of 20 Hz and a voltage corresponding to 1 mA/cm$^2$ was applied, and EL was input to a photoelectron multiplier (R928, manufactured by Hamamatsu Photonics K. K.). The pulse voltage waveform and the EL were synchronized and introduced to an oscilloscope (2440, manufactured by Tektronix Inc.) to obtain a transient EL waveform. The waveform was analyzed to determine the luminescence ratio derived from TTF (TTF ratio).

The current density at which current efficiency (UJ) was maximum in the current density-current efficiency curve was determined. A pulse voltage waveform corresponding thereto was applied to likewise obtain a transient EL waveform.

An increase of 62.5% in internal quantum efficiency derived from TTF is regarded as the theoretical limit. The luminescence ratio derived from TTF in this case is 60%.

TABLE 1

| | Voltage (V) | CIE x | CIE y | L/J (cd/A) | EQE (%) | λp (nm) | TTF ratio (%) |
|---|---|---|---|---|---|---|---|
| Ex. 1 | 3.35 | 0.142 | 0.121 | 10.3 | 9.81 | 453 | 34.2 |
| Com. Ex. 1 | 3.48 | 0.143 | 0.119 | 7.92 | 7.62 | 453 | 15.8 |
| Com. Ex. 2 | 3.53 | 0.143 | 0.119 | 7.25 | 6.95 | 452 | 14.3 |
| Ex. 2 | 3.36 | 0.143 | 0.118 | 10.2 | 9.83 | 452 | 33.5 |
| Ex. 3 | 3.23 | 0.144 | 0.111 | 10.6 | 10.7 | 452 | 35.9 |
| Ex. 4 | 3.37 | 0.144 | 0.111 | 11.0 | 11.0 | 451 | 33.1 |

Figure 10:
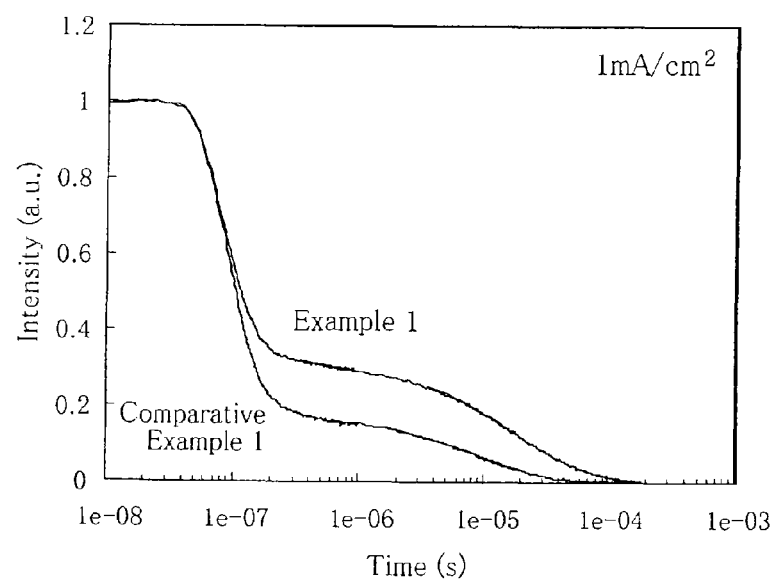
FIG. 10 is a view showing transient EL waveforms of Example 1 and Comparative Example 1.

(1) The ionization potential and affinity of BH1 were 6.0 eV and 3.0 eV, respectively, while those of BD1 were 6.0 eV and 3.1 eV. Therefore BD1 had neither hole trap nor electron trap properties. The triplet energy of BD1 was 2.13 eV and more than that of BH1, 1.83 eV. The triplet energy of blocking layer TB1 was 2.27 eV and more than that of BH1 and BD1.
(2) In Example 1 where TB1, of which the triplet energy was larger than that of the emitting layer material, was adjacent to the emitting layer as a blocking layer, very high efficiency, specifically a current efficiency of 10.3 cd/A, an external quantum efficiency of 9.81% and a TTF ratio of 34.2%, was obtained. In contrast, in Comparative Example 1 where the TB1 layer of a blocking layer was not adjacent to the emitting layer, a current efficiency was 7.92%, external quantum efficiency EQE was 7.62%, and TTF ratio was 15.8%. In Comparative Example 2 where only the BH1 layer was provided adjacent to the emitting layer, both the triplet energies of emitting layer and BH1 layer were the same, resulting in lower efficiency than in Example 1. FIG. 10 shows comparison between Example 1 and Comparative Example 1 in transient EL waveform. The intensity of luminance derived from TTF which is generated lately after 10$^{-7}$ sec nearly doubles.

Figure 11:
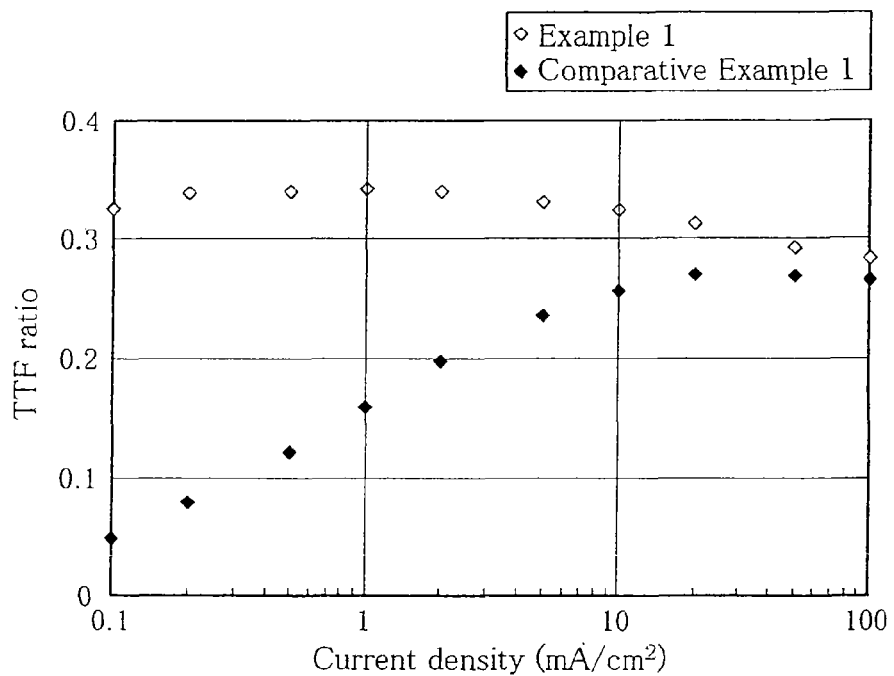
FIG. 11 is a view showing a TTF ratio of Example 1 and Comparative Example 1.
Figure 12:
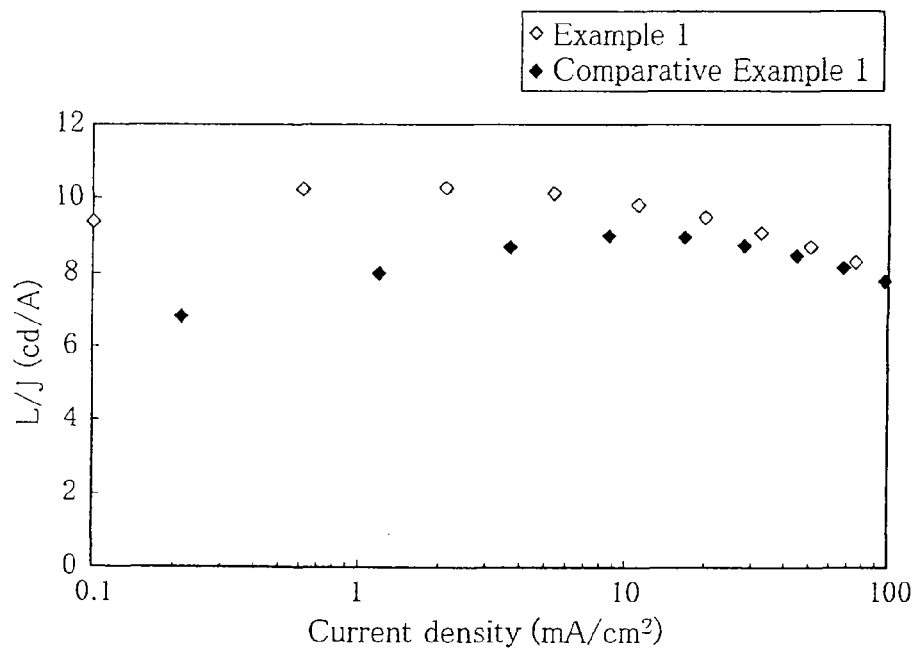
FIG. 12 is a view showing a current efficiency of Example 1 and Comparative Example 1.

FIG. 11 shows comparison between Example 1 and Comparative Example 1 in TTF ratio in a range of 0.1 mA/cm$^2$ to 100 mA/cm$^2$. FIG. 12 shows current efficiency L/J (cd/A) in the same current density range as in FIG. 11. In Example 1 where a blocking layer was formed, the maximum current efficiency was 10.3 cd/A at a current density of about 2 mA/cm$^2$, and the TTF ratio at this time was 34.2%. The TTF ratio was high even in a low current density range, showing high efficiency of the device. This appears to be caused by the TTF phenomenon. In contrast, in Comparative Example 1, the maximum current efficiency was 8.9 cd/A at a current density of 8 mA/cm$^2$, and the TTF ratio at this time was 25%.

The internal quantum efficiency in Example 1 was estimated to be 37.7%. Since the TTF ratio was 34.2%, the internal quantum efficiency was based on 24.8% of luminescence by singlet excitons and 12.9% of luminescence derived from TTF.

In contrast, the internal quantum efficiency in Comparative Example 1 was estimated to be 29.4%. Since the TTF ratio was 15.8%, the internal quantum efficiency was based on 24.7% of luminescence by singlet excitons and 4.6% of luminescence derived from TTF. This shows that the blocking layer TB1 increased luminescence derived from TTF from 4.6% to 12.9%, i.e. 2.8 times.
(3) In Example 2 where the thickness of the blocking layer TB1 was changed, efficiency as high as in Example 1 was obtained.
(4) In Example 3 where HT2 was used instead of HT1 in Example 1, 10.7 cd/A was obtained, which is higher than in Example 1. This results from an increase in the amount of the holes injected into the emitting layer because the ionization potential of HT2 is closer to that of BH1 than that of HT1.

(5) In Example 4, TB2 was used instead of TB1. The efficiency thereof was higher than in Example 1, and an extremely high value of 11.04 cd/A was obtained.

Example 5

HI1, HT1, RH:RD (co-deposition), HT1, BH1:BD1 (co-deposition), BH1:GD (co-deposition), TB1 and ET1 were sequentially deposited on a substrate on which a 130 nm thick ITO film was formed to obtain a device with the following constitution. The figures in parentheses represent a thickness (unit: nm).

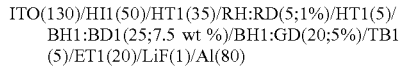
ITO(130)/HI1(50)/HT1(35)/RH:RD(5;1%)/HT1(5)/
BH1:BD1(25;7.5 wt %)/BH1:GD(20;5%)/TB1
(5)/ET1(20)/LiF(1)/Al(80)

Comparative Example 3

A device with the following constitution was obtained in the same manner as in Example 5, except that the TB1 film was not formed.

ITO(130)/HI1(50)/HT1(35)/RH:RD(5;1 wt %)/HT1
(5)/BH1:BD1(25;7.5 wt %)/BH1:GD(20;5 wt
%)/ET1(25)/LiF(1)/Al(80)

Evaluation Example 2

The devices obtained in Examples 5 and Comparative Example 3 were compared in performance at a current density of 1 mA/cm². The results were shown in Table 2.

TABLE 2

|  | Voltage (V) | CIEx | CIEy | L/J (cd/A) | EQE (%) | λp (nm) |
|---|---|---|---|---|---|---|
| Ex. 5 | 3.33 | 0.358 | 0.375 | 22.1 | 10.6 | 609 |
| Com. Ex. 3 | 3.42 | 0.356 | 0.357 | 18.7 | 9.37 | 610 |

In Example 5, an emitting layer composed of stacked blue emitting layer and green emitting layer was arranged adjacent to an electron transporting region composed of a blocking layer TB1 and an electron injecting layer ET1. The affinity of GD and BD1 is higher than that of host BH1 by 0.1 eV. Furthermore, a red emitting layer formed of RH and RD was stacked via a carrier blocking layer formed of HT1. In Example 5 white emission was obtained due to the stacked three emitting layers of blue, green and red. In Comparative Example 3 the blocking layer TB1 was not used. Comparing the external quantum efficiencies of Example 5 and Comparative Example 3, the value of Example 5 was higher than that of Comparative Example 3 by 1% or more.

Example 6

HI1, HT1, RH:RD (co-deposition), HT1, BH1:BD2 (co-deposition), BH1:GD (co-deposition), TB1 and ET1 were sequentially deposited on a substrate on which a 130 nm thick ITO film was formed to obtain a device with the following constitution. The figures in parentheses represent a thickness (unit: nm).

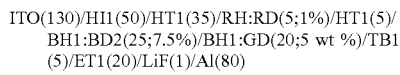
ITO(130)/HI1(50)/HT1(35)/RH:RD(5;1%)/HT1(5)/
BH1:BD2(25;7.5%)/BH1:GD(20;5 wt %)/TB1
(5)/ET1(20)/LiF(1)/Al(80)

Comparative Example 4

A device with the following constitution was obtained in the same manner as in Example 6, except that the TB1 film was not formed.

ITO(130)/HI1(50)/HT1(35)/RH:RD(5;1 wt %)/HT1
(5)/BH1:BD2(25;7.5%)/BH1:GD(20;5%)/ET1
(25)/LiF(1)/Al(80)

Evaluation Example 3

The devices obtained in Examples 6 and Comparative Example 4 were compared in performance at a current density of 1 mA/cm². The results were shown in Table 3.

TABLE 3

|  | Voltage (V) | CIEx | CIEy | L/J (cd/A) | EQE (%) | λp (nm) |
|---|---|---|---|---|---|---|
| Ex. 6 | 3.30 | 0.346 | 0.397 | 19.2 | 9.16 | 610 |
| Com. Ex. 4 | 3.37 | 0.337 | 0.406 | 17.7 | 8.27 | 610 |

In Example 6, an emitting layer composed of stacked blue emitting layer and green emitting layer was arranged adjacent to an electron transporting region composed of a blocking layer TB1 and an electron injecting layer ET1. Furthermore, a red emitting layer formed of RH and RD was stacked via a carrier blocking layer formed of HT1. In Example 6 white emission was obtained due to the stacked three emitting layers of blue, green and red. In Comparative Example 4 the blocking layer TB1 was not used. Comparing the external quantum efficiencies of Example 6 and Comparative Example 4, the value of Example 6 was higher than that of Comparative Example 4 by about 1%.

As shown in Evaluation Examples 2 and 3, the invention is effective not only for a monochromatic device with a main peak wavelength of 550 nm or less but also for a white light emitting device containing a plurality of emitting layers.

Example 7

A device with the following constitution was obtained in the same manner as in Example 1. The figures in parentheses represent a thickness (unit: nm).

ITO(130)/HI2(50)/HT3(45)/BH2:BD3(25;5%)/TB1
(5)/ET1(20)/LiF(1)/Al(80)

Example 8

A device with the following constitution was obtained in the same manner as in Example 1.

ITO(130)/HI2(50)/HT3(45)/BH2:BD3(25;5%)/TB1
(5)/ET2(20)/LiF(1)/Al(80)

Example 9

A device with the following constitution was obtained in the same manner as in Example 1.

ITO(130)/HI2(50)/HT4(45)/BH3:BD3(25;5%)/TB1
(5)/ET2(20)/LiF(1)/Al(80)

Example 10

A device with the following constitution was obtained in the same manner as in Example 1.

ITO(130)/HI2(50)/HT3(45)/BH3:BD3(25;5%)/TB2
(5)/ET2(20)/LiF(1)/Al(80)

Example 11

A device with the following constitution was obtained in the same manner as in Example 1.

ITO(130)/HI2(50)/HT3(45)/BH2:BD3(25,5%)/TB2(5)/ET4(20)/LiF(1)/Al(80)

Example 12

A device with the following constitution was obtained in the same manner as in Example 1.

ITO(130)/HI2(50)/HT4(45)/BH3:BD3(25;5%)/TB2(5)/ET2(20)/LiF(1)/Al(80)

Example 13

A device with the following constitution was obtained in the same manner as in Example 1.

ITO(130)/HI2(50)/HT4(45)/BH3:BD3(25;5%)/TB2(5)/ET3(20)/LiF(1)/Al(80)

Example 14

A device with the following constitution was obtained in the same manner as in Example 1.

ITO(130)/HI2(50)/HT3(45)/BH3:BD3(25;5%)/TB3(5)/ET2(20)/LiF(1)/Al(80)

Example 15

A device with the following constitution was obtained in the same manner as in Example 1.

ITO(130)/HI2(50)/HT4(45)/BH3:BD3(25;5%)/TB3(5)/ET2(20)/LiF(1)/Al(80)

Example 16

A device with the following constitution was obtained in the same manner as in Example 1.

ITO(130)/HI2(50)/HT4(45)/BH3:BD3(25;5%)/TB4(5)/ET2(20)/LiF(1)/Al(80)

Example 17

A device with the following constitution was obtained in the same manner as in Example 1.

ITO(130)/HI2(50)/HT4(45)/BH3:BD3(25;5%)/TB5(5)/ET2(20)/LiF(1)/Al(80)

Example 18

A device with the following constitution was obtained in the same manner as in Example 1.

ITO(130)/HI2(50)/HT4(45)/BH3:BD3(25;5%)/TB6(5)/ET2(20)/LiF(1)/Al(80)

Example 19

A device with the following constitution was obtained in the same manner as in Example 1.

ITO(130)/HI2(50)/HT4(45)/BH3:BD3(25;5%)/TB5(5)/ET3(20)/LiF(1)/Al(80)

Example 20

A device with the following constitution was obtained in the same manner as in Example 1.

ITO(130)/HI2(50)/HT4(45)/BH3:BD3(25;5%)/TB6(5)/ET3(20)/LiF(1)/Al(80)

Evaluation Example 4

The devices obtained in Examples 7 to 20 were evaluated for performance at a current density of 10 mA/cm$^2$ in the same manner as in Example 1. The results were shown in Table 4.

TABLE 4

|  | Voltage (V) | CIEx | CIEy | L/J (cd/A) | EQE (%) | λp (nm) |
|---|---|---|---|---|---|---|
| Ex. 7 | 3.71 | 0.140 | 0.125 | 9.6 | 9.01 | 453 |
| Ex. 8 | 3.50 | 0.144 | 0.114 | 9.8 | 9.65 | 452 |
| Ex. 9 | 3.55 | 0.143 | 0.120 | 9.6 | 9.16 | 452 |
| Ex. 10 | 3.80 | 0.142 | 0.126 | 9.7 | 8.97 | 453 |
| Ex. 11 | 3.71 | 0.144 | 0.117 | 8.58 | 8.32 | 452 |
| Ex. 12 | 3.69 | 0.143 | 0.120 | 10.7 | 10.2 | 452 |
| Ex. 13 | 3.71 | 0.142 | 0.125 | 10.5 | 9.82 | 452 |
| Ex. 14 | 3.61 | 0.141 | 0.127 | 10.6 | 9.74 | 452 |
| Ex. 15 | 3.53 | 0.142 | 0.123 | 9.7 | 9.13 | 452 |
| Ex. 16 | 3.76 | 0.142 | 0.122 | 10.6 | 10.0 | 452 |
| Ex. 17 | 3.74 | 0.142 | 0.121 | 10.8 | 10.2 | 452 |
| Ex. 18 | 3.78 | 0.143 | 0.119 | 10.7 | 10.2 | 452 |
| Ex. 19 | 3.82 | 0.142 | 0.121 | 10.5 | 10.0 | 452 |
| Ex. 20 | 3.85 | 0.142 | 0.122 | 10.7 | 10.2 | 452 |

Example 7 where the combination of HT3, BH2 and BD3 was used also showed high EQE.

Example 8 where ET2 with a high electron injecting property was used instead of ET1 showed lowed driving voltage by 0.21V and high EQE of 9.65%.

Example 9 where Example 7 was changed by using HT4, BH3 and ET2 showed lowed driving voltage by 0.16V and showed EQE of 9.16%.

Example 10 where TB2 was used instead of TB1 showed EQE of 8.97% with a slightly increased driving voltage.

Example 11 where ET4 was used instead of ET2 in Example 10 showed high EQE of 8.32%.

Example 12 where HT4 was used instead of HT3 in Example 10 showed lowed driving voltage by 0.11V and enhanced EQE of 10.2%. This was because the amount of injected holes was increased.

Example 13 where ET3 was used instead of ET2 in Example 12 showed high efficiency with a slightly increased driving voltage.

Example 14 where TB3 was used instead of TB2 in Example 10 showed lowed driving voltage by 0.19V and EQE of 9.74%.

Examples 15 to 18 where one of TB3, TB4, TB5 and TB6 was used with HT4 showed high efficiency.

Examples 19 and 20 where the combination of TB5, TB6 and ET3 was used showed high efficiency.

Example 21

A device with the following constitution was obtained in the same manner as in Example 1. The figures in parentheses represent a thickness (unit: nm).

ITO(130)/HI2(50)/HT5(45)/BH2:BD3(25;5%)/TB2(5)/ET2(20)/LiF(0.5)/Al(80)

Example 22

A device with the following constitution was obtained in the same manner as in Example 1.

ITO(130)/HI2(50)/HT6(45)/BH2:BD3(25;5%)/TB2(5)/ET2(20)/LiF(0.5)/Al(80)

Example 23

A device with the following constitution was obtained in the same manner as in Example 1.

ITO(130)/HI2(50)/HT7(45)/BH2:BD3(25;5%)/TB2(5)/ET2(20)/LiF(0.5)/Al(80)

Example 24

A device with the following constitution was obtained in the same manner as in Example 1.

ITO(130)/HI2(50)/HT8(45)/BH2:BD3(25;5%)/TB2(5)/ET2(20)/LiF(0.5)/Al(80)

Example 25

A device with the following constitution was obtained in the same manner as in Example 1.

ITO(130)/HI2(50)/HT9(45)/BH2:BD3(25;5%)/TB2(5)/ET2(20)/LiF(0.5)/Al(80)

Example 26

A device with the following constitution was obtained in the same manner as in Example 1.

ITO(130)/HI2(50)/HT10(45)/BH2:BD3(25;5%)/TB2(5)/ET2(20)/LiF(0.5)/Al(80)

Evaluation Example 5

The devices obtained in Examples 21 to 26 were evaluated for performance at a current density of 10 mA/cm² in the same manner as in Example 1. The results were shown in Table 5.

TABLE 5

| | Voltage (V) | CIEx | CIEy | L/J (cd/A) | λp (nm) | EQE (%) |
|---|---|---|---|---|---|---|
| Ex. 21 | 3.55 | 0.143 | 0.114 | 10.4 | 452 | 10.3 |
| Ex. 22 | 3.50 | 0.143 | 0.114 | 9.95 | 452 | 9.83 |
| Ex. 23 | 3.51 | 0.143 | 0.115 | 10.0 | 452 | 9.85 |
| Ex. 24 | 3.62 | 0.140 | 0.132 | 10.1 | 454 | 9.12 |
| Ex. 25 | 3.70 | 0.142 | 0.117 | 11.5 | 452 | 11.2 |
| Ex. 26 | 3.82 | 0.142 | 0.116 | 9.66 | 452 | 9.5 |

Examples 21 to 26 where HT5 to HT10 of hole-transporting materials were used respectively showed high EQE. In particular, HT9 which was used in Example 25 allowed high efficiency.

Example 27

A device with the following constitution was obtained in the same manner as in Example 1. The figures in parentheses represent a thickness (unit: nm).

ITO(130)/HI2(50)/HT4(45)/BH2:BD3(25;1.25%)/TB2(5)/ET2(20)/LiF(1)/Al(80)

Example 28

A device with the following constitution was obtained in the same manner as in Example 1.

ITO(130)/HI2(50)/HT4(45)/BH3:BD4(25;1.25%)/TB2(5)/ET2(20)/LiF(1)/Al(80)

Evaluation Example 6

The devices obtained in Examples 27 and 28 were evaluated for performance at a current density of 10 mA/cm² in the same manner as in Example 1. The results were shown in Table 6.

TABLE 6

| | Voltage (V) | CIEx | CIEy | L/J (cd/A) | EQE (%) | λp (nm) | TTF ratio (%) |
|---|---|---|---|---|---|---|---|
| Ex. 27 | 3.65 | 0.144 | 0.110 | 9.90 | 10.0 | 451 | 34.3 |
| Ex. 28 | 3.91 | 0.140 | 0.088 | 7.68 | 9.32 | 453 | 33.0 |

Example 27 where the doping concentration of BD3 was adjusted to 1.25% showed EQE of 10.0%. As a result of a transient EL measurement, a high TTF ratio of 34.3% was obtained.

Example 28 where BD4 was used as a dopant instead of BD3 showed increased driving voltage of 3.91V. This was because BD4 had a high Af of 3.45 eV and strong electron trapping property. In contrast, Example 28 showed high values, EQE of 9.32% and TTF ratio of 33.0%. These results showed that even when BD4 was used, the efficiency was enhanced by TTF.

Example 29

A device with the constitution in which the following layers were stacked sequentially was obtained in the same manner as in Example 1. The figures in parentheses represent a thickness (unit: nm).

| Anode | ITO(130) |
|---|---|
| Hole-injecting layer | HI2(70) |
| Hole-transporting layer | HT4(10)/HT11(10) |
| Red-green emitting layer | PBH:PGD:PRD(50; 10%, 0.3%) |
| Hole-blocking layer | PGH(10) |
| Electron-transporting layer | ET1(10)/ET3(5) |
| Intermediate layer | Li₂O(0.1)/HAT(20) |
| Hole-injecting layer | HI2(50) |
| Hole-transporting layer | HT3(45) |
| Blue emitting layer | BH2:BD3(25; 5%) |
| Blocking layer | TB2(5) |
| Electron-transporting layer | ET2(25) |
| Electron-injecting layer | LiF(1) |
| Electrode | Al(80) |

Comparative Example 5

A device with the following constitution was obtained in the same manner as in Example 29 except that TB2 was not deposited.

| Anode | ITO(130) |
|---|---|
| Hole-injecting layer | HI2(70) |
| Hole-transporting layer | HT4(10)/HT11(10) |
| Red-green emitting layer | PBH:PGD:PRD(50; 10%, 0.3%) |
| Hole-blocking layer | PGH(10) |
| Electron-transporting layer | ET1(10)/ET3(5) |
| Intermediate layer | Li₂O(0.1)/HAT(20) |
| Hole-injecting layer | HI2(50) |
| Hole-transporting layer | HT3(45) |
| Blue emitting layer | BH2:BD3(25; 5%) |
| Electron-transporting layer | ET2(25) |
| Electron-injecting layer | LiF(1) |
| Electrode | Al(80) |

Evaluation Example 7

The devices obtained in Example 29 and Comparative Example 5 were evaluated for performance at a current density of 10 mA/cm² in the same manner as in Example 1. The results were shown in Table 7.

TABLE 7

| | Voltage (V) | CIEx | CIEy | L/J (cd/A) | EQE (%) |
|---|---|---|---|---|---|
| Ex. 29 | 9.9 | 0.297 | 0.333 | 63.1 | 28.1 |
| Com. Ex. 5 | 9.9 | 0.306 | 0.345 | 61.9 | 27.0 |

In Example 29, a blue fluorescent part and a red-green phosphorescent part were stacked with an intermediate layer therebetween to emit white light and the blocking layer TB2 was in contact with a blue emitting layer in the blue fluorescent part. In contrast, in Comparative Example 6, the blocking layer TB2 was not provided. In Example 29 where the blocking layer TB2 was provided, the current efficiency and external quantum efficiency were enhanced and the chromaticity CIEx became small compared with Comparative Example 6. The small CIEx means that blue components were increased, and the insert of TB2 increased blue emission intensity.

INDUSTRIAL APPLICABILITY

The organic EL device of the invention can be used in display panels for large-sized TVs, illumination panels or the like, for which a reduction in consumption power is desired.

Although only some exemplary embodiments and/or examples of this invention have been described in detail above, those skilled in the art will readily appreciated that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. An organic electroluminescence device comprising at least an anode, an emitting layer, an electron-transporting region and a cathode in sequential order, wherein
the emitting layer contains a host represented by the following formula (10) and a dopant which gives fluorescent emission of which the main peak wavelength is 550 nm or less;
the affinity Ad of the dopant is equal to or larger than the affinity Ah of the host;
the triplet energy $E^T_d$ of the dopant is larger than the triplet energy $E^T_h$ of the host; and
a blocking layer is provided within the electron-transporting region such that it is adjacent to the emitting layer,
the blocking layer comprises a polycyclic aromatic compound having a skeleton part selected from the group consisting of compounds shown by the following formulas (1), (3), and (4) optionally comprising a substituent selected from the group consisting of a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aralkyl group, a substituted or unsubstituted aryloxy group, a substituted or unsubstituted alkoxycarbonyl group or a carboxyl group; and a polycyclic aromatic compound represented by the following formula (10A); and the triplet energy $E^T_b$ of the polycyclic aromatic compound is larger than $E^T_h$:

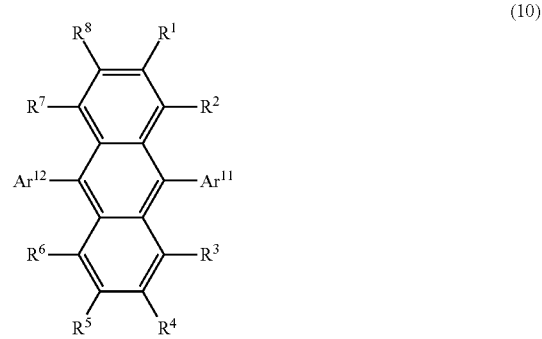

(10)

wherein in formula (10), $Ar^{11}$ and $Ar^{12}$ are independently a substituted or unsubstituted aryl group having 6 to 50 carbon atoms that form a ring or a substituted or unsubstituted hetrocyclic group having 5 to 50 ring atoms, and $R^1$ to $R^8$ are independently a group selected from a hydrogen atom, a substituted or unsubstituted aryl group having 6 to 50 ring carbon atoms, a substituted or unsubstituted hetrocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group and a hydroxyl group

(1)

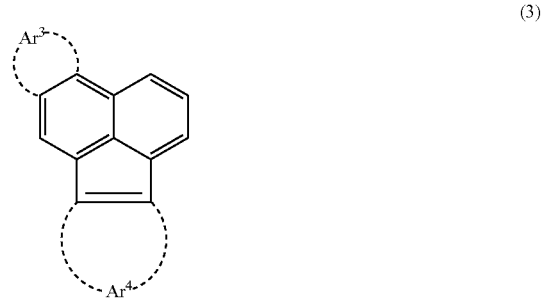

(3)

(4)

wherein in formulas (1), (3), and (4), $Ar^1$, and $Ar^3$ to $Ar^5$ are a substituted or unsubstituted condensed ring structure having 4 to 16 ring carbon atom,

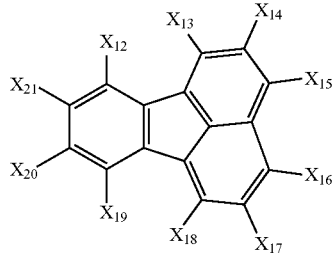

(10A)

wherein in formula (10A), $X_{13}$ to $X_{18}$, $X_{20}$ and $X_{21}$ are independently a hydrogen atom, a halogen atom, a linear, branched or cyclic alkyl group, a linear, branched or cyclic alkoxy group, a substituted or unsubstituted aryl group, and $X_{12}$ and $X_{19}$ are independently a hydrogen atom, a halogen atom, a linear, branched, or cyclic alkyl group, a liner, branched or cyclic alkoxy group.

2. The organic electroluminescence device according to claim 1, wherein the dopant is a compound selected from fluoranthene derivatives and boron complexes.

3. The organic electroluminescence device according to claim 1 further comprising a hole-transporting region between the anode and the emitting layer, wherein a hole-transporting layer is provided in the hole-transporting region such that it is adjacent to the emitting layer, and the triplet energy $E^T_{ho}$ of the hole-transporting layer is larger than $E^T_h$.

4. The organic electroluminescence device according to claim 1, wherein the electron-transporting region is a multilayer stack of the blocking layer and an electron-injecting layer, and the affinity Ab of the blocking layer and the affinity Ae of the electron-injecting layer satisfy the relationship shown by Ae-Ab<0.2 eV.

5. The organic electroluminescence device according to claim 1, wherein the electron-transporting region is a single blocking layer.

6. The organic electroluminescence device according to claim 1, wherein the electron-transporting region is a single blocking layer which is doped with a donor.

7. The organic electroluminescence device according to claim 1, wherein the host is a compound which does not contain a double bond in other parts than a ring structure.

8. The organic electroluminescence device according to claim 1, wherein the dopant is a compound which does not contain a double bond in other parts than a ring structure.

9. The organic electroluminescence device according to claim 1, which comprises at least two emitting layers between the anode and the cathode and an intermediate layer between two emitting layers.

10. The organic electroluminescence device according to claim 1, which comprises a plurality of emitting layers between the anode and the cathode and a carrier-blocking layer between a first emitting layer and a second emitting layer.

11. The organic electroluminescence device according to claim 1, wherein in the formula (10), $Ar^{11}$ and $Ar^{12}$ are independently phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 6-chrysenyl, 1-benzo[c]phenanthryl, 2-benzo[c]phenanthryl, 3-benzo[c]phenanthryl, 4-benzo[c]phenanthryl, 5-benzo[c]phenanthryl, 6-benzo[c]phenanthryl, 1-benzo[g]chrysenyl, 2-benzo[g]chrysenyl, 3-benzo[g]chrysenyl, 4-benzo[g]chrysenyl, 5-benzo[g]chrysenyl, 6-benzo[g]chrysenyl, 7-benzo[g]chrysenyl, 8-benzo[g]chrysenyl, 9-benzo[g]chrysenyl, 10-benzo[g]chrysenyl, 11-benzo[g]chrysenyl, 12-benzo[g]chrysenyl, 13-benzo[g]chrysenyl, 14-benzo[g]chrysenyl, 1-triphenyl, 2-triphenyl, 2-fluorenyl, 9,9-dimethylfluorene-2-yl, benzofluorenyl, dibenzofluorenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4''-t-butyl-p-terphenyl-4-yl, 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenantridinyl, 2-phenantridinyl, 3-phenantridinyl, 4-phenantridinyl, 6-phenantridinyl, 7-phenantridinyl, 8-phenantridinyl, 9-phenantridinyl, 10-phenantridinyl, 1-acridinyl, 2-acridinyl, 3-acridinyl, 4-acridinyl, 9-acridinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, or 4-t-butyl-3-indolyl; and $R^1$ to $R^8$ are independently a group selected from a hydrogen atom, an unsubstituted phenyl group, a substituted phenyl group, a substituted or unsubstituted alyl group having 10 to 14 ring carbon atoms, a substituted or unsubstituted fluorenyl group, a substituted or unsubstituted pyrenyl group, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-carbazolyl, 2-carbazolyl, 3-carbazolyl, 4-carbazolyl, 9-carbazolyl, methyl, ethyl, propyl, isopropyl, n-butyl, s-butyl, isobutyl, t-butyl, cyclopentyl, cyclohexyl, a group represented by —OZ wherein Z is methyl, ethyl, propyl, isopropyl, n-butyl, s-butyl, isobutyl or t-butyl, benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, 1-chloro-2-phenylisopropyl, groups represented by —OY and —SY wherein Y is an unsubstituted phenyl group, a substituted phenyl group, a substituted or unsubstituted alyl group having 10 to 14 ring carbon atoms, a substituted or unsubstituted fluorenyl group or a substituted or unsubstituted pyrenyl group, a group represented by —COOZ wherein Z is methyl, ethyl, propyl, isopropyl, n-butyl, s-butyl, isobutyl or t-butyl, trimethylsilyl, triethylsilyl, t-butyldimethylsilyl, vinyldimethylsilyl, propyldimethylsilyl, triphenylsilyl, a carboxyl group, a halogen atom, a cyano group, a nitro group and a hydroxyl group.

12. The organic electroluminescence device according to claim 1, wherein the host represented by the following formula (10) is an anthracene derivative selected from the group consisting of anthracene derivatives represented by formula (2-1), formula (2-2), formula (2-3), formula (2-4), formula (2-5) and formula (2-6);

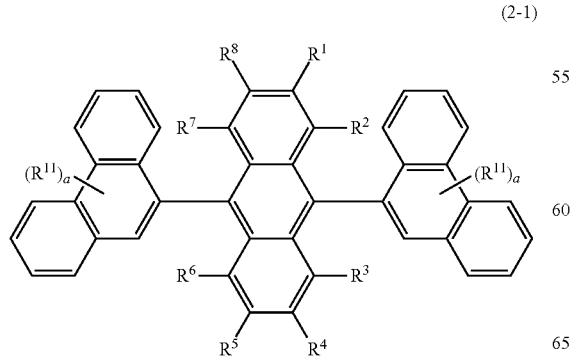

(2-1)

wherein in the formula (2-1), $R^1$ to $R^8$ are the same as those of the formula (10); $R^{11}$ is a group selected from a hydrogen atom, a substituted or unsubstituted aryl group having 6 to 50 ring carbon atoms, a substituted or unsubstituted hetrocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group and a hydroxyl group; a is an integer of 0 to 9; and when a is two or more, $R^{11}$s may be the same or different, provided that the two substituted or unsubstituted phenanthrenyl groups are the same;

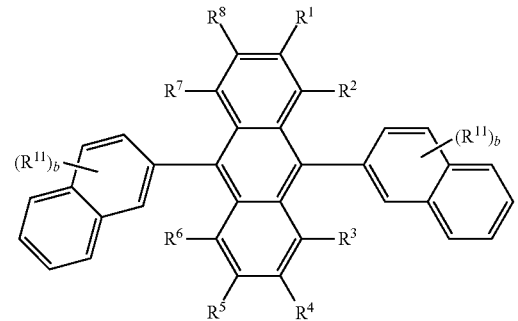

(2-2)

wherein in the formula (2-2), $R^1$ to $R^8$ and $R^{11}$ are the same as those described above; b is an integer of 1 to 7; and when b is two or more, $R^{11}$s may be the same or different, provided that the two substituted or unsubstituted 2-naphthyl groups are the same;

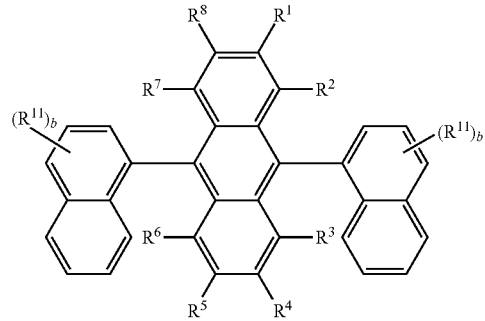

(2-3)

wherein in the formula (2-3), $R^1$ to $R^8$, $R^{11}$ and b are the same as those described above; and when b is two or more, $R^{11}$s may be the same or different, provided that the two substituted or unsubstituted 1-naphthyl groups are the same;

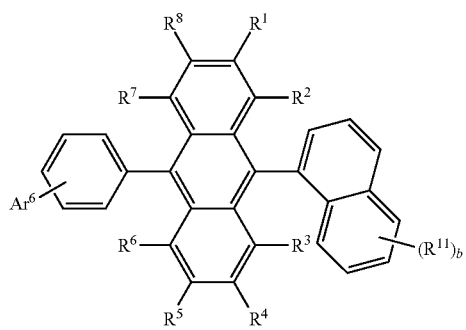

(2-4)

wherein in the formula (2-4), $R^1$ to $R^8$, $R^{11}$ and b are the same as those described above; $Ar^6$ is a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 ring carbon atoms, a substituted or unsubstituted aralkyl group having 7 to 50 carbon atoms, a substituted or unsubstituted heterocyclic group having 5 to 50 ring atoms, a 9,9-dimethylflorene-1-yl group, a 9,9-dimethylflorene-2-yl group, a 9,9-dimethylflorene-3-yl group, a 9,9-dimethylflorene-4-yl group, dibenzofuran-1-yl group, a dibenzofuran-2-yl group, a dibenzofuran-3-yl group, or a dibenzofuran-4-yl group; $Ar^6$ may form a ring such as a substituted or unsubstituted fluorenyl group and a substituted or unsubstituted dibenzofuranyl group with the benzene ring bonded thereto; and when b is 2 or more, $R^{11}$s may be the same or different;

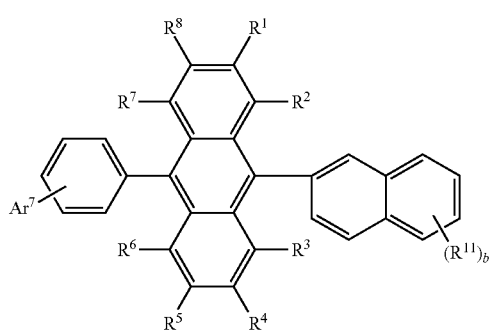

(2-5)

wherein in the formula (2-5), $R^1$ to $R^8$, $R^{11}$ and b are the same as those described above; $Ar^7$ is a substituted or unsubstituted aryl group having 6 to 50 ring carbon atoms, a substituted or unsubstituted heterocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted aralkyl group having 7 to 50 carbon atoms, a dibenzofuran-1-yl group, a dibenzofuran-2-yl group, a dibenzofuran-3-yl group, or a dibenzofuran-4-yl group; $Ar^7$ may form a ring such as a substituted or unsubstituted fluorenyl group and a substituted or unsubstituted dibenzofuranyl group with the benzene ring bonded thereto; and when b is 2 or more, $R^{11}$s may be the same or different;

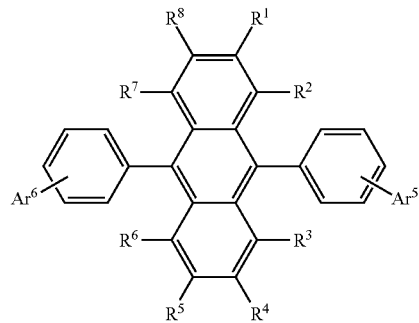

(2-6)

wherein in the formula (2-6), $R^1$ to $R^8$ and $Ar^6$ are the same as those described above; $Ar^5$ is a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 ring carbon atoms, a substituted or unsubstituted aralkyl group having 7 to 50 carbon atoms, or a substituted or unsubstituted heterocyclic group having 5 to 50 ring atoms; and $Ar^5$ and $Ar^6$ are independently selected.

13. The organic electroluminescence device according to claim 1, wherein the polycyclic aromatic compound is selected from the group consisting of formula (4A), formula (5A), formula (6A), formula (7A), formula (8A), formula (9), formula (10A), formula (11A) and formula (12)

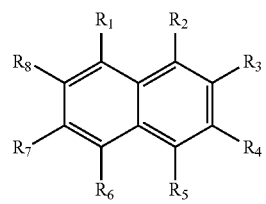

(4A)

wherein the formula (4A), $R_1$ to $R_8$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

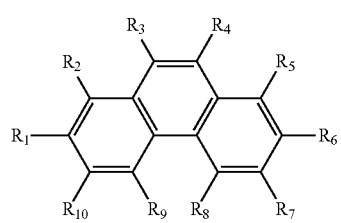

(5A)

wherein the formula (5A), $R_1$ to $R_{10}$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

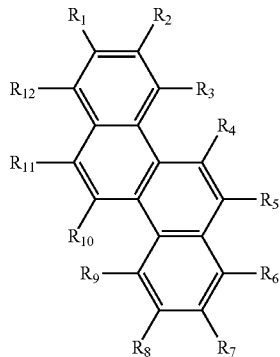
(6A)

wherein the formula (6A), $R_1$ to $R_{12}$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

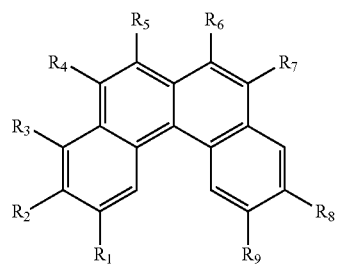
(6A)

wherein the formula (7A), $R_1$ to $R_9$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

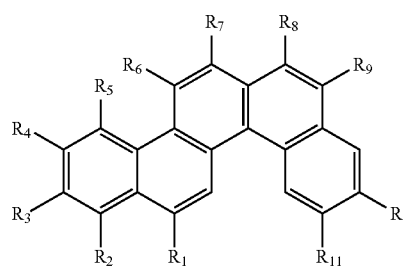
(8A)

wherein the formula (8A), $R_1$ to $R_{11}$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

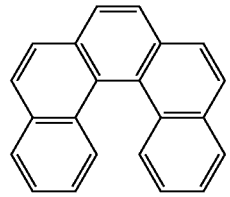
(9)

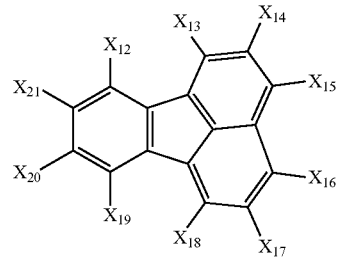
(10A)

wherein the formula (10A), $X_{13}$ to $X_{18}$, $X_{20}$ and $X_{21}$ are independently a hydrogen atom, a halogen atom, a linear, branched or cyclic alkyl group, a linear, branched or cyclic alkoxy group, a substituted or unsubstituted aryl group, and $X_{12}$ and $X_{19}$ are independently a hydrogen atom, a halogen atom, a linear, branched, or cyclic alkyl group, a liner, branched or cyclic alkoxy group:

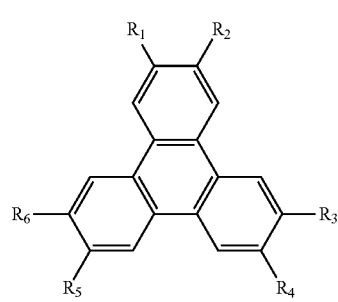
(11A)

wherein the formula (11A), $R_1$ to $R_6$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

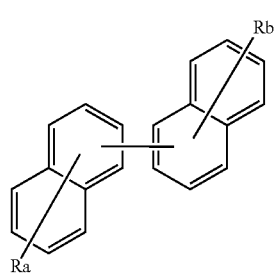
(12)

wherein the formula (12), Ra and Rb are independently a substituted or unsubstituted benzene ring, or a polycyclic aromatic skeleton part selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring, a substituted or unsubstituted fluorine ring and a substituted or unsubstituted picene ring; when Ra or Rb has one or a plurality of substituent, the substituent may be an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom; and the substituent of the naphthalene ring other than Ra and Rb may be an aryl group having 6 to 22 carbon atoms.

14. The organic electroluminescence device according to claim 1, wherein the blocking layer comprises a substituted or unsubstituted polycyclic aromatic compound having a skeleton part selected from the group consisting of compounds shown by the formulas (1), (3), and (4).

15. The organic electroluminescence device according to claim 1, wherein the blocking layer comprises a substituted or unsubstituted polycyclic aromatic compound having a skeleton part selected from the group consisting of compounds shown by the formulas (3), and (4).

16. An organic electroluminescence device comprising at least an anode, an emitting layer, an electron-transporting region and a cathode in sequential order, wherein the emitting layer contains a host represented by the following formula (10) and a dopant which gives fluorescent emission of which the main peak wavelength is 550 nm or less; and
a layer which comprises a polycyclic aromatic compound selected from the group consisting of formula (4A), formula (5A), formula (7A), formula (8A), formula (9), formula (11A) and formula (12) is provided within the electron-transporting region:

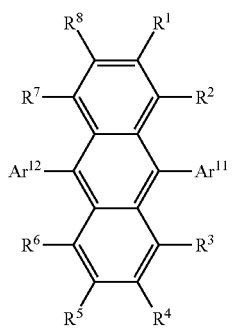

(10)

wherein in formula (10), $Ar^{11}$ and $Ar^{12}$ are independently a substituted or unsubstituted aryl group having 6 to 50 carbon atoms that form a ring or a substituted or unsubstituted hetrocyclic group having 5 to 50 ring atoms, and
$R^1$ to $R^8$ are independently a group selected from a hydrogen atom, a substituted or unsubstituted aryl group having 6 to 50 ring carbon atoms, a substituted or unsubstituted hetrocyclic group having 5 to 50 ring atoms, a substituted or unsubstituted alkyl group having 1 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group and a hydroxyl group

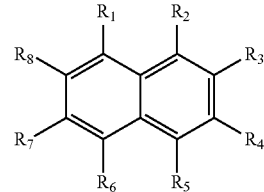

(4A)

wherein in the formula (4A), $R_1$ to $R_8$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

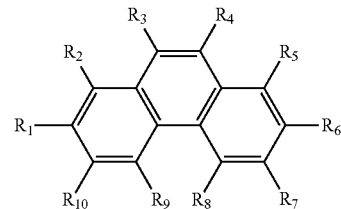

(5A)

wherein in the formula (5A), $R_1$, $R_2$, $R_5$ to $R_{10}$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof, and $R_3$ and $R_4$ are independently a substituent selected from an unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

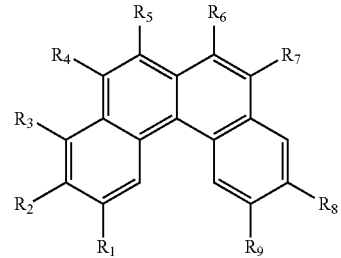

(7A)

wherein in the formula (7A), $R_1$ to $R_9$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

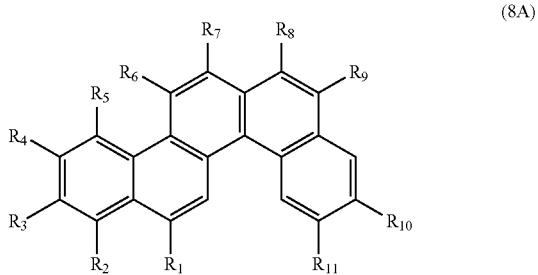

(8A)

wherein in the formula (8A), $R_1$ to $R_{11}$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

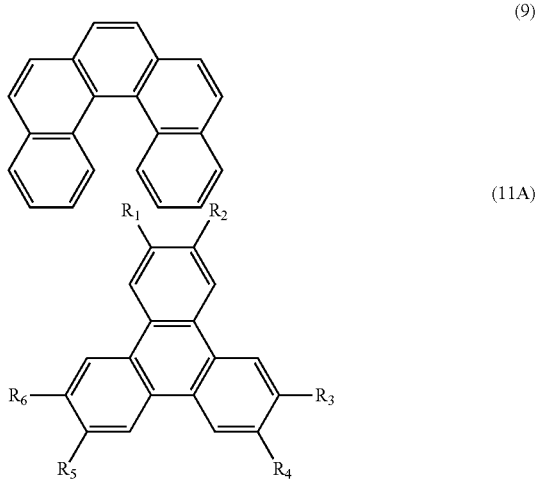

(9)

(11A)

wherein in the formula (11A), $R_1$ to $R_6$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

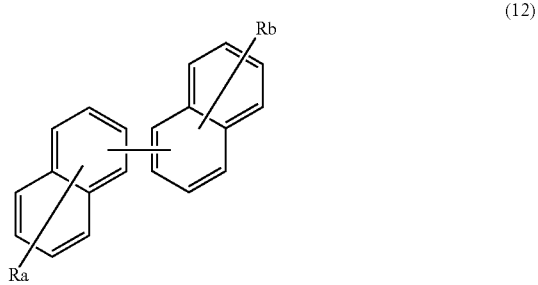

(12)

wherein in the formula (12), Ra and Rb are independently a substituted or unsubstituted benzene ring, or a polycyclic aromatic skeleton part selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring, a substituted or unsubstituted fluorine ring and a substituted or unsubstituted picene ring; when Ra or Rb has one or a plurality of substituent, the substituent may be an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom; and the substituent of the naphthalene ring other than Ra and Rb may be an aryl group having 6 to 22 carbon atoms.

17. The organic electroluminescence device according to claim 16, wherein the layer comprising the polycyclic aromatic compound is provided such that it is adjacent to the emitting layer.

18. A white emitting organic electroluminescence device comprising at least an anode, a first emitting layer, a second emitting layer, an electron-transporting region and a cathode in sequential order, wherein
the second emitting layer contains a host represented by the following formula (10) and a dopant which gives fluorescent emission of which the main peak wavelength is 550 nm or less;
the affinity Ad of the dopant is equal to or larger than the affinity Ah of the host;
the triplet energy $E^T_d$ of the dopant is larger than the triplet energy $E^T_h$ of the host; and
a blocking layer is provided within the electron-transporting region such that it is adjacent to the second emitting layer,
the blocking layer comprises a substituted or unsubstituted polycyclic aromatic compound having a skeleton part selected from the group consisting of compounds shown by the following formulas (1) to (4) optionally comprising a substituent selected from the group consisting of a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aralkyl group, a substituted or unsubstituted aryloxy group, a substituted or unsubstituted alkoxycarbonyl group or a carboxyl group; and a polycyclic aromatic compound represented by the following formula (10A); and
the triplet energy $E^T_b$ of the polycyclic aromatic compound is larger than $E^T_h$:

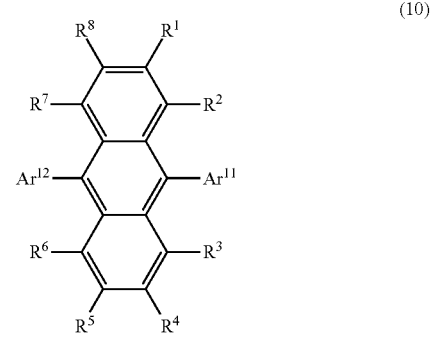

(10)

wherein in formula (10), $Ar^{11}$ and $Ar^{12}$ are independently a substituted or unsubstituted aryl group having 6 to 50 carbon atoms that form a ring or a substituted or unsubstituted hetrocyclic group having 5 to 50 ring atoms, and $R^1$ to $R^8$ are independently a group selected from a hydrogen atom, a substituted or unsubstituted aryl group having 6 to 50 ring carbon atoms, a substituted or unsubstituted hetrocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group and a hydroxyl group,

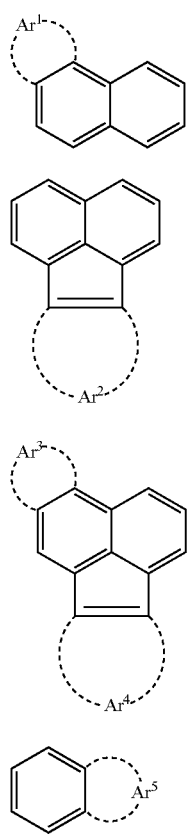

wherein in formulas (1), (3) and (4), $Ar^1$ to $Ar^5$ are a substituted or unsubstituted condensed ring structure having 4 to 16 ring carbon atom.

19. The white emitting organic electroluminescence device according to claim 18, further comprising a third emitting layer.

20. A white emitting organic electroluminescence device comprising at least an anode, a first emitting layer, a second emitting layer, an electron-transporting region and a cathode in sequential order, wherein the second emitting layer contains a host represented by the following formula (10) and a dopant which gives fluorescent emission of which the main peak wavelength is 550 nm or less; and a layer which comprises a polycyclic aromatic compound selected from the group consisting of formula (4A), formula (5A), formula (6A), formula (7A), formula (8A), formula (9), formula (10A), formula (11A) and formula (12) is provided within the electron-transporting region:

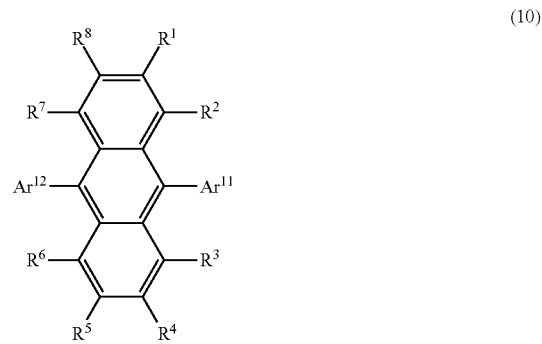

wherein in formula (10), $Ar^{11}$ and $Ar^{12}$ are independently a substituted or unsubstituted aryl group having 6 to 50 carbon atoms that form a ring or a substituted or unsubstituted hetrocyclic group having 5 to 50 ring atoms, and $R^1$ to $R^8$ are independently a group selected from a hydrogen atom, a substituted or unsubstituted aryl group having 6 to 50 ring carbon atoms, a substituted or unsubstituted hetrocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group and a hydroxyl group,

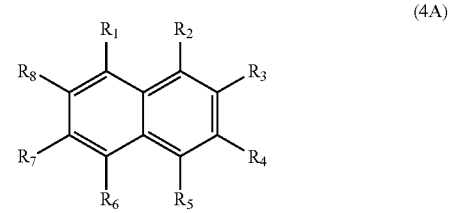

wherein in the formula (4A), $R_1$ to $R_8$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

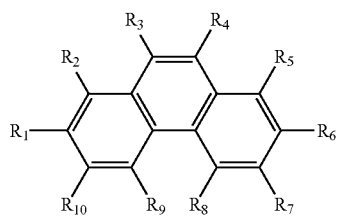
(5A)

wherein in the formula (5A), $R_1$ to $R_{10}$ are independently a hydrogen atom, a substituent selected from an unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

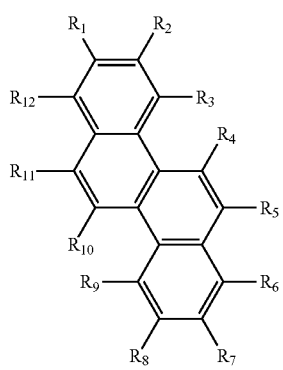
(6A)

wherein in the formula (6A), $R_1$ to $R_{12}$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

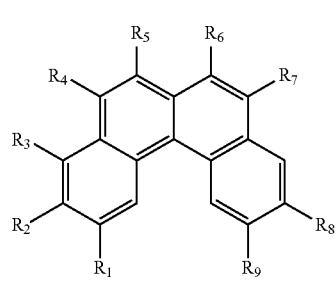
(7A)

wherein in the formula (7A), $R_1$ to $R_9$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

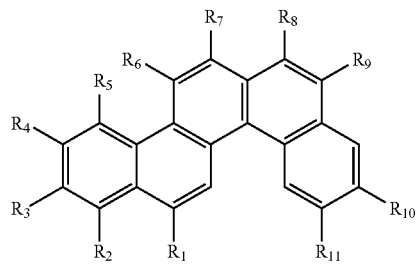
(8A)

wherein in the formula (8A), $R_1$ to $R_{11}$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

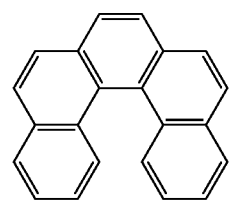
(9)

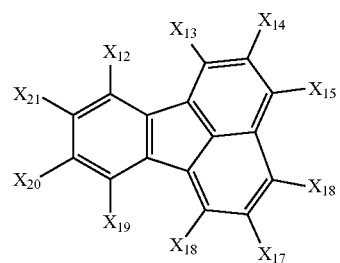
(10A)

wherein in the formula (10A), $X_{12}$ to $X_{21}$ are independently a hydrogen atom, a halogen atom, a linear, branched or cyclic alkyl group, a linear, branched or cyclic alkoxy group, or a substituted or unsubstituted aryl group:

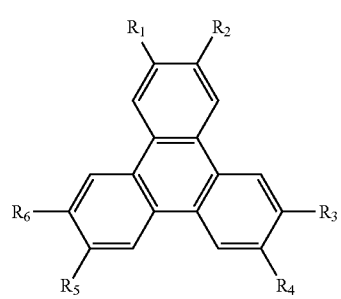
(11A)

wherein in the formula (11A), $R_1$ to $R_6$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

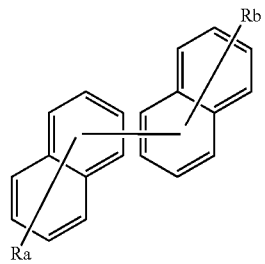

(12)

wherein in the formula (12), Ra and Rb are independently a substituted or unsubstituted benzene ring, or a polycyclic aromatic skeleton part selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring, a substituted or unsubstituted fluorine ring and a substituted or unsubstituted picene ring; when Ra or Rb has one or a plurality of substituent, the substituent may be an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom; and the substituent of the naphthalene ring other than Ra and Rb may be an aryl group having 6 to 22 carbon atoms.

21. The white emitting organic electroluminescence device according to claim 20, further comprising a third emitting layer.

22. A tandem organic electroluminescence device comprising at least an anode, a plurality of organic layer units, and a cathode in sequential order, wherein each of the organic layer units comprises an emitting layer and an electron transporting region, the emitting layer of at least one of the organic layer units contains a host represented by the following formula (10) and a dopant which gives fluorescent emission of which the main peak wavelength is 550 nm or less;
the affinity Ad of the dopant is equal to or larger than the affinity Ah of the host;
the triplet energy $E^T_d$ of the dopant is larger than the triplet energy $E^T_h$ of the host; and
a blocking layer is provided within the electron-transporting region of the organic layer unit containing the host such that it is adjacent to the emitting layer,
the blocking layer comprises a substituted or unsubstituted polycyclic aromatic compound having a skeleton part selected from the group consisting of compounds shown by the following formulas (1) to (4) optionally comprising a substituent selected from the group consisting of a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic heterocyclic group, a substituted or unsubstituted aralkyl group, a substituted or unsubstituted aryloxy group, a substituted or unsubstituted alkoxycarbonyl group or a carboxyl group; and a polycyclic aromatic compound represented by the following formula (10A); and
the triplet energy $E^T_b$ of the polycyclic aromatic compound is larger than $E^T_h$:

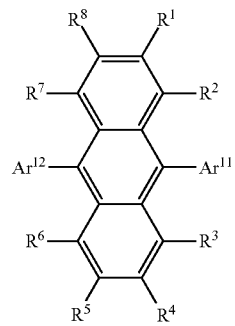

(10)

wherein in formula (10), $Ar^{11}$ and $Ar^{12}$ are independently a substituted or unsubstituted aryl group having 6 to 50 carbon atoms that form a ring or a substituted or unsubstituted hetrocyclic group having 5 to 50 ring atoms, and $R^1$ to $R^8$ are independently a group selected from a hydrogen atom, a substituted or unsubstituted aryl group having 6 to 50 ring carbon atoms, a substituted or unsubstituted hetrocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group and a hydroxyl group

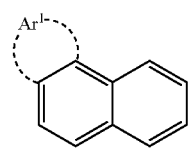

(1)

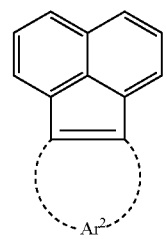

(2)

(3)

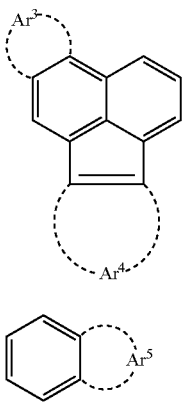

(4)

wherein in formulas (1) to (4), $Ar^1$ to $Ar^5$ are a substituted or unsubstituted condensed ring structure having 4 to 16 ring carbon atom.

23. A tandem organic electroluminescence device comprising at least an anode, a plurality of organic layer units, and a cathode in sequential order, wherein each of the organic layer units comprises an emitting layer and an electron transporting region, the emitting layer of at least one of the organic layer units contains a host represented by the following formula (10) and a dopant which gives fluorescent emission of which the main peak wavelength is 550 nm or less; and a layer which comprises a polycyclic aromatic compound selected from the group consisting of formula (4A), formula (5A), formula (6A), formula (7A), formula (8A), formula (9), formula (10A), formula (11A) and formula (12) is provided within the electron-transporting region of the organic layer unit comprising the host:

(10)

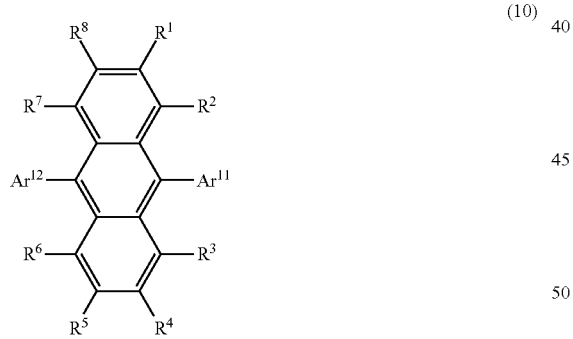

wherein in formula (10), $Ar^{11}$ and $Ar^{12}$ are independently a substituted or unsubstituted aryl group having 6 to 50 carbon atoms that form a ring or a substituted or unsubstituted hetrocyclic group having 5 to 50 ring atoms, and $R^1$ to $R^8$ are independently a group selected from a hydrogen atom, a substituted or unsubstituted aryl group having 6 to 50 ring carbon atoms, a substituted or unsubstituted hetrocyclic group having 5 to 50 ring atoms, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted silyl group, a carboxyl group, a halogen atom, a cyano group, a nitro group and a hydroxyl group, (4A)

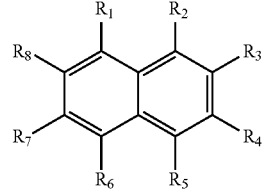

wherein in the formula (4A), $R_1$ to $R_8$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

(5A)

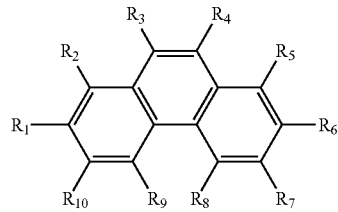

wherein in the formula (5A), $R_1$ to $R_{10}$ are independently a hydrogen atom, a substituent selected from an unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

(6A)

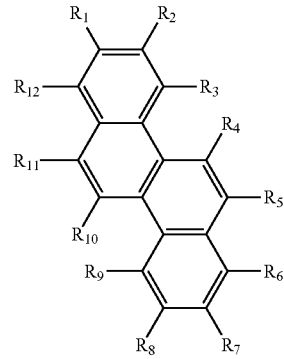

wherein in the formula (6A), $R_1$ to $R_{12}$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

(7A)

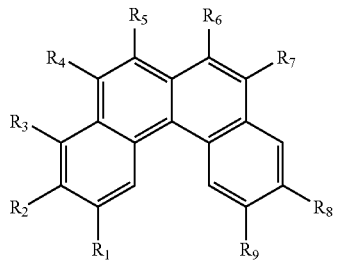

wherein in the formula (7A), $R_1$ to $R_9$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

(8A)

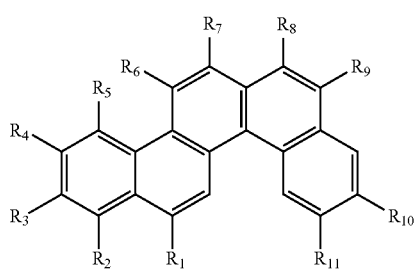

wherein in the formula (8A), $R_1$ to $R_{11}$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

(9)

(10A)

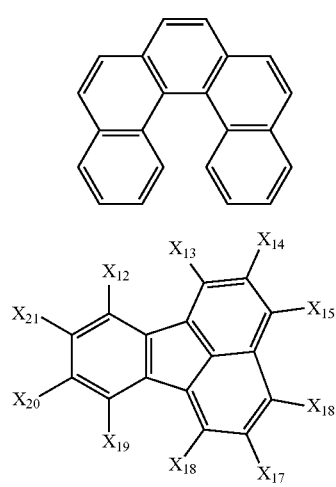

wherein in the formula (10A), $X_{12}$ to $X_{21}$ are independently a hydrogen atom, a halogen atom, a linear, branched or cyclic alkyl group, a linear, branched or cyclic alkoxy group, or a substituted or unsubstituted aryl group:

(11A)

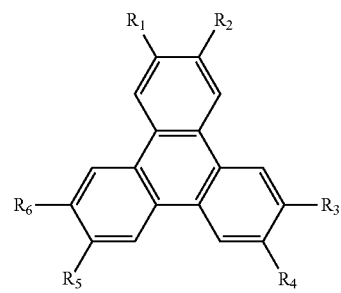

wherein in the formula (11A), $R_1$ to $R_6$ are independently a hydrogen atom, a substituent selected from a substituted or unsubstituted aryl group having 6 to 30 ring carbon atoms, a branched or linear alkyl group having 1 to 30 carbon atoms and a substituted or unsubstituted cycloalkyl group having 3 to 20 carbon atoms, or a substituent formed of a combination thereof:

(12)

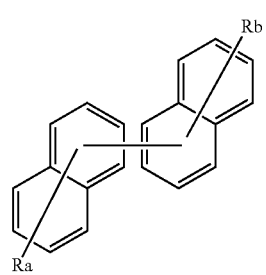

wherein in the formula (12), Ra and Rb are independently a substituted or unsubstituted benzene ring, or a polycyclic aromatic skeleton part selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring, a substituted or unsubstituted fluorine ring and a substituted or unsubstituted picene ring; when Ra or Rb has one or a plurality of substituent, the substituent may be an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom; and the substituent of the naphthalene ring other than Ra and Rb may be an aryl group having 6 to 22 carbon atoms.

* * * * *